United States Patent [19]
Hirano et al.

[11] Patent Number: 5,898,608
[45] Date of Patent: *Apr. 27, 1999

[54] METHOD FOR OPERATING A FERROELECTRIC MEMORY

[75] Inventors: Hiroshige Hirano, Nara; Tatsumi Sumi, Osaka; Nobuyuki Moriwaki, Kyoto, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/787,833

[22] Filed: Jan. 23, 1997

Related U.S. Application Data

[63] Continuation of application No. 08/387,009, Feb. 10, 1995, abandoned.

[30] Foreign Application Priority Data

Sep. 22, 1994 [JP] Japan .................................. 6-227921

[51] Int. Cl.⁶ .................................................. G11C 11/22
[52] U.S. Cl. ........................................... 365/145; 365/210
[58] Field of Search ............................. 365/145, 189.01, 365/210

[56] References Cited

U.S. PATENT DOCUMENTS

| | | | |
|---|---|---|---|
| 4,873,664 | 10/1989 | Eaton, Jr. . | |
| 5,406,510 | 4/1995 | Mihara et al. | 365/145 |
| 5,469,401 | 11/1995 | Gillingham | 365/230.06 |
| 5,487,030 | 1/1996 | Drab et al. | 365/145 |
| 5,640,030 | 6/1997 | Kenney | 365/145 |

FOREIGN PATENT DOCUMENTS

| | | |
|---|---|---|
| 0 338 158 | 10/1989 | European Pat. Off. . |
| 0 364 813 | 4/1990 | European Pat. Off. . |
| 0 495 572 | 7/1992 | European Pat. Off. . |
| 0 600 434 | 6/1994 | European Pat. Off. . |
| 0 615 247 | 9/1994 | European Pat. Off. . |
| 0 627 741 | 12/1994 | European Pat. Off. . |
| WO 93/12542 | 6/1993 | WIPO . |

OTHER PUBLICATIONS

T. Sumi et al., "A 256kb Nonvolatile Ferroelectric Memory at 3V and 100ns", ISSCC Digest of Technical Papers, Feb. 18, 1994, pp. 268–269.

U.S. application No. 08/161,328, H. Hirano et al.

U.S. application No. 08/224,589, H. Hirano et al.

Patent Abstracts of Japan, vol. 96, No. 6, Jun. 28, 1996.

Patent Abstracts of Japan, vol. 95, No. 1, Feb. 28, 1995.

IBM Technical Disclosure Bulletin, "Nondestructive Readout Method", vol. 12, No. 10, Mar. 1970, New York.

*Primary Examiner*—Terrell W. Fears
*Attorney, Agent, or Firm*—McDermott, Will & Emery

[57] ABSTRACT

In a ferroelectric memory of 1T1C configuration in which a memory cell consists of 1 transistor and 1 capacitor per bit, the capacitance of a dummy memory cell capacitor, i.e., the area occupied by the dummy memory cell capacitor is determined based on the capacitive characteristic of a main memory cell capacitor obtained when the main memory cell capacitor was repeatedly operated with both positive voltage and negative voltage until its capacitive characteristic presented no more change. Moreover, not only the main memory cell capacitor but also the dummy memory cell capacitor are operated with both positive voltage and negative voltage by using a power-source voltage, not a ground voltage, as a voltage for resetting the dummy memory cell capacitor. Consequently, the effect of an imprint on the ferroelectric capacitor is reduced, thereby preventing the malfunction of the ferroelectric memory.

15 Claims, 47 Drawing Sheets

METHOD FOR OPERATING A FERROELECTRIC MEMORY

This is a continuation application of application Ser. No. 08/387,009 filed Feb. 10, 1995, now abandoned.

BACKGROUND OF THE INVENTION

The present invention relates to a ferroelectric memory.

In recent years, there has been devised a ferroelectric memory in which a ferroelectric material is used in the capacitor of a memory cell so as to render stored data nonvolatile. Since the ferroelectric capacitor has a hysteresis property, a polarization of different polarity depending on the previous history remains even at zero electric field. The nonvolatile memory is implemented by representing stored data by means of a polarity remaining in the ferroelectric capacitor.

There are disclosed in U.S. Pat. No. 4,873,664 two types of ferroelectric memories. In the first-type memory, a memory cell consists of 1 transistor and 1 capacitor per bit (1T1C) so that 1 dummy memory cell (reference cell) is provided for every 256 main memory cells (normal cells), for example. In the second-type memory, on the other hand, a memory cell consists of 2 transistors and 2 capacitors per bit (2T2C) with the provision of no dummy memory cell so that a complementary pair of data is stored in a pair of ferroelectric capacitors.

Of ferroelectric materials for constituting capacitors, potassium nitrate ($KNO_3$), PLZT ($PbLa_2O_3$—$ZrO_2$—$TiO_2$), PZT ($PbTiO_3$—$PbZrO_3$), and the like are well-known. According to PCT International Patent Publication No. WO93/12542, there is also known a ferroelectric material which presents extremely low fatigue compared with PZT, and hence is suitable for a ferroelectric memory.

In the above ferroelectric memory of 1IC configuration according to U.S. Pat. No. 4,873,664, a dummy memory cell capacitor has a capacitance at least double the capacitance of a main memory cell capacitor, which means that the dummy memory cell capacitor occupies an area double the area occupied by the main memory cell capacitor. Moreover, in reading data from the main memory cell, the main memory cell capacitor is restored to its initial polarization state after the polarity is reversed or sustains its initial polarization state without reversing the polarity, depending on the data stored therein. On the other hand, the dummy memory cell capacitor is designed to sustain its original polarization state without reversing the polarity, irrespective of the data stored in the main memory cell. In other words, the voltage placed between the electrodes of the main memory cell capacitor alternates between the positive and negative polarities, while the voltage placed between the electrodes of the dummy memory cell capacitor remains either positive or negative. Each of the voltage applied to the cell plate electrode of the capacitor in the main memory cell, the voltage applied to the cell plate electrode of the capacitor in the dummy memory cell (dummy cell plate electrode), the voltage applied to the word line connected to the gate electrode of the main memory cell transistor, and the voltage applied to the word line connected to the gate electrode of dummy memory cell transistor (dummy word line) is 5 V, which is equal to the power-source voltage. Furthermore, regardless of the data stored in the main memory cell, the voltage of the word line and the voltage of the dummy word line are switched to the "L" state after the voltage of the cell plate electrode of the main memory cell capacitor was switched to the "L" state and the voltage of the cell plate electrode of the dummy memory cell capacitor is switched to the "L" state at the same time as the voltage of the word line and the voltage of the dummy word line are switched to the "L" state.

Thus, since the dummy memory cell capacitor is operated with a voltage which is constantly positive or negative in the conventional ferroelectric memory of 1T1C configuration, a significant change is caused in its hysteresis property during use due to the effect of a so-called imprint. Consequently, the operating margin of the ferroelectric memory is reduced, resulting in malfunction. Moreover, since the dummy memory cell capacitor which occupies an area several times larger than the area occupied by the main memory cell has been provided as the reference cell, there are variations in capacitance of the dummy memory cell capacitors manufactured, resulting in reduced operating margin.

If the power-source voltage is lowered, the charge resulting from the polarity remaining in a memory cell capacitor is reduced in each of the 1T1C memory and the 2T2C memory, also resulting in reduced operating margin. Furthermore, in restoring a logic voltage "H" to the memory cell capacitor, there occurs a so-called Vt reduction, wherein the voltage for restoring data to the memory cell capacitor is reduced to a value lower than the electric potential of the gate electrode of the memory cell transistor due to a threshold voltage Vt. As a result, the charge resulting from a residual polarization is reduced, thus reducing operating margin.

SUMMARY OF THE INVENTION

An object of the present invention is to provide a ferroelectric memory with increased operating margin, which can implement stable and low-power operation free from malfunction.

To attain the above object, in the ferroelectric memory of 1T1C configuration according to the present invention, the capacitance of a dummy memory cell capacitor, i.e., the area occupied by the dummy memory cell capacitor, is determined based on the capacitive characteristic of a main memory cell capacitor obtained when the main memory cell capacitor was repeatedly operated till the capacitive characteristic thereof presents no more change. To suppress the effect of an imprint satisfactorily, not only the main memory cell capacitor but also the dummy memory cell capacitor are operated with both positive voltage and negative voltage.

To use a dummy memory cell capacitor which occupies substantially the same area occupied by the main memory cell capacitor in the ferroelectric memory of 1T1C configuration, the voltage applied to the main memory cell capacitor is set to a value different from that of the voltage applied to the dummy memory cell capacitor. Specifically, in reading or restoring data, the voltage applied to the cell plate electrode of the main memory cell capacitor is set to a value different from that of the voltage applied to the cell plate electrode of the dummy memory cell capacitor.

To increase the amount of charge read from the memory cell capacitor in the ferroelectric memory of 1T1C or 2T2C configuration, at least either of the voltage applied to the cell plate electrode of the memory cell capacitor in reading data or the voltage applied to the cell plate electrode of the memory cell capacitor in restoring data is set higher than a power-source voltage.

To prevent a Vt reduction due to the threshold voltage of the memory cell transistor in restoring data to the ferroelectric memory of 1T1C or 2T2C configuration, the word line connected to the gate electrode of the memory cell transistor is selected with a logic voltage "H" or "L" and then brought into a floating state, thereby self-booting the voltage for restoration.

To increase the amount of charge restored to the main memory cell capacitor in the ferroelectric memory of 1T1C configuration, the order of switching, to the "L" state, the voltage of the word line connected to the gate electrode of the main memory cell transistor and switching, to the "L" state, the voltage of the cell plate electrode of the main memory cell capacitor is reversed in restoring data to the main memory cell, depending on the data stored in the main memory cell.

To easily initialize the state of the dummy memory cell capacitor in the ferroelectric memory of 1T1C configuration, the order of switching, to the "L" state, the voltage of the dummy word line connected to the gate electrode of the dummy memory cell transistor and switching, to the "L" state, the voltage of the cell plate electrode of the dummy memory cell capacitor (dummy cell plate electrode) is reversed in restoring data to the dummy memory cell, depending on the data stored in the dummy memory cell.

To increase the amount of charge restored in the ferroelectric memory of 2T2C configuration, a complementary pair of memory cell capacitors are provided with respective cell plate electrodes or the gate electrodes of a complementary pair of memory cell transistors are connected to respective word lines.

DETAILED DESCRIPTION OF THE PREFERRED EMBODIMENTS

Below, ferroelectric memories according to the embodiments of the present invention will be described in detail with reference to the drawings.

(First Embodiment)

Figure 1:
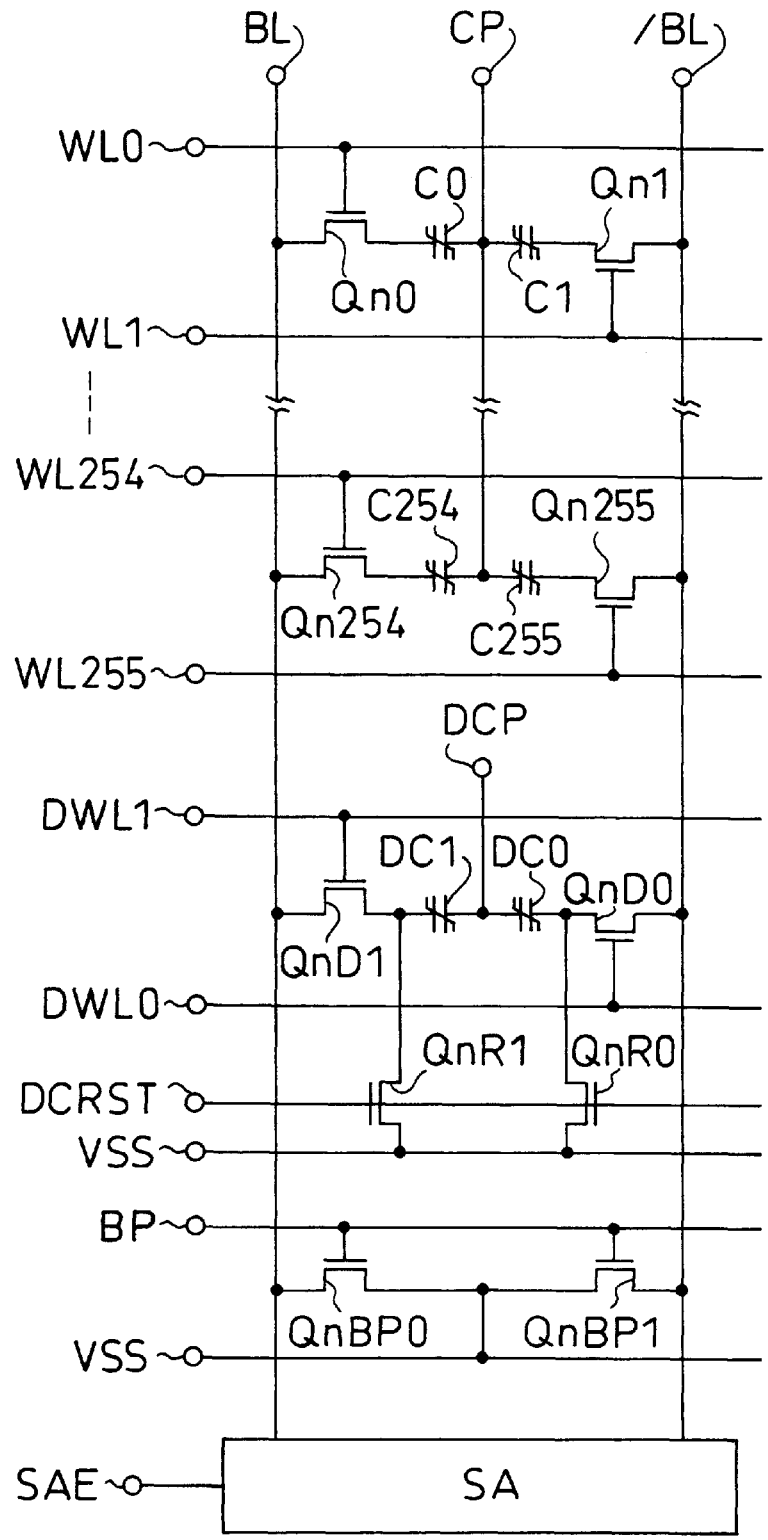
FIG. 1 is a circuit diagram showing the structure of a ferroelectric memory according to a first embodiment of the present invention.
Figure 2:
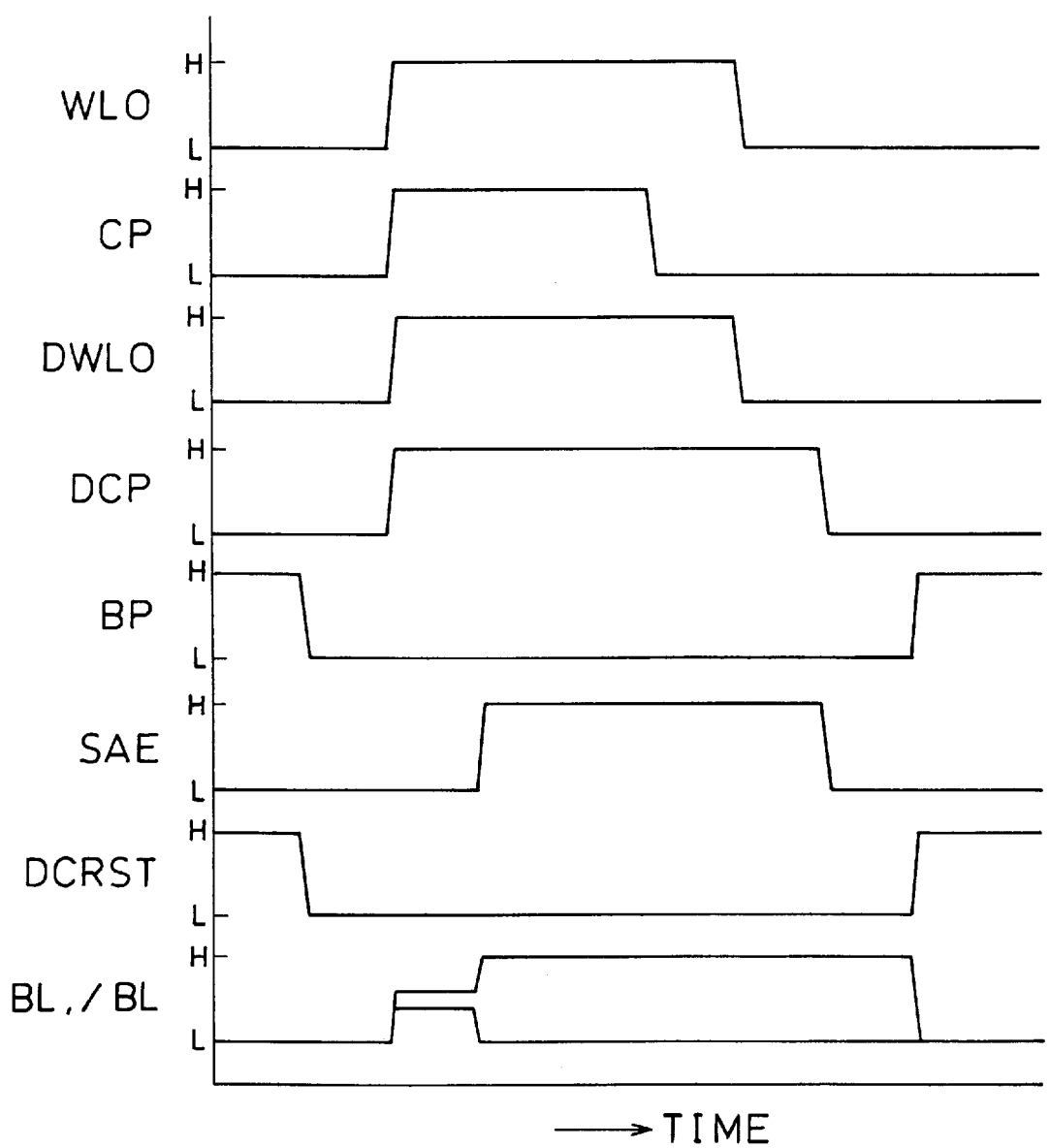
FIG. 2 is a timing chart showing the operation of the ferroelectric memory according to the first embodiment of the present invention.
Figure 3:
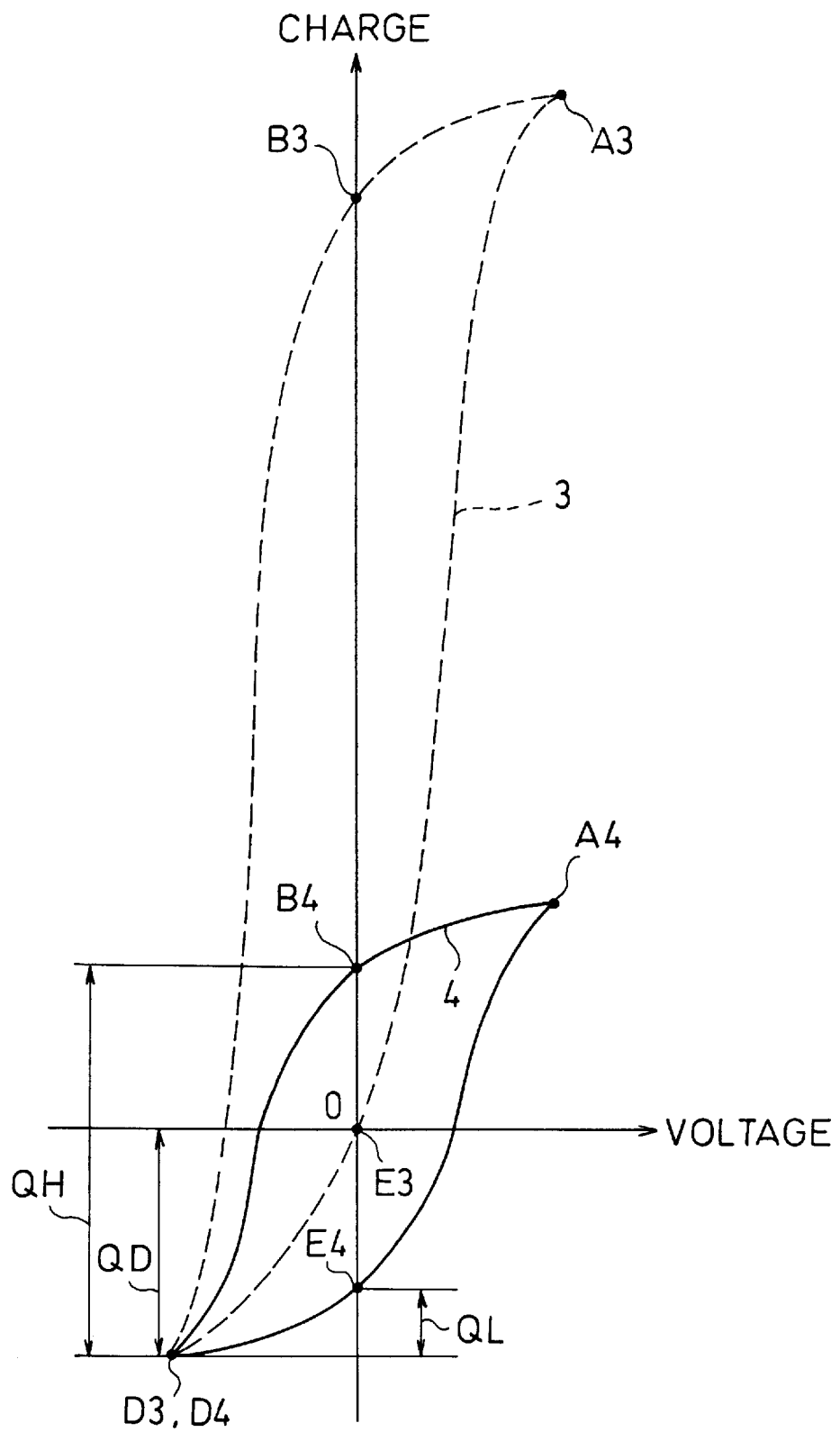
FIG. 3 is a view showing the hysteresis properties of a main memory cell capacitor and of a dummy memory cell capacitor in the ferroelectric memory according to the first embodiment of the present invention.
Figure 4:
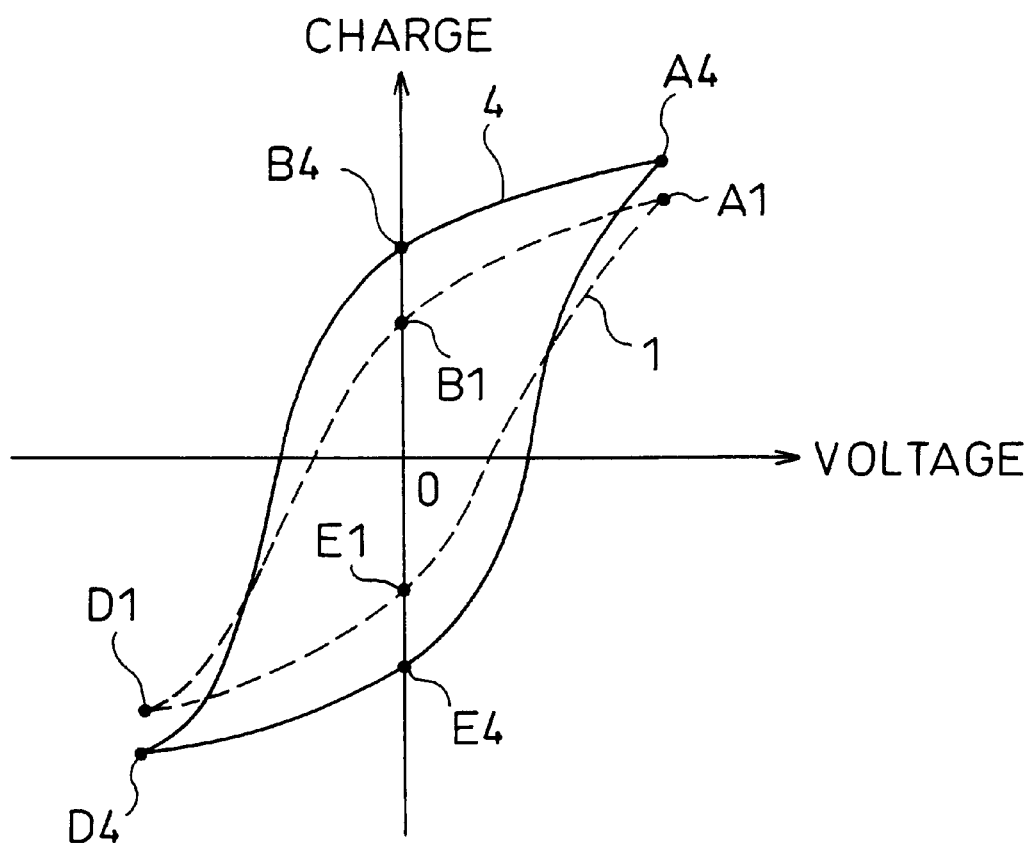
FIG. 4 is a view showing the hysteresis property of the main memory cell capacitor, which illustrates a method of determining the two hysteresis properties in FIG. 3.

FIG. 1 is a circuit diagram showing the structure of a ferroelectric memory according to a first embodiment. FIG. 2 is a timing chart showing the operation of the ferroelectric memory of FIG. 1. In FIG. 3, the curve 4 represents the hysteresis property of a ferroelectric capacitor constituting a main memory cell and the curve 3 represents the hysteresis property of a ferroelectric capacitor constituting a dummy memory cell. FIG. 4 illustrates a method of determining the curve 4 in FIG. 3.

In FIG. 1 are shown: word lines WL0 to WL255; dummy word lines DWL0 and DWL1; bit lines BL and /BL; a cell plate electrode CP; a dummy cell plate electrode DCP; a bit-line precharge control signal BP; a control signal DCRST for initializing data in dummy memory cell; a sense amplifier control signal SAE; a ground voltage VSS; a sense amplifier SA; main memory cell capacitors C0 to C255; dummy memory cell capacitors DC0 and DC1; and n-channel MOS transistors Qn0 to Qn255, QnD0, QnD1, QnR0, QnR1, QnBP0, and QnBP1. Hereinafter, the Qn0 to Qn255 will be referred to as main memory cell transistors, while the QnD0 and QnD1 will be referred to as dummy memory cell transistors. In FIG. 3 are shown: the amount of charge QL for reading "L" data from main memory cell; the amount of charge QH for reading "H" data from main memory cell; and the amount of charge QD for reading data from dummy memory cell.

A description will be given first to the circuit diagram of FIG. 1, in which the bit lines BL and /BL are connected to the sense amplifier SA, which is controlled by the sense amplifier control signal SAE. The first electrode of the dummy memory cell capacitor DC0 is connected to the bit line /BL via the dummy memory cell transistor QnD0 having the gate electrode connected to the dummy word line DWL0, while the second electrode thereof is connected to the dummy cell plate electrode DCP. The first electrode of the dummy memory cell capacitor DC1 is connected to the bit line BL via the dummy memory cell transistor QnD1 having the gate electrode connected to the dummy word line DWL1, while the second electrode thereof is connected to the dummy cell plate electrode DCP. The first electrodes of the pair of dummy memory cell capacitors DC0 and DC1 are connected to the ground voltage VSS for initializing data in dummy memory cell via the n-channel MOS transistors QnR0 and QnR1. To the gate electrode of each of the n-channel MOS transistors QnR0 and QnR1 is applied the control signal DCRST for initializing data in dummy memory cell. On the other hand, the first electrode of the main memory cell capacitor C0 is connected to the bit line BL via the main memory cell transistor Qn0 having the gate electrode connected to the word line WL0, while the second electrode thereof is connected to the cell plate electrode CP. The first electrode of the main memory cell capacitor C1 is connected to the bit line /BL via the main memory cell transistor Qn1 having the gate electrode connected to the word line WL1, while the second electrode thereof is connected to the cell plate electrode CP.

In FIG. 3, the abscissa represents the electric field applied to a memory cell capacitor and the ordinate represents the charge accumulated in the memory cell capacitor. The curve 4 forming a loop starting from and returning to the point A4 through the points B4, D4, and E4 represents the hysteresis property of the ferroelectric capacitor of a main memory cell. Even at zero electric field, a polarization remains as indicated by the point B4 or E4. Thus, the polarization remaining in the ferroelectric capacitor even after the power source was turned off is utilized as nonvolatile data in order to implement a nonvolatile memory. The main memory cell capacitor is in the state represented by the point B4 of FIG. 3 if the data in the memory cell is "H," while it is in the state at the point E4 of FIG. 3 if the data in the memory cell is "L." The curve 3 forming a loop starting from and returning to the point A3 through the points B3, D3, and E3 represents the hysteresis property of the ferroelectric capacitor of a dummy memory cell. The curve 3 was obtained by vertically magnifying the curve 4 by a specified number of times so that it passes through the datum point 0 between the points B4 and E4. The inclinations of the curves 3 and 4 of FIG. 3 represent the capacitances of the capacitors.

FIG. 2 is a timing chart showing the operation of reading data held in the main memory cell capacitor C0. In an initial state, the bit-line precharge control signal BP is set at a logic voltage "H," thereby setting the bit lines BL and /BL at a logic voltage "L." The word lines WL0 to WL255, dummy word lines DWL0 and DWL1, cell plate electrode CP, and dummy cell plate electrode DCP are set at a logic voltage "L," while the control signal DCRST for initializing data in dummy memory cell is set at a logic voltage "H," thereby initializing the pair of dummy memory cell capacitors DC0 and DC1 into the state at the point E3 on the curve 3 of FIG. 3. Next, the bit-line precharge control signal BP is set at a logic voltage "L," thereby bringing the bit lines BL and /BL into a floating state, while the control signal DCRST for initializing data in dummy memory cell is set at a logic voltage "L," thereby bringing the first electrodes of the pair of dummy memory cell capacitors DC0 and DC1 into a floating state. Subsequently, the word line WL0, dummy word line DWL0, cell plate electrode CP, and dummy cell plate electrode DCP are set at a logic voltage "H," thereby reading data stored in the main memory cell capacitor C0 onto the bit line BL and reading data stored in the dummy memory cell capacitor DC0 onto the bit line /BL. In this case, if the data is "H," the state of the main memory cell capacitor C0 makes a transition from the point B4 to the point D4 in FIG. 3 so as to read the charge QH onto the bit line BL. If the data is "L," the state of the main memory cell capacitor C0 makes a transition from the point E4 to the point D4 in FIG. 3 so as to read the charge QL onto the bit line BL. The state of the dummy memory cell capacitor DC0 makes a transition from the point E3 to the point D3 in FIG. 3 so as to read the charge QD onto the bit line /BL. Next, the sense amplifier control signal SAE is set at a logic voltage "H" so as to operate the sense amplifier SA. In this case, if the data is "H," the state of the main memory cell capacitor C0 makes a transition from the point D4 to the point E4 in FIG. 3. If the data is "L," the main memory cell capacitor C0 remains in the state at the point D4 in FIG. 3. If the data is "H," the dummy memory cell capacitor DC0 remains in the state at the point D3 in FIG. 3. If the data is "L," the state of the dummy memory cell capacitor DC0 makes a transition from the point D3 to the point E3 in FIG. 3. Then, the cell plate electrode CP is set at a logic voltage "L," thereby restoring data to the main memory cell capacitor. In this case, if the data is "H," the state of the main memory cell capacitor C0 makes a transition from the point E4 to the point A4 in FIG. 3. If the data is "L," the state of the main memory cell capacitor C0 makes a transition from the point D4 to the point E4 in FIG. 3. Subsequently, the word line WL0 and dummy word line DWL0 are set at a logic voltage "L," thereby disconnecting the main memory cell capacitor C0 and dummy memory cell capacitor DC0 from the bit lines BL and /BL. Consequently, the main memory cell capacitor C0 and dummy memory cell capacitor DC0 carry no voltage. In this case, if the data is "H," the state of the main memory cell capacitor C0 makes a transition from the point A4 to the point B4 in FIG. 3. If the data is "L," the main memory cell capacitor C0 remains in the state at the point E4 in FIG. 3. Next, the dummy cell plate electrode DCP is set at a logic voltage "L," thereby bringing the dummy memory cell capacitor DC0 into the state at the point E3 in FIG. 3, and the sense amplifier control signal SAE is set at a logic voltage "L," thereby halting the operation of the sense amplifier SA. Subsequently, the bit-line precharge control signal BP is set at a logic voltage "H," thereby setting the bit lines BL and /BL to the ground voltage VSS. The control signal DCRST for initializing data in dummy memory cell is also set at a logic voltage "H," thereby setting the voltage applied to the dummy memory cell capacitor DC0 at zero. As a result, the dummy memory cell capacitor DC0 is surely restored to the state at the point E3 in FIG. 3, thus completing the reading and restoring of data.

Figure 5:
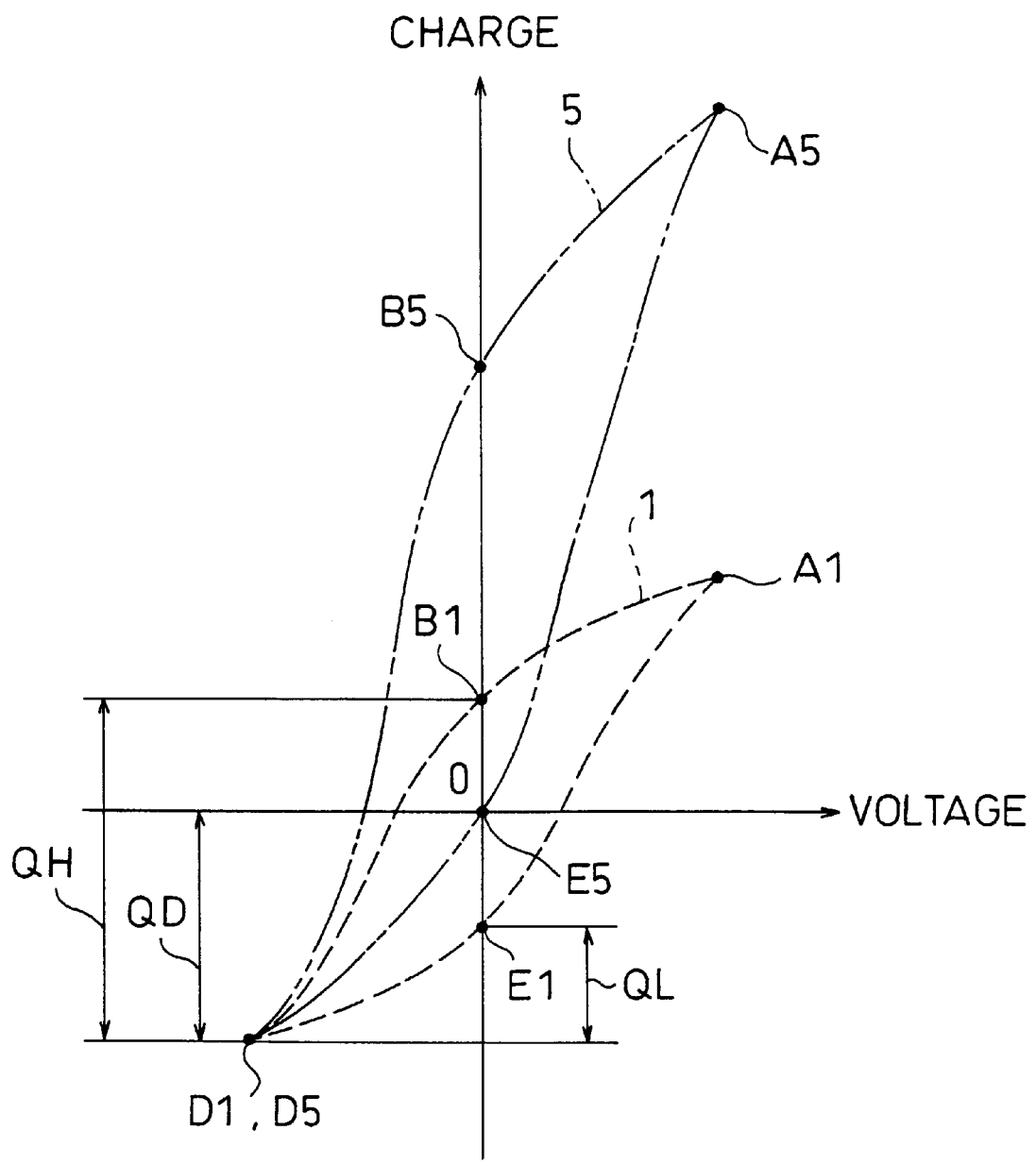
FIG. 5 is a view showing the hysteresis properties of a main memory cell capacitor and of a dummy memory cell capacitor in a ferroelectric memory according to a comparative example given in contrast to the first embodiment of the present invention.

In the present embodiment, the ferroelectric memory is characterized by the setting of the capacitance of the dummy memory cell capacitors. In FIG. 4, the curve 1 represents the hysteresis property of a conventional ferroelectric capacitor of a main memory cell. The curve 1 was drawn based on the measurements obtained by several times placing positive voltage and negative voltage between the electrodes of the main memory cell capacitor. However, as the number of times that the positive voltage and negative voltage are placed between the electrodes is increased, the effect of an imprint shifts the hysteresis property in the direction of increasing the charge in the same electric field, as indicated by the curve 4 in FIG. 4, until it is saturated eventually. Since the dummy memory cell capacitor repeatedly uses the same operation several times, its capacitance may deviate from an ideal value unless it is set in the state in which the hysteresis property is saturated as indicated by the curve 4 of FIG. 4. In view of the foregoing, the main memory cell in the ferroelectric memory of the present embodiment uses the ferroelectric capacitor having the property obtained in the state in which the voltages are placed between the electrodes of the capacitor an increased number of times. The hysteresis property thereof is represented by the curve 4 of FIG. 3. In this case, if the data in the memory cell is "H," the amount of charge for reading the data is QH. If the data in the memory cell is "L," the amount of charge for reading the data is QL. Next, the curve 3 obtained by vertically magnifying the curve 4 by a specified number of times so that it passes through the midpoint between the point B4 at which the data in the memory cell is in the "H" state and the point E4 at which the data in the memory cell is in the "L" state is defined to represent the hysteresis property of the dummy memory cell capacitor. The inclinations of the curves 4 and 3 in FIG. 3 represent the capacitances of the capacitors. Hence, the capacitance of the dummy memory cell capacitor is ideally set 3.5 times as large as the capacitance of the main memory cell capacitor. The dummy memory cell capacitor is operated with either positive or negative voltage placed between the electrodes of the capacitor. If the capacitance of the dummy memory cell capacitor is set twice as large as the capacitance of the main memory cell capacitor, as in a conventional example, shown in FIG. 5 where the curve 5 represents the hysteresis property of the dummy memory cell capacitor it will be appreciated that the difference between the amount of charge for reading "L" data from the dummy memory cell and the amount of charge for reading "L" data from the main memory cell accounts for only 40% of the corresponding difference in the present embodiment.

By designing the difference between the amount of charge for reading "L" data from the dummy memory cell and that for reading "L" data from the main memory cell so that it is maximized as in the first embodiment, the ferroelectric memory is free from malfunction even when the sensitivity of the sense amplifier is varied and can operate even when the difference between the amount of charge for reading "L" data from the dummy memory cell and that for reading "L" data from the main memory cell is reduced with a lower power-source voltage, thereby providing a ferroelectric memory operable with lower voltage.

(Second Embodiment)

Figure 6:
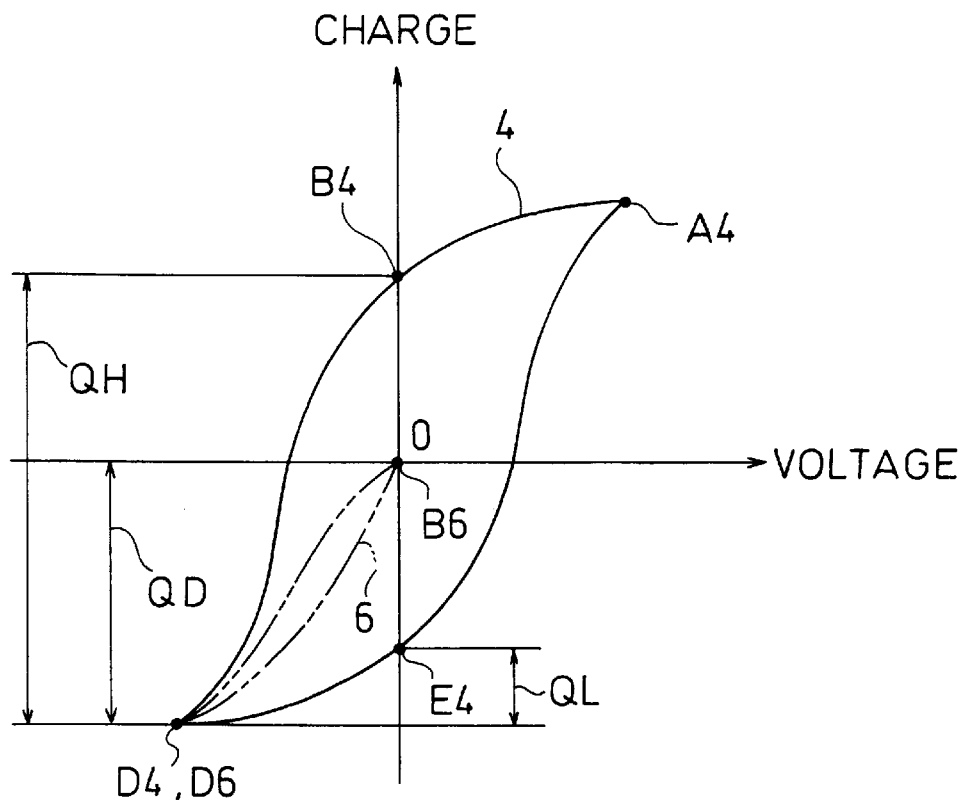
FIG. 6 is a view showing the hysteresis properties of a main memory cell capacitor and of a dummy memory cell capacitor in a ferroelectric memory according to a second embodiment of the present invention.
Figure 7:
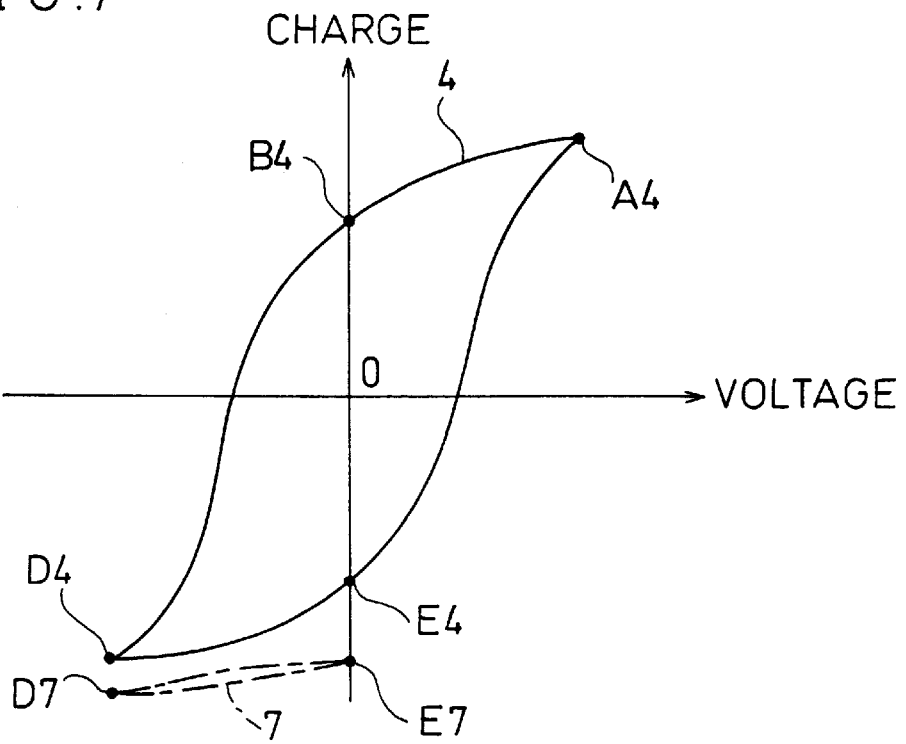
FIG. 7 is a view showing a hysteresis property, which illustrates a method of determining the hysteresis property of the dummy memory cell capacitor in FIG. 6.

In a second embodiment, the capacitance of the dummy memory cell capacitor is set based on the hysteresis property obtained when the dummy memory cell capacitor was repeatedly operated with either positive or negative voltage placed between the electrodes of the dummy memory cell capacitor. The circuit diagram and timing chart of the second embodiment are the same as those used in the first embodiment, so that FIG. 1 is the circuit diagram showing the structure of the second embodiment and FIG. 2 is the timing chart showing the operation thereof, which corresponds to FIG. 1. In FIG. 6, the curve 4 represents the hysteresis property of the ferroelectric capacitor of the main memory cell and the curve 6 represents the hysteresis property of the ferroelectric capacitor of the dummy memory cell. FIG. 7 illustrates a method of determining the curve 6 in FIG. 6.

The ferroelectric memory of the present embodiment is characterized in that the capacitance of the dummy memory cell capacitor can be set more ideally than in the first embodiment by optimumly setting the capacitance of the dummy memory cell capacitor using data obtained by repeatedly operating the dummy memory cell capacitor with either positive or negative voltage applied thereto. Due to the effect of an imprint, the hysteresis property of the dummy memory cell capacitor in the second embodiment, which is represented by the curve 7 of FIG. 7, has a smaller inclination than that of the hysteresis property represented by the curve 4, which was obtained by repeatedly operating the dummy memory cell capacitor with both positive voltage and negative voltage in the first embodiment. The optimum capacitance of the dummy memory cell capacitor is determined by using the property represented by the curve 7. The maximum capacitance is determined by defining the curve 6 of FIG. 6, which was obtained by vertically magnifying the curve 7 of FIG. 7 by a specified number of times so that it passes through the midpoint between the point B4 at which the data in the memory cell is in the "H" state and the point E4 at which the data in the memory cell is in the "L" state, to represent the hysteresis property of the dummy memory cell capacitor. The inclination of the curve 7 of FIG. 7 and the inclination of the curve 6 of FIG. 6 represent the capacitances of the capacitors. Hence, the capacitance of the dummy memory cell capacitor is ideally set seven times as large as the capacitance of the main memory cell capacitor. If the capacitance of the dummy memory cell capacitor is set twice as large as the capacitance of the main memory cell capacitor as in the conventional example, the difference between the amount of charge for reading "L" data from the dummy memory cell and that for reading "L" data from the main memory cell becomes zero, which prevents normal operation.

As described in the second embodiment, it is important, for providing a ferroelectric memory which performs normal operation, to design the difference between the amount of charge for reading "L" data from the dummy memory cell and that for reading "L" data from the main memory cell so that it is maximized based on the hysteresis property in accordance with the operation of the dummy memory cell capacitor.

(Third Embodiment)

Figure 8:
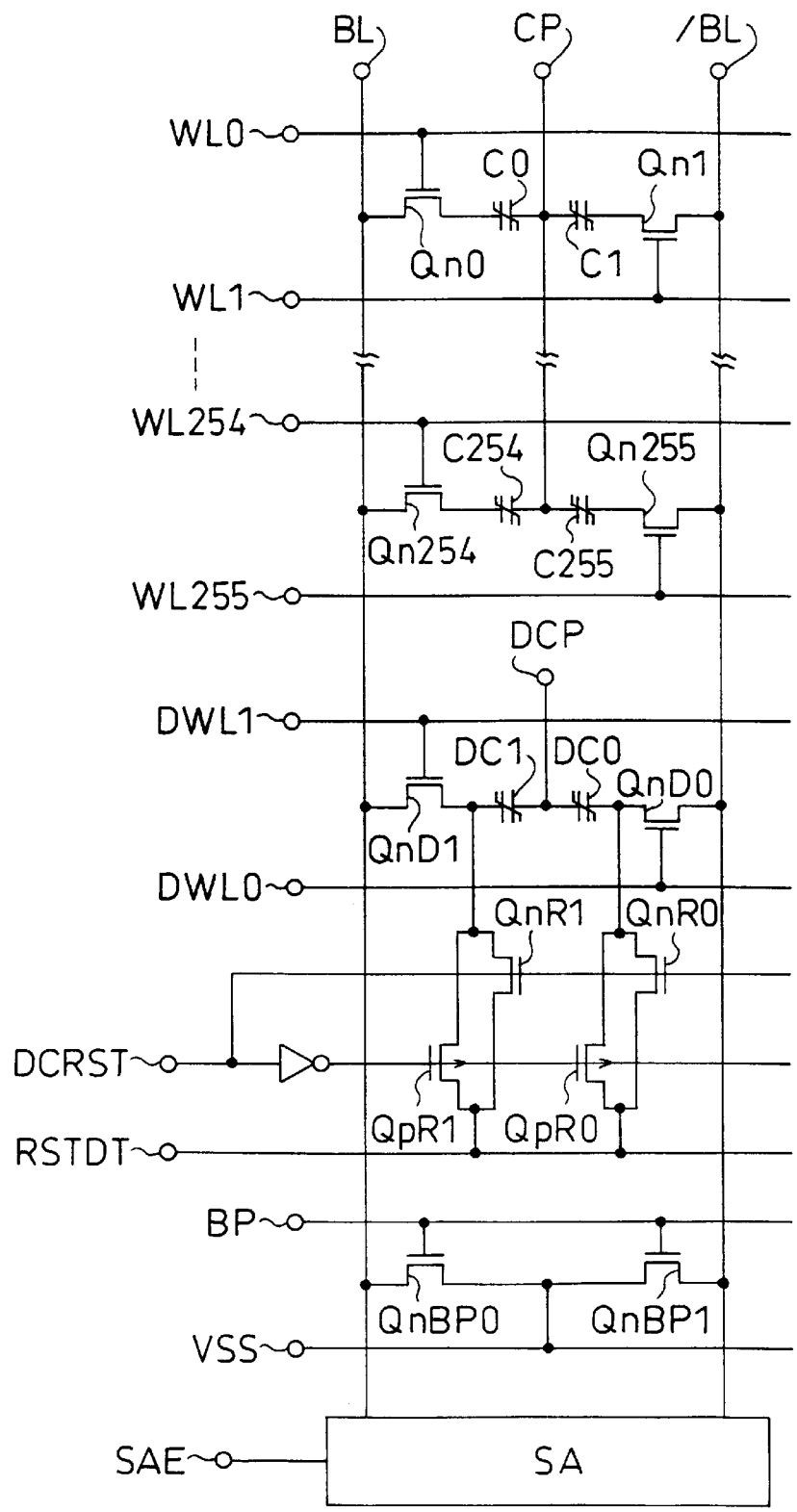
FIG. 8 is a circuit diagram showing the structure of a ferroelectric memory according to a third embodiment of the present invention.
Figure 9:
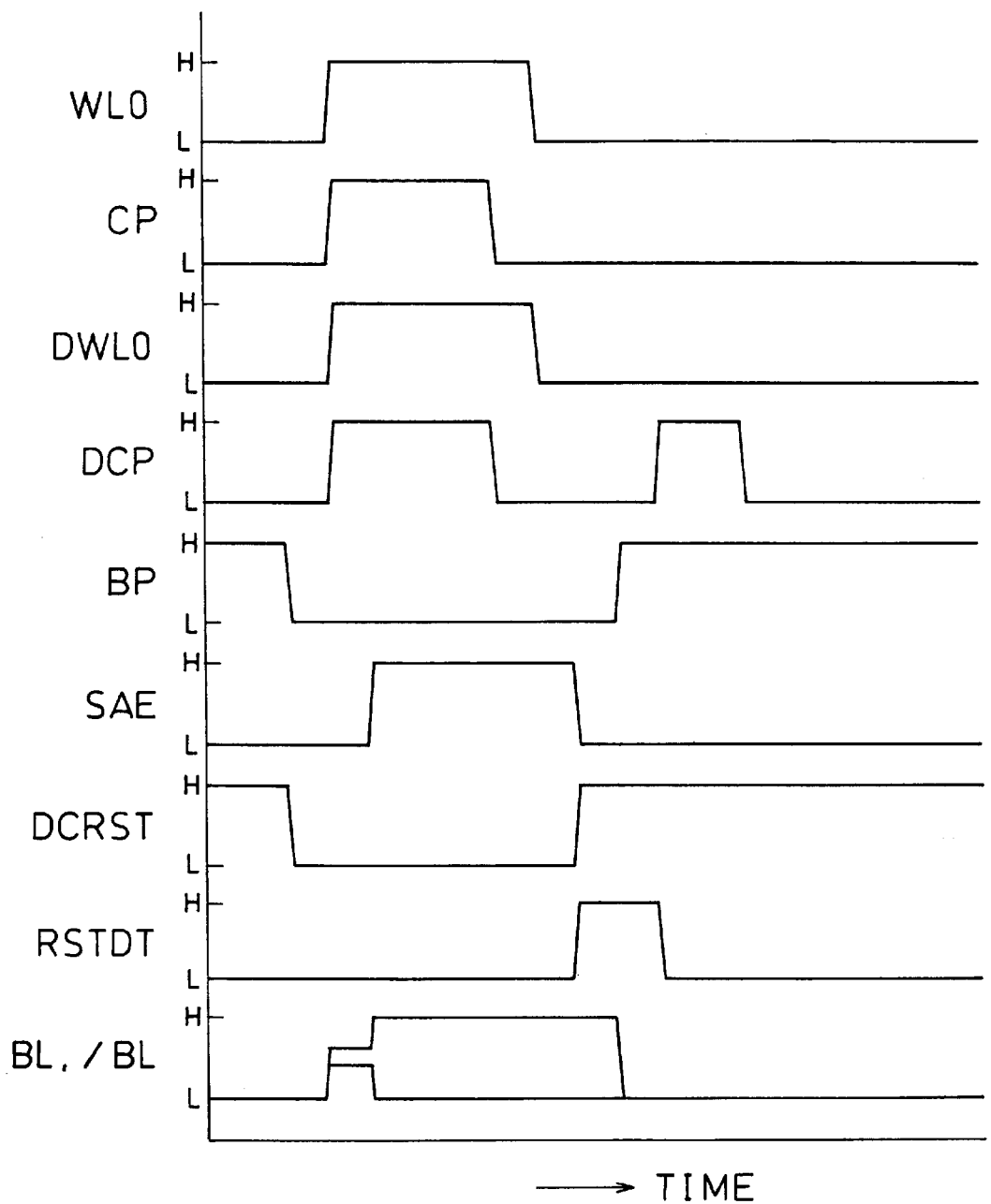
FIG. 9 is a timing chart showing the operation of the ferroelectric memory according to the third embodiment of the present invention.

The third embodiment is similar to the first embodiment in that the main memory cell capacitor is operated with both positive voltage and negative voltage placed between the electrodes of the main memory cell capacitor and that the capacitance of the dummy memory cell capacitor is determined based on the hysteresis property obtained when the main memory cell capacitor was operated with both positive voltage and negative voltage placed between the electrodes of the main memory cell capacitor. Also, in the actual operation of the dummy memory cell capacitor, both positive voltage and negative voltage are placed between the electrodes of the dummy memory cell capacitor. FIG. 8 is a circuit diagram showing the structure of the third embodiment and FIG. 9 is the timing chart showing the operation thereof, which corresponds to FIG. 8. In FIG. 3, the curve 4 represents the hysteresis property of the ferroelectric capacitor of the main memory cell and the curve 3 represents the hysteresis property of the ferroelectric capacitor of the dummy memory cell.

In the drawings are shown: the word lines WL0 to WL255; the dummy word lines DWL0 and DWL1; the bit lines BL and /BL; the cell plate electrode CP; the dummy cell plate electrode DCP; the bit-line precharge control signal BP; the control signal DCRST for initializing data in dummy memory cell; the sense amplifier control signal SAE; the ground voltage VSS; the sense amplifier SA: the main memory cell capacitors C0 to C255; the dummy memory cell capacitors DC0 and DC1; the n-channel MOS transistors Qn0 to Qn255, QnD0, QnD1, QnR0, QnR1, QnBP0, and QnBP1; p-channel MOS transistors QpR0 and QpR1; the amount of charge QL for reading "L" data from main memory cell; the amount of charge QH for reading "H" data from main memory cell; the amount of charge QD for reading data from dummy memory cell; and a dummy-memory-cell-capacitor reset voltage RSTDT.

A description will be given first to the circuit diagram of FIG. 8. The circuit structure shown in FIG. 8 is substantially the same as the circuit structure shown in FIG. 1 of the first embodiment. In FIG. 8, the bit lines BL and /BL are connected to the sense amplifier SA, which is controlled by the sense amplifier control signal SAE. The first electrode of the dummy memory cell capacitor is connected to the bit line via the dummy memory cell transistor having the gate electrode connected to the dummy word line, while the second electrode thereof is connected to the dummy cell plate electrode DCP. The first electrode of the main memory cell capacitor is connected to the bit line via the main memory cell transistor having the gate electrode connected to the word line, while the second electrode thereof is connected to the cell plate electrode CP. The first electrode of the dummy memory cell capacitor is connected, via the n-channel MOS transistors QnR0 and QnR1 each using the control signal DCRST for initializing data in dummy memory cell as the gate electrode and the p-channel MOS transistors QpR0 and QpR1 each using a signal obtained by logically inverting the signal DCRST as the gate electrode, to the dummy-memory-cell-capacitor reset voltage RSTDT serving as the voltage for initializing data in dummy memory cell.

A description will be given to the operation of the circuit in the ferroelectric memory with reference to the timing chart of FIG. 9 and to the hysteresis properties of the ferroelectric capacitors of the main memory cell and of the dummy memory cell shown in FIG. 3. To read data from the main memory cell, the bit-line precharge control signal BP is initially set at a logic voltage "H," thereby setting the bit lines BL and /BL at a logic voltage "L." The word lines WL0 to WL255, dummy word lines DWL0 and DWL1, cell plate electrode CP, dummy cell plate electrode DCP are set at a logic voltage "L." The control signal DCRST for initializing data in dummy memory cell is set at a logic voltage "H," while the dummy-memory-cell-capacitor reset voltage RSTDT is set at a logic voltage "L," thereby initializing the dummy memory cell into the state at the point E3 on the curve 3 of FIG. 3. Next, the bit-line precharge control signal BP is set at a logic voltage "L," thereby bringing the bit lines BL and /BL into a floating state, and the control signal DCRST for initializing data in dummy memory cell is set at a logic voltage "L," thereby bringing the first electrode of the dummy memory cell capacitor into a floating state. Subsequently, the word line WL0, dummy word line DWL0, cell plate electrode CP, and dummy cell plate electrode DCP are set at a logic voltage "H," thereby reading the data stored in the main memory cell onto the bit line BL and reading the data stored in the dummy memory cell onto the bit line /BL. In this case, if the data is "H," the state of the main memory cell makes a transition from the point B4 to the point D4 in FIG. 3 so that the charge QH is read onto the bit line BL. If the data is "L," the state of the main memory cell makes a transition from the point E4 to the point D4 in FIG. 3 so that the charge QL is read onto the bit line BL. On the other hand, the state of the dummy memory cell makes a transition from the point E3 to the point D3 (D4) in FIG. 3 so that the charge QD is read onto the bit line /BL. After that, the sense amplifier control signal SAE is set at a logic voltage "H" so as to operate the sense amplifier SA. In this case, if the data is "H," the state of the main memory cell makes a transition from the point D4 to the point E4 in FIG. 3, while the dummy memory cell remains in the state at the point D3 in FIG. 3. If the data is "L," the main memory cell remains in the state at the point D4 in FIG. 3, while the state of the dummy memory cell makes a transition from the point D3 to the point E3 in FIG. 3. Next, the cell plate electrode CP is set at a logic voltage "L" so as to restore data to the main memory cell. In this case, if the data is "H," the state of the main memory cell makes a transition from the point E4 to the point A4 in FIG. 3. If the data is "L," the state of the main memory cell makes a transition from the point D to the point E4 in FIG. 3. The dummy cell plate electrode DCP is also set at a logic voltage "L." Subsequently, the word line WL0 and dummy word line DWL0 are set at a logic voltage "L," so that the main memory cell capacitor and dummy memory cell capacitor carry no voltage. Then, the sense amplifier control signal SAE is set at a logic voltage "L," thereby halting the operation of the sense amplifier SA. On the other hand, the control signal DCRST for initializing data in dummy memory cell is set at a logic voltage "H" and the dummy-memory-cell-capacitor reset voltage RSTDT is set at a logic voltage "H," so that the state of the dummy memory cell makes a transition from the point E3 to the point A3 in FIG. 3. Thereafter, the dummy cell plate electrode DCP is set at a logic voltage "H" and the dummy-memory-cell-capacitor reset voltage RSTDT is set at a logic voltage "L," so that the state of the dummy memory cell makes a transition from the point A3 to the point D3 in FIG. 3. Moreover, the dummy cell plate electrode DCP is set at a logic voltage "L" so that the state of the dummy memory cell makes a transition from the point D3 to the point E3 in FIG. 3, thereby bringing the dummy memory cell into the initial state. Furthermore, the bit-line precharge control signal BP is set at a logic voltage "H," thereby setting the bit lines BL and /BL at a logic voltage "L," which is the initial state.

In the third embodiment, the dummy memory cell capacitor is inevitably operated with both positive voltage and negative voltage placed between the electrodes of the dummy memory cell capacitor. Consequently, the operation of the dummy memory cell capacitor is seldom influenced by the effect of an imprint and the operating margin is not reduced, thereby implementing a ferroelectric memory free from malfunction.

(Fourth Embodiment)

Figure 10:
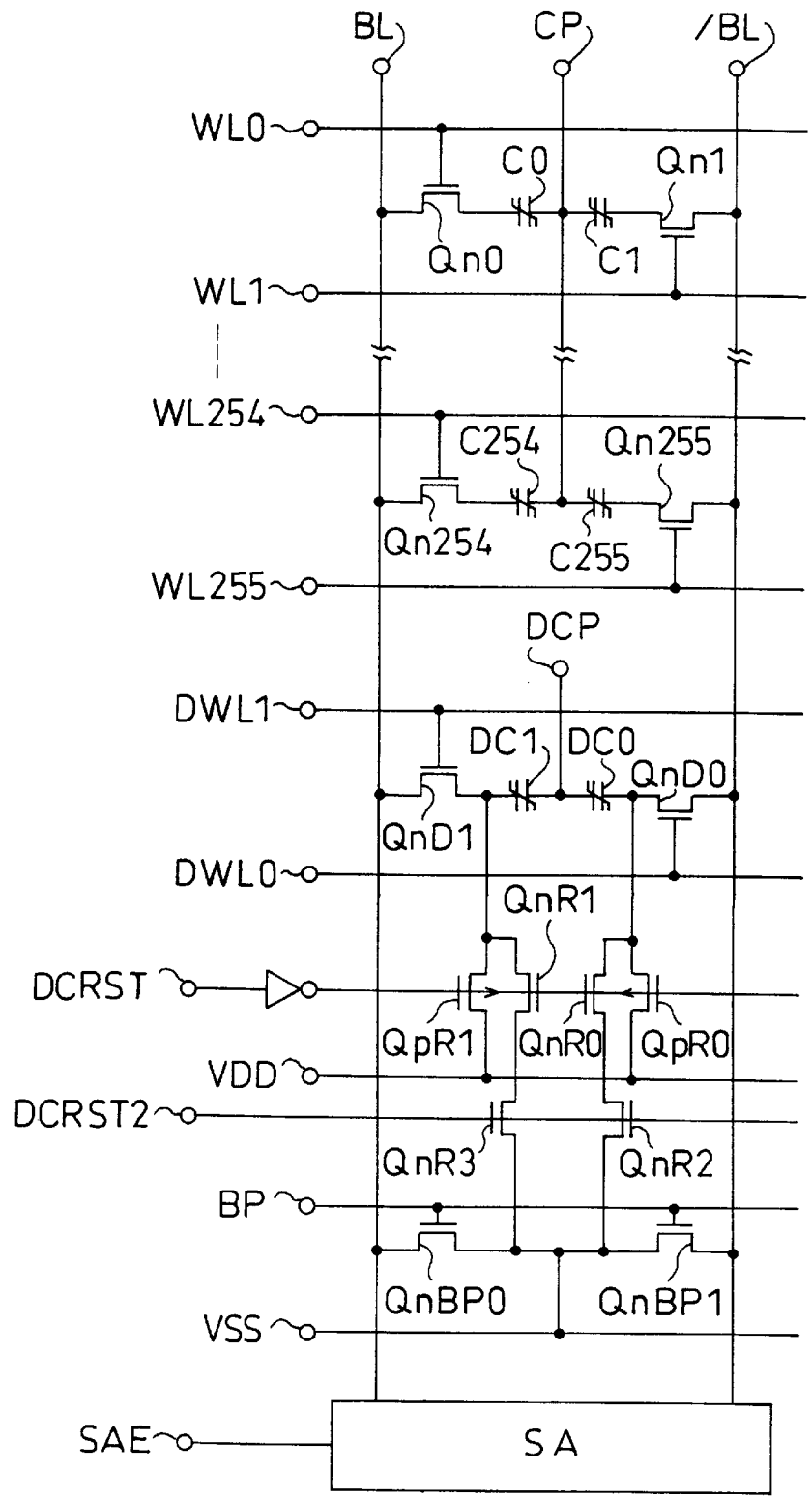
FIG. 10 is a circuit diagram showing the structure of a ferroelectric memory according to a fourth embodiment of the present invention.
Figure 11:
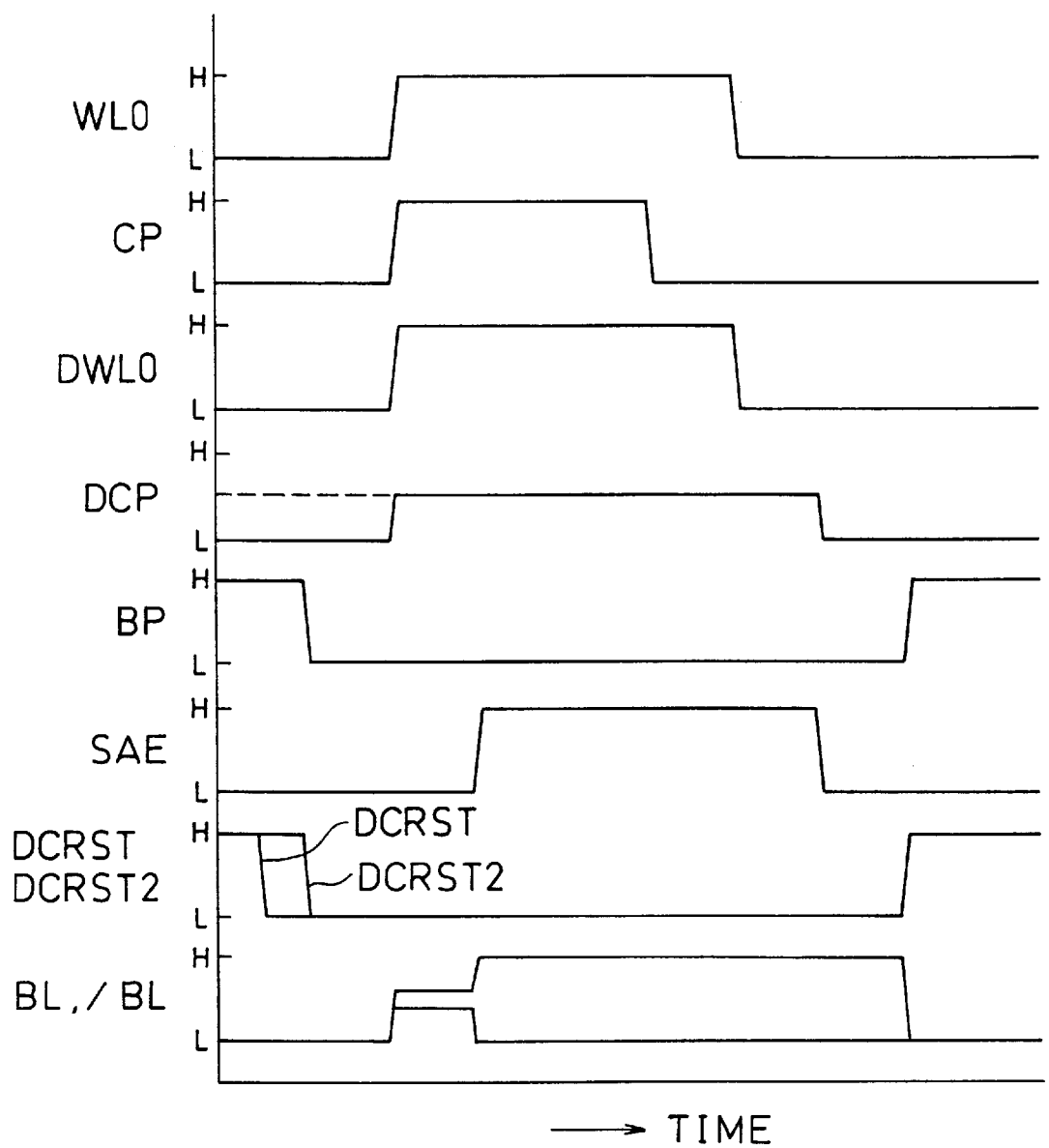
FIG. 11 is a timing chart showing the operation of the ferroelectric memory according to the fourth embodiment of the present invention.
Figure 12:
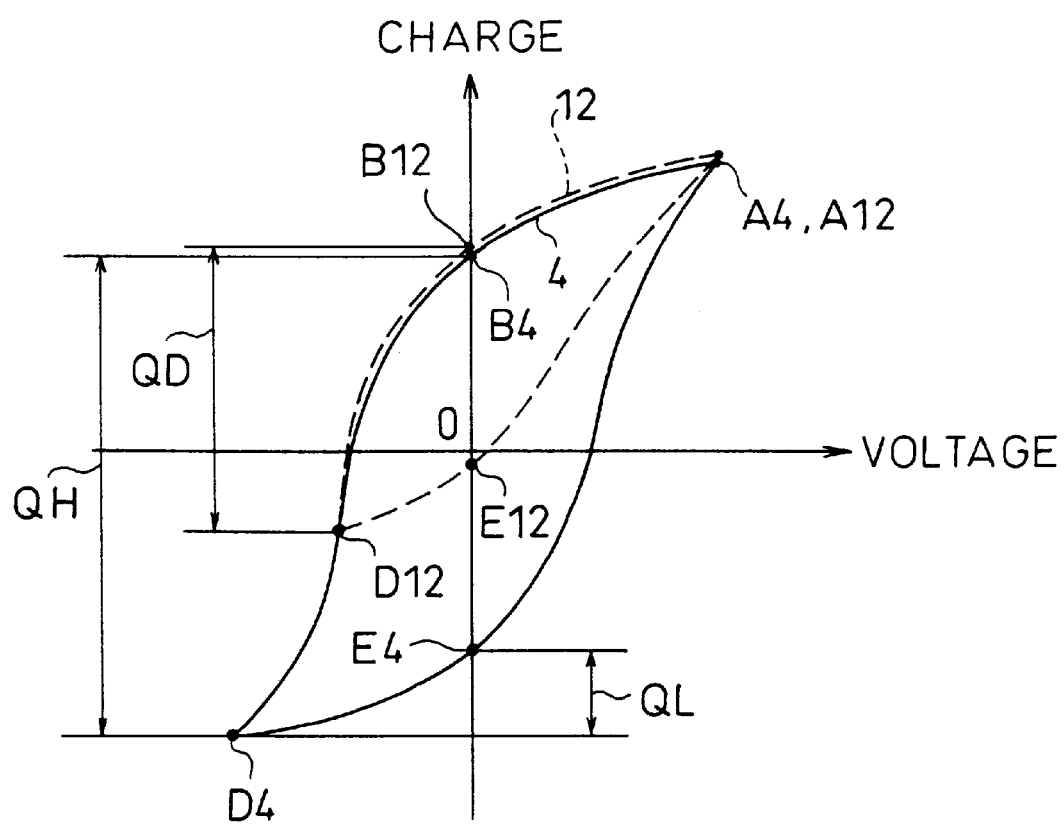
FIG. 12 is a view showing the hysteresis properties of a main memory cell capacitor and of a dummy memory cell capacitor in the ferroelectric memory according to the fourth embodiment of the present invention.
Figure 13:
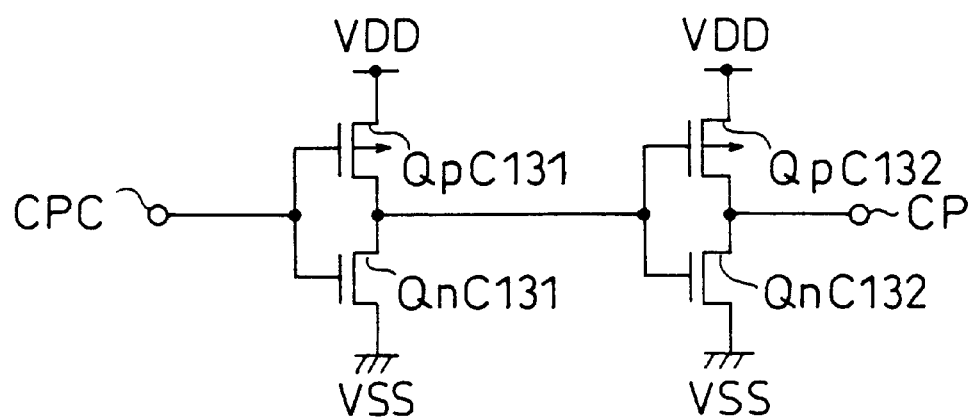
FIGS. 13A and 13B are diagrams showing the structures of a circuit for generating a signal for controlling a cell plate electrode and of a circuit for generating a signal for controlling a dummy cell plate electrode in the ferroelectric memory according to the fourth embodiment of the present invention.
Figure 13:
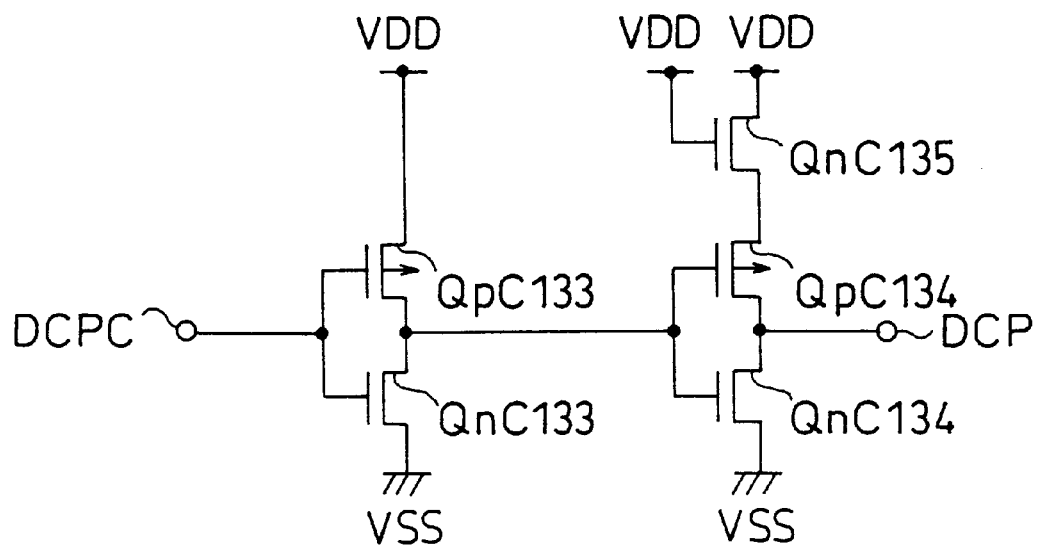

In a fourth embodiment, the amount of charge read from the dummy memory cell capacitor is set by setting the voltage to be placed between the electrodes of the dummy memory cell capacitor to a value different from that of the voltage to be placed between the electrodes of the main memory cell capacitor. In restoring the charge, the voltage to be placed between the electrodes of the dummy memory cell capacitor and the voltage to be placed between the electrodes of the main memory cell capacitor are initially set to the same value. In reading the charge, the voltage to be placed between the electrodes of the dummy memory cell capacitor is then set to a value smaller than that of the voltage to be placed between the electrodes of the main memory cell capacitor, thereby setting the amount of reference charge from the dummy memory cell capacitor. FIG. 10 is a circuit diagram showing the overall structure of the fourth embodiment and FIG. 11 is the timing chart showing the operation thereof, which corresponds to FIG. 10. In FIG. 12, the curve 4 represents the hysteresis property of the ferroelectric capacitor of the main memory cell and the curve 12 represents the hysteresis property of the ferroelectric capacitor of the dummy memory cell. FIGS. 13A and 13B are views showing the structures of a circuit for generating a signal for controlling the cell plate electrode CP and of a circuit for generating a signal for controlling the dummy cell plate electrode DCP.

In the drawings are shown: the word lines WL0 to WL255; the dummy word lines DWL0 and DWL1; the bit lines BL and /BL; the cell plate electrode CP; the dummy cell plate electrode DCP; the bit-line precharge control signal BP; control signals DCRST and DCRST2 for initializing data in dummy memory cells; a sense amplifier control signal SAE; the ground voltage VSS; the power-source voltage VDD; the sense amplifier SA; the main memory cell capacitors C0 to C255; the dummy memory cell capacitors DC0 and DC1; n-channel MOS transistors Qn0 to Qn255, QnD0, QnD1, QnBP0, QnBP1, QnC131 to QnC135, and QnR0 to QnR3; p-channel MOS transistors QpC131 to QpC134; the amount of charge QL for reading "L" data from main memory cell; the amount of charge QH for reading "H" data from main memory cell; the amount of charge QD for reading data from dummy memory cell; a cell-plate-electrode control signal CPC; and a dummy-cell-plate-electrode control signal DCPC.

A description will be given first to the circuit diagram of FIG. 10. In the drawing, the bit lines BL and /BL are connected to the sense amplifier SA, which is controlled by the sense amplifier control signal SAE. The first electrode of the dummy memory cell capacitor is connected to the bit line via the dummy memory cell transistor having the gate electrode connected to the dummy word line, while the second electrode thereof is connected to the dummy cell plate electrode DCP. The third electrode of the main memory cell capacitor is connected to the bit line via the main memory cell transistor having the gate electrode connected to the word line, while the fourth electrode thereof is connected to the cell plate electrode CP. The first electrode of the dummy memory cell capacitor is connected to the power-source voltage VDD serving as the voltage for initializing data in dummy memory cell via the p-channel MOS transistor QpR1 using a signal obtained by logically inverting the control signal DCRST for initializing data in dummy memory cell as the gate electrode. The circuit structure shown in FIG. 13A receives the cell-plate-electrode control signal CPC and outputs the dummy cell plate electrode signal DCP, which has the same phase as that of the cell-plate-electrode control signal CPC, has the minimum value equal to the ground voltage VSS, and has the maximum value equal to the power-source voltage VDD. The circuit structure shown in FIG. 13B receives the dummy-cell-plate-electrode control signal DCPC and outputs the dummy cell plate electrode signal DCP, which has the same phase as the dummy-cell-plate-electrode control signal DCPC, has the minimum value equal to VSS, and has the maximum value equal to "VDD-Vtn (Vtn is the threshold voltage of the n-channel MOS transistor)". Although the logic voltage "H" of the dummy cell plate electrode signal DCP is set to "VDD-Vtn," another specified voltage can be used instead in accordance with the hysteresis property of the ferroelectric capacitor being used. For example, voltages such as "VDD-2Vtn" and "VDD-3Vtn" can easily be produced. It is ideal for the voltage of the dummy cell plate electrode signal DCP to satisfy the equation of QD=(QH+QL)/2.

A description will be given to the operation of the circuit in the ferroelectric memory with reference to the timing chart of FIG. 11 and to the hysteresis properties of the ferroelectric capacitors of the main memory cell and of the dummy memory cell shown in FIG. 12. In FIG. 12 showing the hysteresis properties of the ferroelectric capacitors, the abscissa represents the electric field applied to the memory cell capacitors and the ordinate represents the charge resulting from the electric field. The curve 4 represents the hysteresis property of the ferroelectric capacitor of the main memory cell. In the ferroelectric capacitor, a polarization remains even at zero electric field, as indicated by the point B4 or E4. The curve 12 shows the hysteresis property of the ferroelectric capacitor of the dummy memory cell wherein no electric field is applied to the ferroelectric in an initial state and the state at the point B12 is obtained at zero electric field. To read data from the main memory cell, each of the control signals DCRST and DCRST2 for initializing data in dummy memory cells is initially set at a logic voltage "H," so as to bring the dummy memory cell into the state at the point A12 on the curve 12 of FIG. 12. On the other hand, the bit-line precharge signal BP is set at a logic voltage "H," thereby setting the bit lines BL and /BL at a logic voltage "L." The word lines WL0 to WL255, dummy word lines DWL0 and DWL1, cell plate electrode CP, and dummy cell plate electrode DCP are set at a logic voltage "L." Next, the control signal DCRST for initializing data in dummy memory is set at a logic voltage "L," so as to bring the dummy memory cell into the state at the point B12 on the curve 12 of FIG. 12, which is the initial state. Subsequently, the bit-line precharge control signal BP is set at a logic voltage "L," thereby bringing the bit lines BL and /BL into a floating state, and the control signal DCRST2 for initializing data in dummy memory cell is set at a logic voltage "L," thereby bringing the first electrode of the dummy memory cell capacitor into a floating state. Then, the word line WL0, dummy word line DWL0, cell plate electrode CP, and dummy cell plate electrode DCP are set at a logic voltage "H," so that the data in the main memory cell is read onto the bit line BL, while the data in the dummy memory cell is read onto the bit line /BL. In this case, if the data is "H," the state of the main memory cell makes a transition from the point B4 to the point D4 in FIG. 12, so that the charge QH is read onto the bit line BL. If the data is "L," the state of the main memory cell makes a transition from the point E4 to the point D4 in FIG. 12, so that the charge QL is read onto the bit line BL. As for the dummy memory cell, the state thereof makes a transition from the point B12 to the point D12 in FIG. 12, so that the charge QD is read onto the bit line /BL. Next, the sense amplifier control signal SAE is set at a logic voltage "H" so as to operate the sense amplifier SA. In this case, if the data is "H," the state of the main memory cell makes a transition from the point D4 to the point E4 in FIG. 12, while the dummy memory cell remains in the state at the point D12 in FIG. 12. If the data is "L," the main memory cell remains in the state at the point D4 in FIG. 12, while the state of the dummy memory cell makes a transition from the point D12 to the point E12 in FIG. 12. After that, the cell plate electrode CP is set at a logic voltage "L" so as to restore data to the main memory cell. In this case, if the data is "H," the state of the main memory cell makes a transition from the point E4 to the point A4 in FIG. 12. If the data is "L," the state of the main memory cell makes a transition from the point D4 to the point E4 in FIG. 12. Subsequently, the word line WL0 and the dummy word line DWL0 are set at a logic voltage "L," so that the main memory cell capacitor and the dummy memory cell capacitor carry no voltage. Next, the dummy cell plate electrode DCP and the sense amplifier control signal SAE are also set at a logic voltage "L," so as to halt the operation of the sense amplifier. Subsequently, the control signals DCRST and DCRST2 for initializing data in dummy memory cells are set at a logic voltage "H," so that the state of the dummy memory cell makes a transition from the point E12 to the point A12 in FIG. 12. The bit-line precharge control signal BP is also set at a logic voltage "H" so as to set the bit lines BL and /BL at a logic voltage "L," which is the initial state.

In the fourth embodiment, the dummy memory cell capacitor is inevitably operated with both positive voltage and negative voltage placed between the electrodes of the dummy memory cell capacitor. Consequently, the operation of the dummy memory cell capacitor is seldom influenced by the effect of an imprint and the operating margin is not reduced, thereby implementing a ferroelectric memory free from malfunction. Moreover, the main memory cell capacitor and the dummy memory cell capacitor are designed to have substantially the same size so that the voltage to be placed between the electrodes of the dummy memory cell capacitor for reading data therefrom is set to an appropriate value, thereby producing a reference voltage. Consequently, there seldom occurs a variation in reference voltage of the memory cell capacitors manufactured. Furthermore, since the voltage placed between the electrodes of the dummy memory cell capacitor is smaller than the power-source voltage VDD, power consumption is reduced accordingly.

(Fifth Embodiment)

Figure 14:
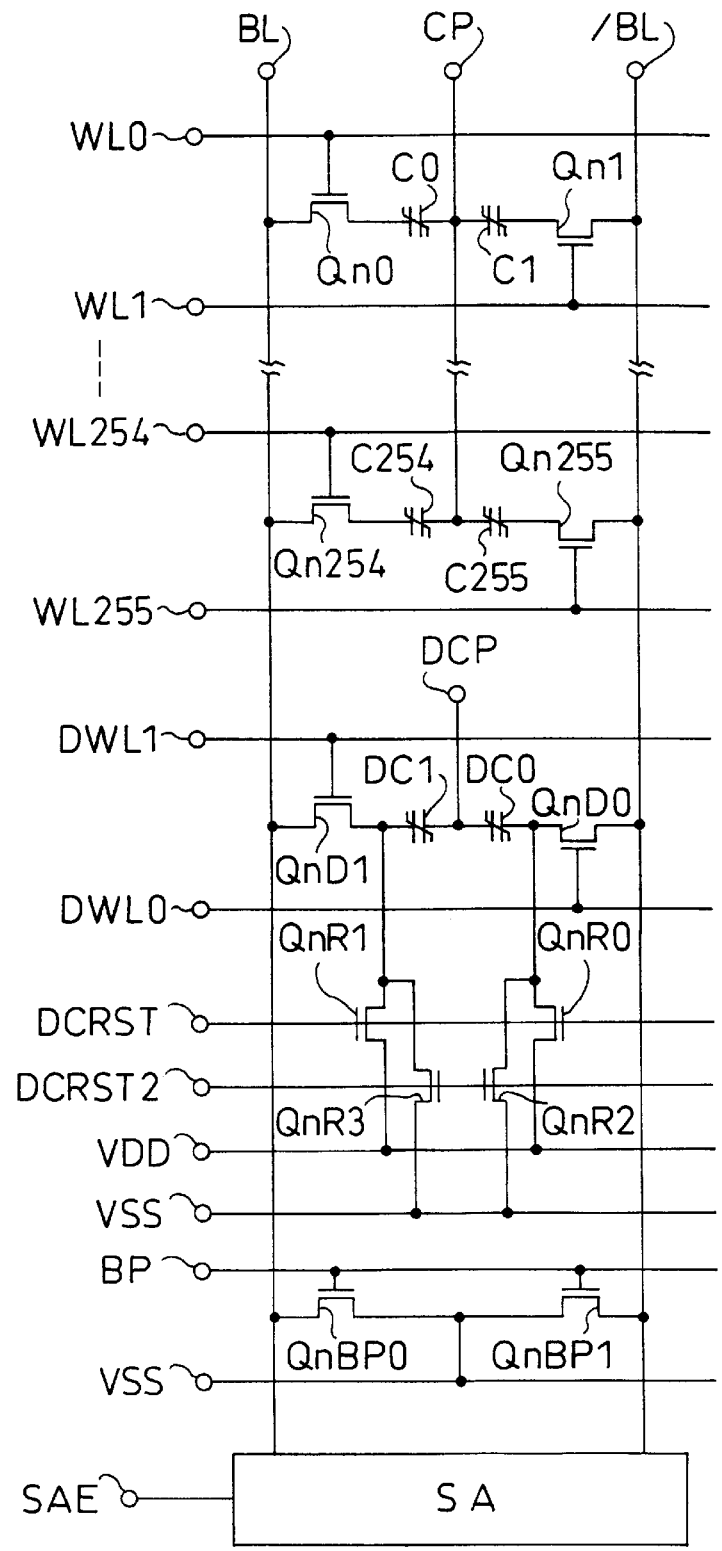
FIG. 14 is a circuit diagram showing the structure of a ferroelectric memory according to a fifth embodiment of the present invention.
Figure 15:
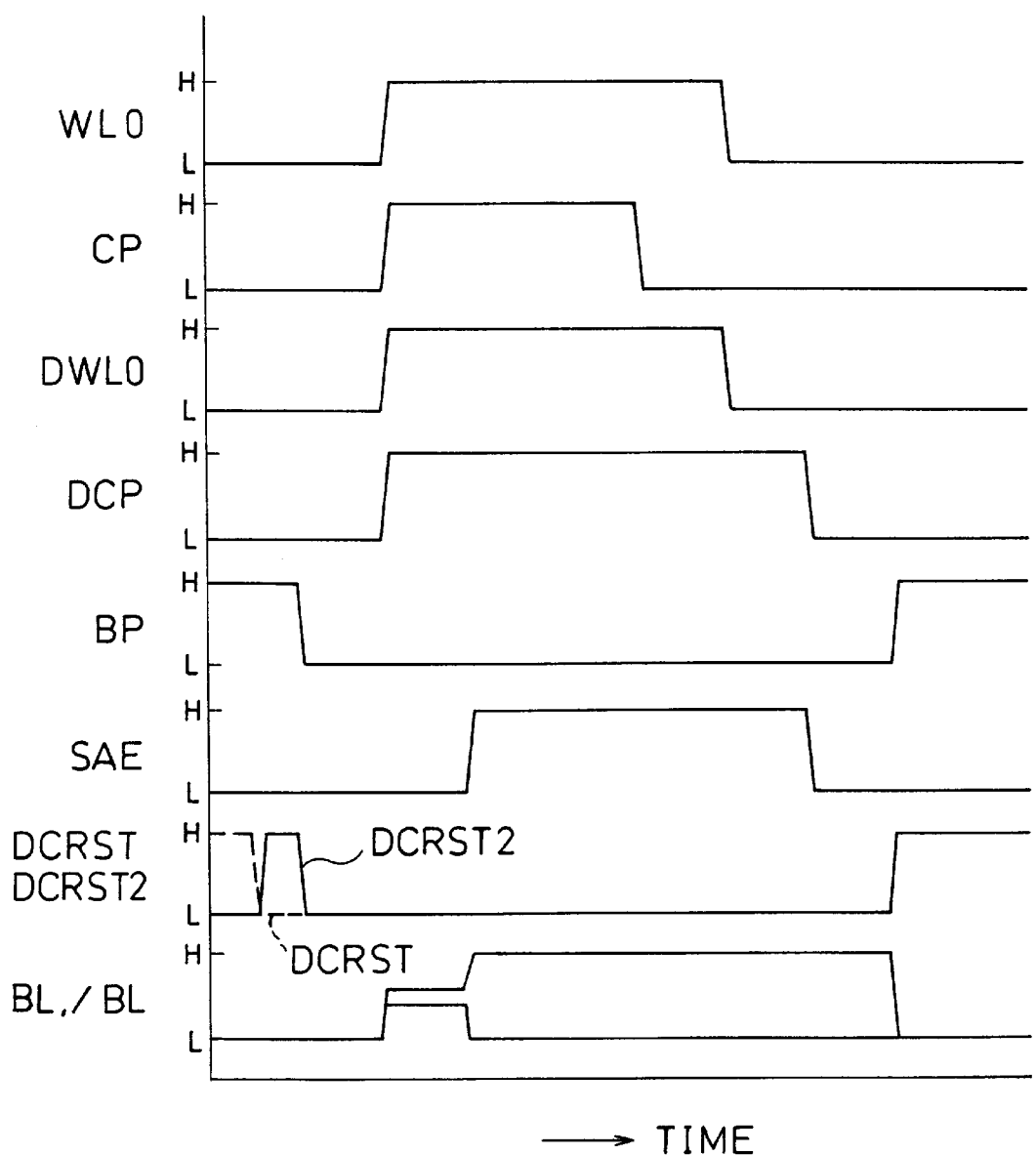
FIG. 15 is a timing chart showing the operation of the ferroelectric memory according to the fifth embodiment of the present invention.
Figure 16:
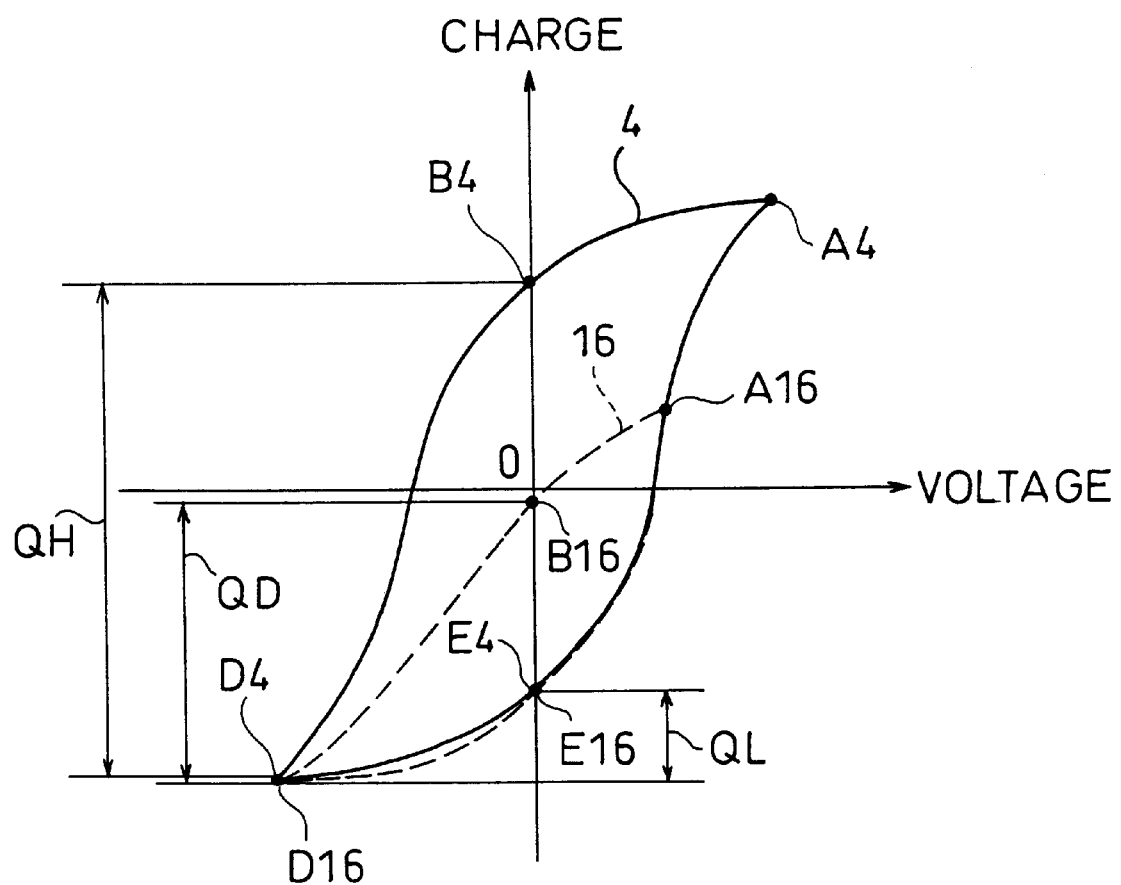
FIG. 16 is a view showing the hysteresis properties of a main memory cell capacitor and of a dummy memory cell capacitor in the ferroelectric memory according to the fifth embodiment of the present invention.

In a fifth embodiment, the amount of charge read from the dummy memory cell capacitor is determined by setting the voltage placed between the electrodes of the dummy memory cell capacitor to a value different from that of the voltage placed between the electrodes of the main memory cell capacitor, similarly to the fourth embodiment. In reading charge, the voltage to be placed between the electrodes of the dummy memory cell capacitor and the voltage to be placed between the electrodes of the main memory cell capacitor are set to the same value. In restoring the charge, the voltage to be placed between the electrodes of the dummy memory cell capacitor is set to a value smaller than that of the voltage to be placed between the electrodes of the main memory cell capacitor, thereby determining the amount of reference charge from the dummy memory cell capacitor. FIG. 14 is a circuit diagram showing the overall structure of the present embodiment and FIG. 15 is the timing chart showing the operation thereof, which corresponds to FIG. 14. In FIG. 16, the curve 4 represents the hysteresis property of the ferroelectric capacitor of the main memory cell and the curve 16 represents the hysteresis property of the ferroelectric capacitor of the dummy memory cell.

In the drawings are shown: the word lines WL0 to WL255; the dummy word lines DWL0 and DWL1; the bit lines BL and /BL; the cell plate electrode CP; the dummy cell plate electrode DCP; the bit-line precharge control signal BP; the control signals DCRST and DCRST2 for initializing data in dummy memory cells; the sense amplifier control signal SAE; the ground voltage VSS; the power-source voltage VDD; the sense amplifier SA; the main memory cell capacitors C0 to C255; the dummy memory cell capacitors DC0 and DC1; the n-channel MOS transistors Qn0 to Qn255, QnD0, QnD1, QnBP0, QnBP1, and QnR0 to QnR3; the amount of charge QL for reading "L" data from main memory cell; the amount of charge QH for reading "H" data from main memory cell; and the amount of charge QD for reading data from dummy memory cell.

A description will be given first to the circuit diagram of FIG. 14. In the drawing, the bit lines BL and /BL are connected to the sense amplifier SA, which is controlled by the sense amplifier control signal SAE. The first electrode of the dummy memory cell capacitor is connected to the bit line via the dummy memory cell transistor having the gate electrode connected to the dummy word line, while the second electrode thereof is connected to the dummy cell plate electrode DCP. The third electrode of the main memory cell capacitor is connected to the bit line via the main memory cell transistor having the gate electrode connected to the word line, while the fourth electrode thereof is connected to the cell plate electrode CP. The first electrode of the dummy memory cell capacitor is connected to the power-source voltage VDD serving as the voltage for initializing data in dummy memory cell via the n-channel MOS transistor QnR1 using the control signal DCRST for initializing data in dummy memory cell as the gate electrode and is also connected to the ground voltage VSS serving as the voltage for initializing data in dummy memory cell via the n-channel MOS transistor QnR3 using the control signal DCRST2 as the gate electrode. In the circuit, the first electrode of the dummy memory cell capacitor can be set to "VDD-Vtn (Vtn is the threshold voltage of the n-channel MOS transistor)."

A description will be given to the operation of the circuit in the ferroelectric memory with reference to the timing chart of FIG. 15 and to the hysteresis properties of the ferroelectric capacitors of the main memory cell and of the dummy memory cell shown in FIG. 16. In FIG. 16 showing the hysteresis properties of the ferroelectric capacitors, the abscissa represents the electric field applied to the memory-cell capacitors and the ordinate represents the charge resulting from the electric field. The curve 4 represents the hysteresis property of the ferroelectric capacitor of the main memory cell. In the ferroelectric capacitor, a polarization remains even at zero electric field, as indicated by the point B4 or E4. The curve 16 represents the hysteresis property of the ferroelectric capacitor of the dummy memory cell, wherein no voltage is applied to the ferroelectric in an initial state and the state at the point B16 is obtained at zero electric field. To read data from the main memory cell, the control signal DCRST for initializing data in dummy memory cell is initially set at a logic voltage "H," while the control signal DCRST2 is set at a logic voltage "L," so as to bring the dummy memory cell into the state at the point A16 on the curve 16 of FIG. 16. The bit-line precharge control signal BP is set at a logic voltage "H," thereby setting the bit lines BL and /BL at a logic voltage "L." The word lines WL0 to WL255, dummy word lines DWL0 and DWL1, cell plate electrode CP, and dummy cell plate electrode DCP are set at a logic voltage "L." Next, the control signal DCRST for initializing data in dummy memory cell is set at a logic voltage "L," while the control signal DCRST2 is set at a logic voltage "H," so as to bring the dummy memory cell into the state at the point B16 on the curve 16 of FIG. 16, which is the initial state. Subsequently, the bit-line precharge control signal BP is set at a logic voltage "L," thereby bringing the bit lines BL and /BL into a floating state, and the control signal DCRST2 for initializing data in dummy memory cell is set at a logic voltage "L," thereby bringing the first electrode of the dummy memory cell capacitor into a floating state. Then, the word line WL0, dummy word line DWL0, cell plate electrode CP, and dummy cell plate electrode DCP are set at a logic voltage "H," so that the data in the main memory cell is read onto the bit line BL and that the data in the dummy memory cell is read onto the bit line /BL. In this case, if the data is "H," the state of the main memory cell makes a transition from the point B4 to the point D4 in FIG. 16, so that the charge QH is read onto the bit line BL. If the data is "L," the state of the main memory cell makes a transition from the point E4 to the point D4 in FIG. 16, so that the charge QL is read onto the bit line BL. As for the dummy memory cell, the state thereof makes a transition from the point B16 to the point D16 in FIG. 16, so that the charge QD is read onto the bit line /BL. Next, the sense amplifier control signal SAE is set at a logic voltage "H" so as to operate the sense amplifier SA. In this case, if the data is "H," the state of the main memory cell makes a transition from the point D4 to the point E4 in FIG. 16, while the dummy memory cell remains in the state at the point D16 in FIG. 16. If the data is "L," the main memory cell remains in the state at the point D4 in FIG. 16, while the state of the dummy memory cell makes a transition from the point D16 to the point E16 in FIG. 16. After that, the cell plate electrode CP is set at a logic voltage "L" so as to restore data to the main memory cell. In this case, if the data is "H," the state of the main memory cell makes a transition from the point E4 to the point A4 in FIG. 16. If the data is "L," the state of the main memory cell makes a transition from the point D4 to the point E4 in FIG. 16. Then, the word line WL0 and dummy word line DWL0 are set at a logic voltage "L," so that the main memory cell capacitor and dummy memory cell capacitor carry no voltage. Next, the dummy cell plate electrode DCP and the sense amplifier control signal SAE are also set at a logic voltage "L," so as to halt the operation of the sense amplifier SA. Subsequently, the control signals DCRST and DCRST2 for initializing data in dummy memory cells are set at a logic voltage "H," so that the state of the dummy memory cell makes a transition from the point E16 to the point A16 in FIG. 16. On the other hand, the bit-line precharge control signal BP is set at a logic voltage "H," thereby setting the bit lines BL and /BL at a logic voltage "L," which is the initial state.

In the fifth embodiment, the dummy memory cell capacitor is inevitably operated with both positive voltage and negative voltage placed between the electrodes of the dummy memory cell capacitor. Consequently, the operation of the dummy memory cell capacitor is seldom influenced by the effect of an imprint and the operating margin is not reduced, thereby implementing a ferroelectric memory free from malfunction. Moreover, the main memory cell capacitor and the dummy memory cell capacitor are designed to have substantially the same size so that the voltage to be placed between the electrodes of the dummy memory cell capacitor for reading data therefrom is set to an appropriate value, thereby producing a reference voltage. Consequently, there seldom occurs a variation in reference voltage of the memory cell capacitors manufactured. Furthermore, since the voltage placed between the electrodes of the dummy memory cell capacitor is smaller than the power-source voltage VDD, similarly to the fourth embodiment, power consumption is reduced accordingly.

(Sixth Embodiment)

Figure 17:
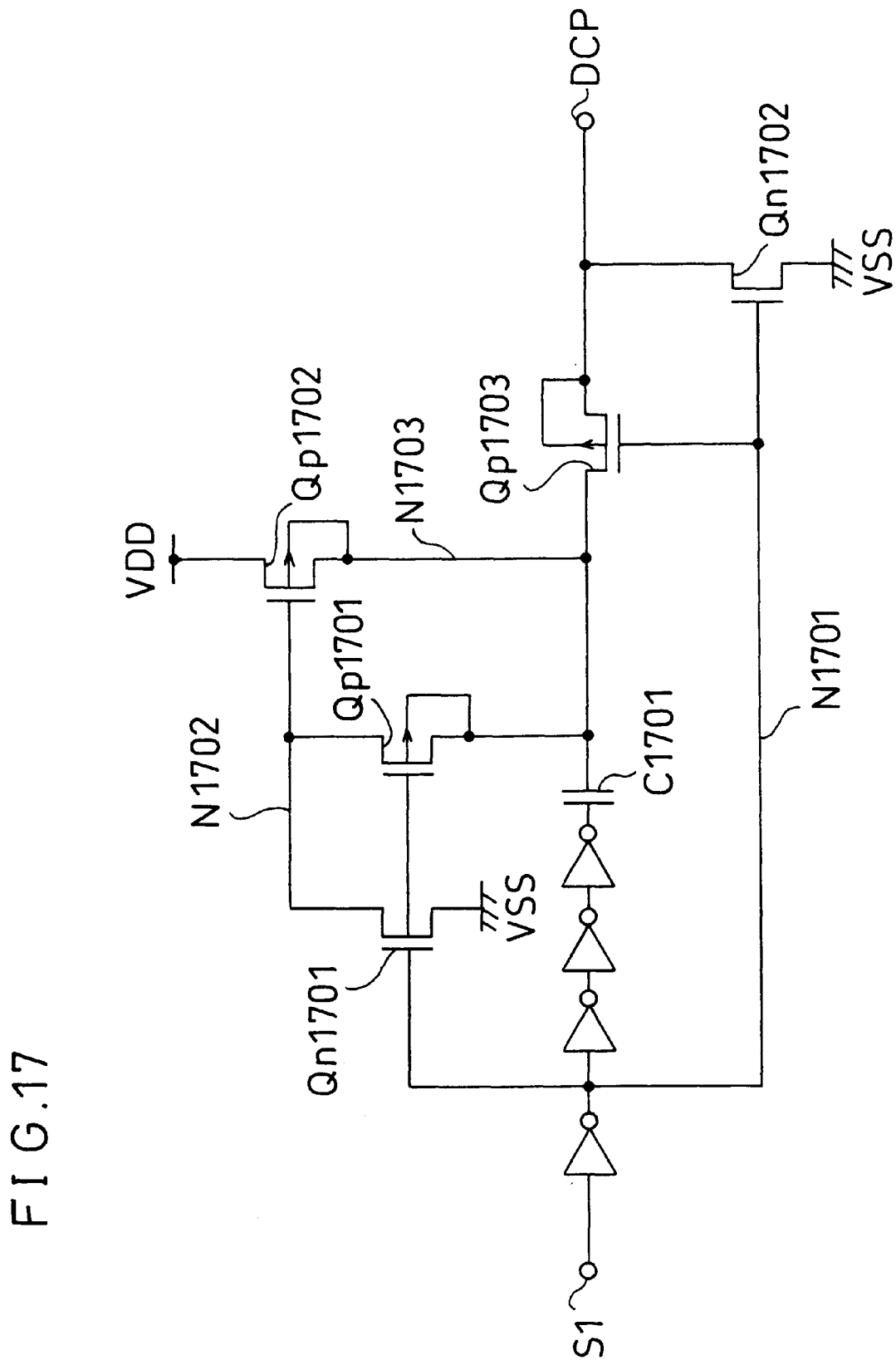
FIG. 17 is a diagram showing the structure of a circuit for generating a signal for controlling a dummy cell plate electrode in a ferroelectric memory according to a sixth embodiment of the present invention.
Figure 18:
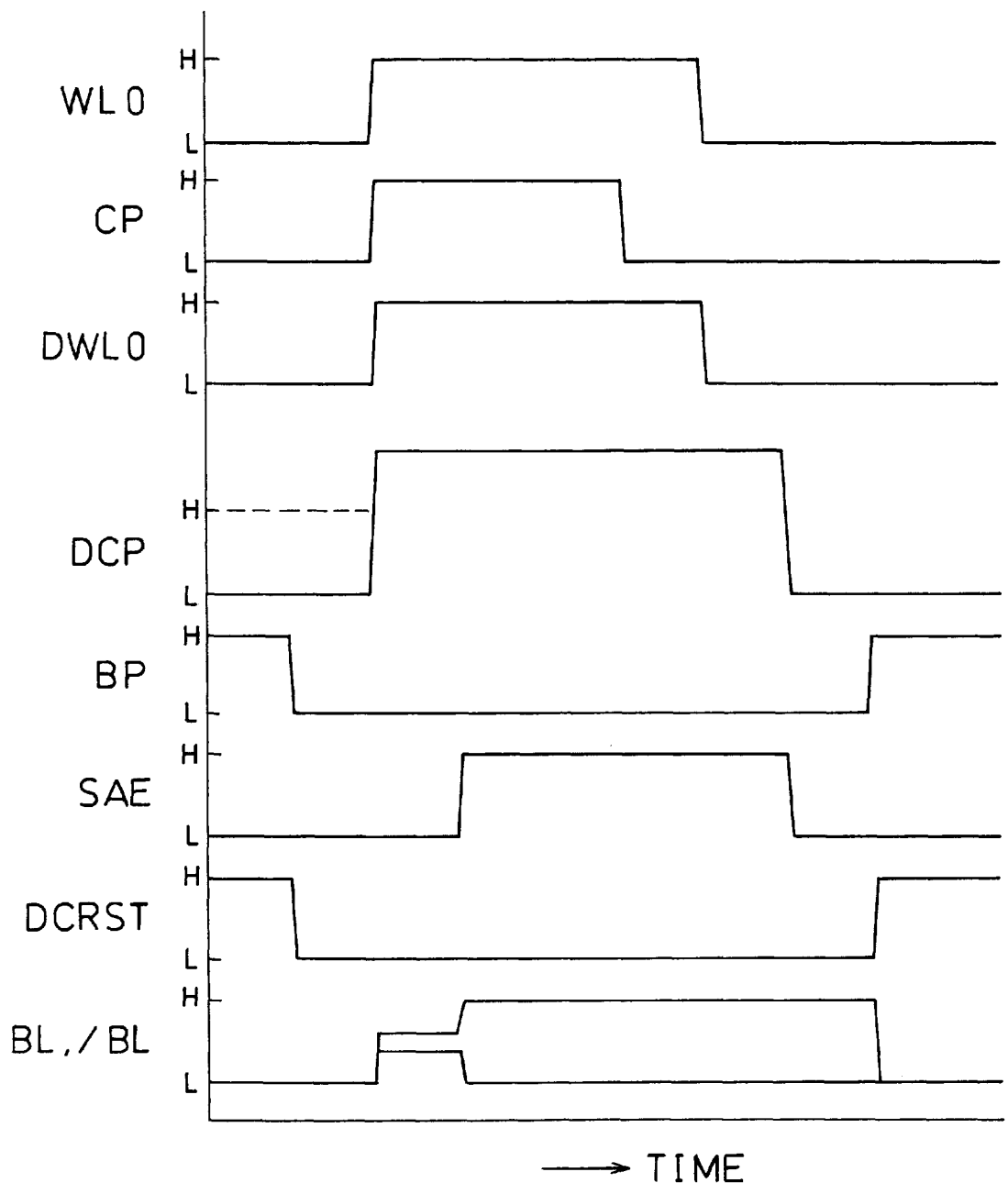
FIG. 18 is a timing chart showing the operation of the ferroelectric memory according to the sixth embodiment of the present invention.
Figure 19:
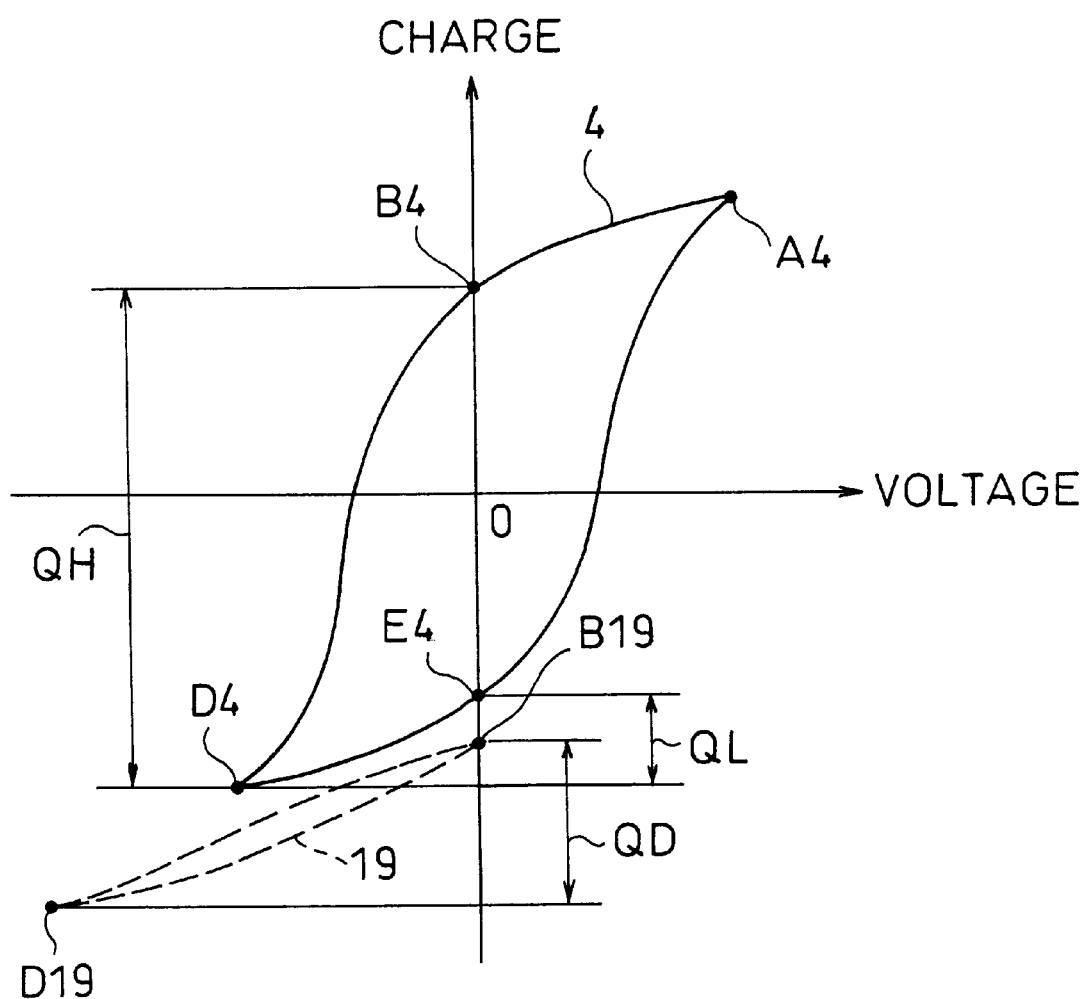
FIG. 19 is a view showing the hysteresis properties of a main memory cell capacitor and of a dummy memory cell capacitor in the ferroelectric memory according to the six embodiment of the present invention.

In a sixth embodiment, the amount of charge read from the dummy memory cell capacitor is set by setting the voltage to be placed between the electrodes of the dummy memory capacitor to a value different from that of the voltage to be placed between the electrodes of the main memory cell capacitor, similarly to the fourth embodiment. In reading the charge, the voltage to be placed between the electrodes of the dummy memory cell capacitor is set to a value larger than that of the voltage to be placed between the electrodes of the main memory cell capacitor, thereby setting the amount of reference charge from the dummy memory cell capacitor. The present embodiment does not perform the restoration of the charge and utilizes only one residual polarization state of the dummy memory cell capacitor. The circuit diagram showing the overall structure of the present embodiment is the same as that of FIG. 1 used in the first embodiment. FIG. 17 shows the dummy-cell-plate-signal generator and FIG. 18 is the timing chart showing the operation of the present embodiment, which corresponds to FIG. 1. In FIG. 19, the curve 4 shows the hysteresis property of the ferroelectric capacitor of the main memory cell and the curve 19 shows the hysteresis property of the ferroelectric capacitor of the dummy memory cell.

In the drawings are shown: the word lines WL0 to WL255; the dummy word lines DWL0 and DWL1; the bit lines BL and /BL; the cell plate electrode CP; the dummy cell plate electrode DCP; the bit-line precharge control signal BP; the control signal DCRST for initializing data in dummy memory cell; the sense amplifier control signal SAE; the control signal S1; node names N1701 to N1703; the power-source voltage VDD; the ground voltage VSS; the sense amplifier SA; the main memory cell capacitors C0 to C255; the dummy memory cell capacitors DC0 and DC1; a capacitor C1701; the n-channel MOS transistors Qn0 to Qn255, QnD0, QnD1, QnBP0, QnBP1, QnR0, and QnR1; the amount of charge QL for reading "L" data from main memory cell; the amount of charge QH for reading "H" data from main memory cell; and the amount of charge QD for reading data from dummy memory cell.

The circuit diagram showing the overall structure of the present embodiment is the same as that of FIG. 1 used in the first embodiment. A description will be given first to the dummy-cell-plate-signal generator for supplying a signal to the dummy cell plate DCP of FIG. 1, which is shown in FIG. 17. The signal to the dummy cell plate electrode DCP is a voltage having the same phase as that of the control signal S1, the minimum value higher than the ground voltage VSS, and the maximum value higher than the power-source voltage VDD. Here, "2×VDD" is generated. If the control signal S1 is at a logic voltage "L," the node 1701 is equal to VDD and the transistor Qn1702 is on, while the transistor Qp1701 is off and the signal to the electrode DCP is equal to VSS. On the other hand, the transistor Qp1702 is on and the node 1703 is equal to VDD. Then, if the control signal S1 is set at a logic voltage "H," the node N1701 becomes equal to VSS and the transistor Qn1702 is turned off, while the transistor Qp1703 is turned on and the voltage of the node N1703 is transmitted to the signal DCP. In this case, although the initial voltage of the node N1703 is equal to VDD, it is raised by the capacitor C1701 and reaches the ideal value of "2×VDD."

A description will be given to the operation of the circuit in the ferroelectric memory with reference to the timing chart of FIG. 18 and to the hysteresis properties of the ferroelectric capacitors of the main memory cell and of the dummy memory cell shown in FIG. 19. In FIG. 19 showing the hysteresis properties of the ferroelectric capacitors, the abscissa represents the electric field applied to the memory-cell capacitor and the ordinate represents the charge resulting from the electric field. The curve 4 represents the hysteresis property of the ferroelectric capacitor of the main memory cell. In the ferroelectric capacitor, a polarization remains even at zero electric field, as indicated by the point B4 or E4. The curve 19 represents the hysteresis property of the ferroelectric capacitor of the dummy memory cell, wherein no electric field is applied to the ferroelectric in an initial state and the state at the point B19 is obtained at zero electric field. To read data from the main memory cell, the control signal DCRST for initializing data in dummy memory cell is initially set at a logic voltage "H" so as to bring the dummy memory cell into the state at the point B19 on the curve 19 in FIG. 19. The bit-line precharge control signal BP is set at a logic voltage "H," thereby setting the bit lines BL and /BL at a logic voltage "L." The word lines WL0 to WL255, dummy word lines DWL0 and DWL1, cell plate electrode CP, and dummy cell plate electrode DCP are set to the ground voltage VSS, which is a logic voltage "L." The control signal DCRST for initializing data in dummy memory cell is set at a logic voltage "L," so as to bring the first electrode of the dummy memory cell into a floating state. On the other hand, the bit-line precharge control signal BP is set at a logic voltage "L," thereby bringing the bit lines BL and /BL into a floating state. Next, the word line WL0, dummy word line DWL0, cell plate electrode CP, and dummy cell plate electrode DCP are set at a logic voltage "H," so that the data in the main memory cell is read onto the bit line BL and that the data in the dummy memory cell is read onto the bit line /BL. Here, the logic voltage "H" of the dummy cell plate electrode DCP is the voltage 2×VDD higher than the power-source voltage VDD. If the data is "H," the state of the main memory cell makes a transition from the point B4 to the point D4 in FIG. 19. If the data is "L," the state of the main memory cell makes a transition from the point E4 to the point D4 in FIG. 19, so that the charge QL is read onto the bit line BL. As for the dummy memory cell, the state thereof makes a transition from the point B19 to the point D19 in FIG. 19, so that the charge QD is read onto the bit line /BL. Next, the sense amplifier control signal SAE is set at a logic voltage "H," so as to operate the sense amplifier SA. In this case, if the data is "H," the state of the main memory cell makes a transition from the point D4 to the point E4 in FIG. 19, while the dummy memory cell remains in the state at the point D19 in FIG. 19. If the data is "L," the main memory cell remains in the state at the point D4 in FIG. 19, while the state of the dummy memory cell makes a transition from the point D19 to the point B19 in FIG. 19. Subsequently, the cell plate electrode CP is set at a logic voltage "L," so as to restore data to the main memory cell. In this case, if the data is "H," the state of the main memory cell makes a transition from the point E4 to the point A4 in FIG. 19. If the data is "L," the state of the main memory cell makes a transition from the point D4 to the point E4 in FIG. 19. After that, the word line WL0 and the dummy word line DWL0 are set at a logic voltage "L," so that the main memory cell capacitor and the dummy memory cell capacitor carry no voltage. Then, the dummy cell plate electrode DCP and the sense amplifier control signal SAE are also set at a logic voltage "L," so as to halt the operation of the sense amplifier SA. Next, the control signal DCRST for initializing data in dummy memory cell is set at a logic voltage "H," so as to bring the dummy memory cell into the state at the point B19 in FIG. 19. On the other hand, the bit-line precharge control signal BP is set at a logic voltage "H," thereby setting the bit lines BL and /BL at a logic voltage "L," which is the initial state.

In operating the dummy memory cell capacitor in the sixth embodiment, the main memory cell capacitor and the dummy memory cell capacitor are designed to have substantially the same size, so that the voltage to be placed between the electrodes of the dummy memory cell capacitor for reading data therefrom is set larger than the voltage placed between the electrodes of the main memory cell capacitor, thereby producing a reference voltage. Consequently, there seldom occurs a variation in reference voltage of the memory cell capacitors manufactured.

(Seventh Embodiment)

Figure 20:
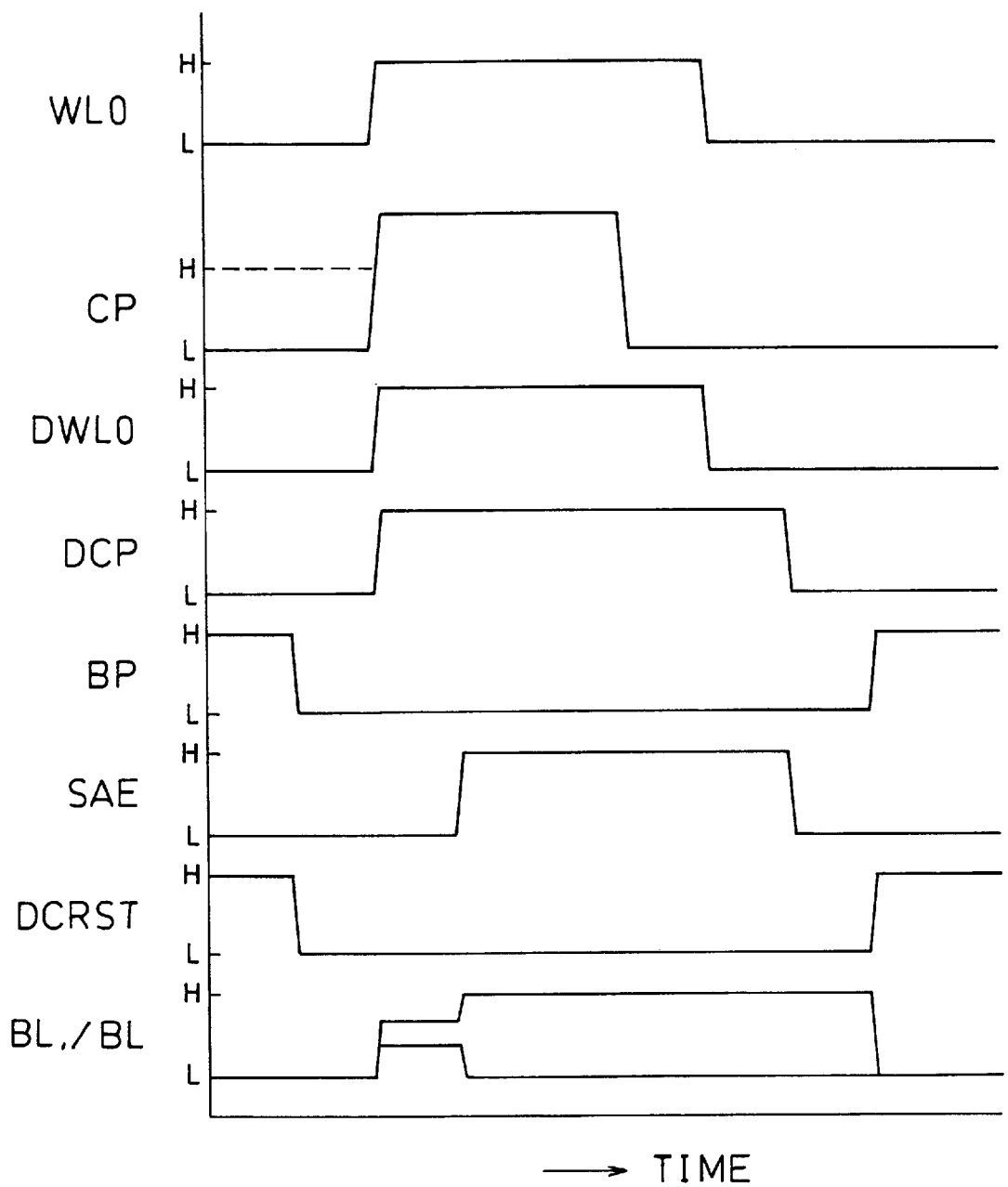
FIG. 20 is a timing chart showing the operation of a ferroelectric memory according to a seventh embodiment of the present invention.
Figure 21:
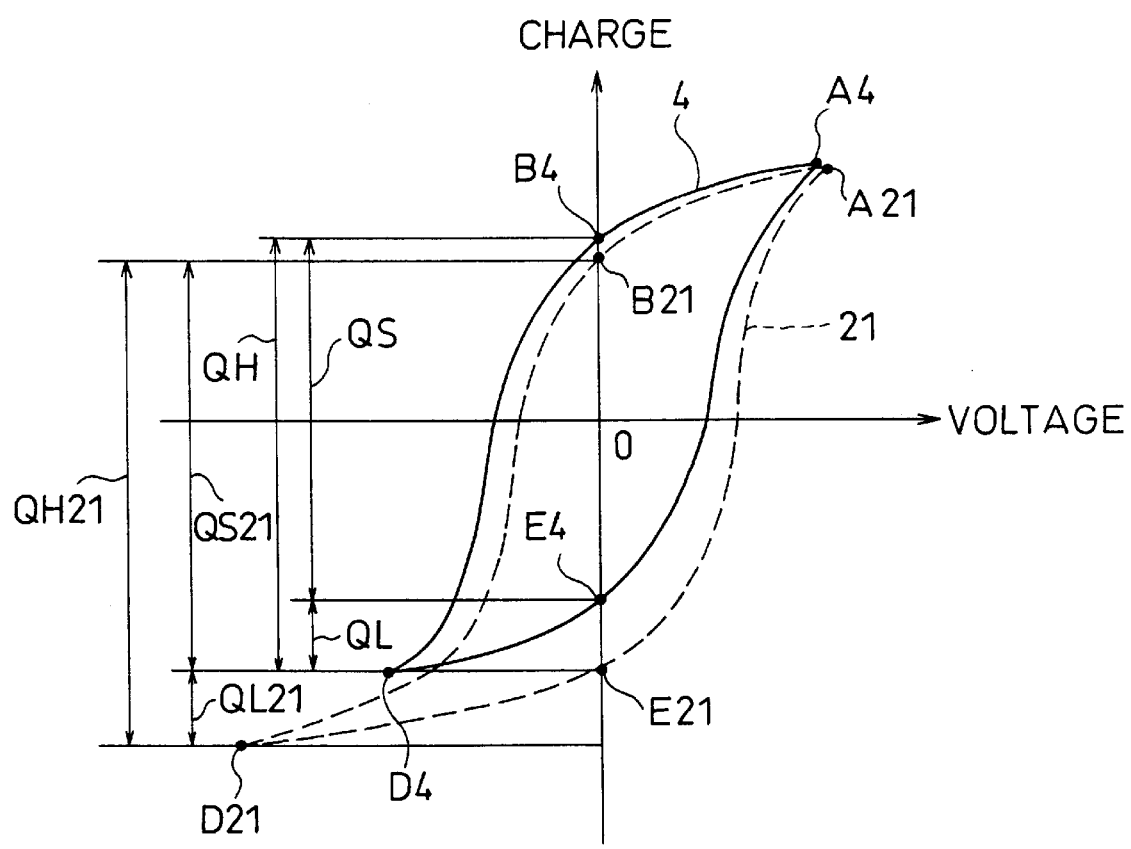
FIG. 21 is a view showing the hysteresis property of a main memory cell capacitor in the seventh embodiment of the present invention.

In a seventh embodiment, an increased amount of charge can be read in reading data from the main memory cell. In the present embodiment, the voltage of the cell plate electrode CP is set larger than the power-source voltage VDD in reading data, thereby increasing the voltage placed between the electrodes of the main memory cell capacitor and the amount of read charge. The circuit diagram showing the overall structure of the present embodiment is the same as that of FIG. 1 used in the first embodiment. The cell-plate-signal generator is also the same as that of FIG. 17 used in the sixth embodiment, except that the dummy cell plate signal DCP is replaced by the cell plate signal CP. FIG. 20 is the timing chart showing the operation of the present embodiment. In FIG. 21, the curve 4 represents the hysteresis property of the ferroelectric capacitor of the main memory cell in the first embodiment and the curve 21 shows the hysteresis property of the ferroelectric capacitor of the main memory cell in the present embodiment.

In the drawings are shown: the word lines WL0 to WL255; the dummy word lines DWL0 and DWL1; the bit lines BL and /BL; the cell plate electrode CP; the dummy cell plate electrode DCP; the bit-line precharge control signal BP; the control signal DCRST for initializing data in dummy memory cell; the sense amplifier control signal SAE; the control signal S1; node names N1401 to N1403; the power-source voltage VDD; the ground voltage VSS; the sense amplifier SA; the main memory cell capacitors C0 to C255; the dummy memory cell capacitors DC0 and DC1; a capacitor C1401; the n-channel MOS transistors Qn0 to Qn255, QnD0, QnD1, QnBP0, QnBP1, QnR0, and QnR1; the amount of charge QL for reading "L" data from main memory cell in the first embodiment; the amount of charge QH for reading "H" data from main memory cell in the first embodiment; the difference QS between the amount of charge QL for reading "L" data from main memory cell and the amount of charge QH for reading "H" data from main memory cell in the first embodiment; the amount of charge QL21 for reading "L" data from main memory cell in the present embodiment; the amount of charge QH21 for reading "H" data from main memory cell in the present embodiment; and the difference QS21 between the amount of charge QL21 for reading "L" data from main memory cell and the amount of charge QH21 for reading "H" data from main memory cell in the present embodiment.

The circuit diagram showing the overall structure of the present embodiment is the same as that of FIG. 1 used in the first embodiment. The cell-plate-signal generator is the same as that of FIG. 17 used in the sixth embodiment. A description will be given to the operation of the circuit in the ferroelectric memory with reference to the timing chart of FIG. 20 and to the hysteresis property of the ferroelectric capacitor of the main memory cell shown in FIG. 21. In FIG. 21 showing the hysteresis property of the ferroelectric capacitor, the abscissa represents the electric field applied to the memory cell capacitor and the ordinate represents the charge resulting from the electric field. The timing chart of FIG. 20 is substantially the same as that of FIG. 2 used in the first embodiment, except that the logic voltage "H" of the cell plate signal CP is higher in level than the power-source voltage VDD in the present embodiment. In FIG. 21, the curve 21 represents the hysteresis property of the ferroelectric capacitor of the main memory cell. In the ferroelectric capacitor, a polarization remains even at zero electric field, as indicated by the point B21 or E21. To read data from the main memory cell, the control signal DCRST for initializing data in dummy memory cell is initially set at a logic voltage "H," thereby providing an initial state wherein no voltage is applied to the dummy memory cell. The bit-line precharge control signal BP is set at a logic voltage "H," thereby setting the bit lines BL and /BL at a logic voltage "L." The word lines WL0 to WL255, dummy word line DWL0 and DWL1, cell plate electrode CP, and dummy cell plate electrode DCP are set to the ground voltage VSS, which is a logic voltage "L." Next, the control signal DCRST for initializing data in dummy memory cell is set at a logic voltage "L," thereby bringing the first electrode of the dummy memory cell into a floating state, and the bit-line precharge control signal BP is set at a logic voltage "L," thereby bringing the bit lines BL and /BL into a floating state. Subsequently, the word line WL0, dummy word line DWL0, cell plate electrode CP, and dummy cell plate electrode DCP are set at a logic voltage "H," so that the data in the main memory cell is read onto the bit line BL and that the data in the dummy memory cell is read onto the bit line /BL. Here, the logic voltage "H" of the cell plate electrode CP is the voltage 2×VDD higher than the power-source voltage VDD. If the data is "H," the state of the main memory cell makes a transition from the point B21 to the point D21 in FIG. 21, so that the charge QH is read onto the bit line BL. If the data is "L," the state of the main memory cell makes a transition from the point E21 to the point D21 in FIG. 21, so that the charge QL is read onto the bit line BL. The dummy memory cell is designed so that a charge (QH21+QL21)/2 is read therefrom, similarly to the first embodiment. After that, the sense amplifier control signal SAE is set at a logic voltage "H," so as to operate the sense amplifier SA. In this case, if the data is "H," the state of the main memory cell makes a transition from the point D21 to the point E21 in FIG. 21, while the dummy memory cell remains in the state at the point D21 in FIG. 21. If the data is "L," the main memory cell remains in the state at the point D21 in FIG. 21, while the state of the dummy memory cell makes a transition from the point D21 to the point B21. Then, the cell plate electrode CP is set at a logic voltage "L," so as to restore data to the main memory cell. In this case, if the data is "H," the state of the main memory cell makes a transition from the point E21 to the point A21 in FIG. 21. If the data is "L," the state of the main memory cell makes a transition from the point D21 to the point E21 in FIG. 21. Next, the word line WL0 and the dummy word line DWL0 are set at a logic voltage "L," so that the main memory cell capacitor and dummy memory cell capacitor carry no voltage. Subsequently, the dummy cell plate electrode DCP and the sense amplifier control signal SAE are also set at a logic voltage "L," thereby halting the operation of the sense amplifier SA. After that, the control signal DCRST for initializing data in dummy memory cell is set at a logic voltage "H," so as to bring the dummy memory cell into an initial state. On the other hand, the bit-line precharge control signal BP is set at a logic voltage "H," thereby setting the bit lines BL and /BL at a logic voltage "L," which is the initial state.

The seventh embodiment is characterized in that, in operating the main memory cell capacitor, the voltage of the cell plate electrode CP is set higher than the power-source voltage VDD, thereby increasing the voltage placed between the electrodes of the main memory cell capacitor, the amount of read charge, and the difference between the amount of charge for reading "H" data and the amount of charge for reading "L" data, which enables stable operation with lower voltage. Specifically, the difference between the amount of charge for reading "H" data and that for reading "L" data is represented by QS of FIG. 21 in the first embodiment, while it is represented by QS21 in the present embodiment, so that an increase of about 20% has been achieved.

(Eighth Embodiment)

Figure 22:
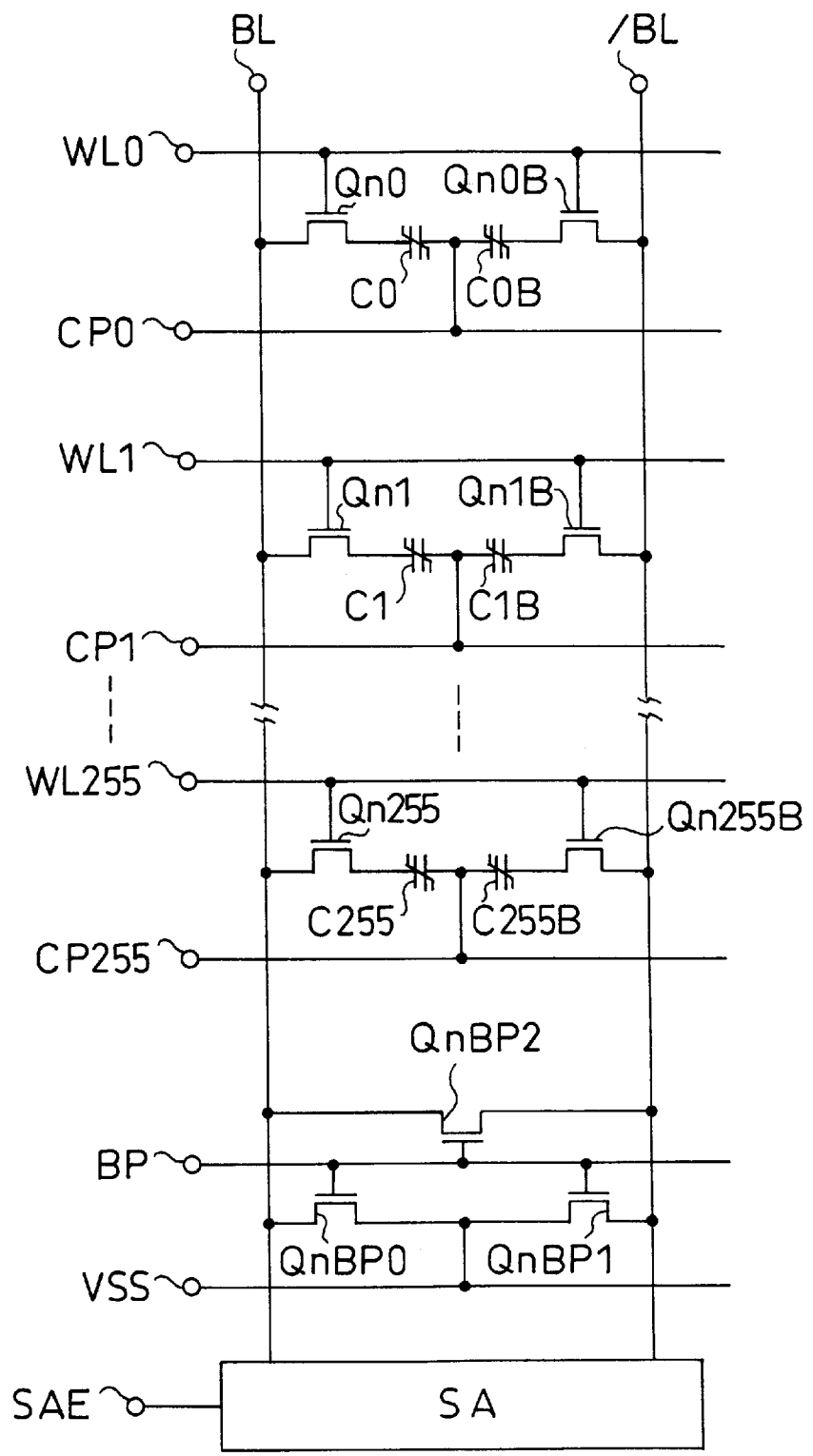
FIG. 22 is a circuit diagram showing the structure of a ferroelectric memory according to an eighth embodiment of the present invention.
Figure 23:
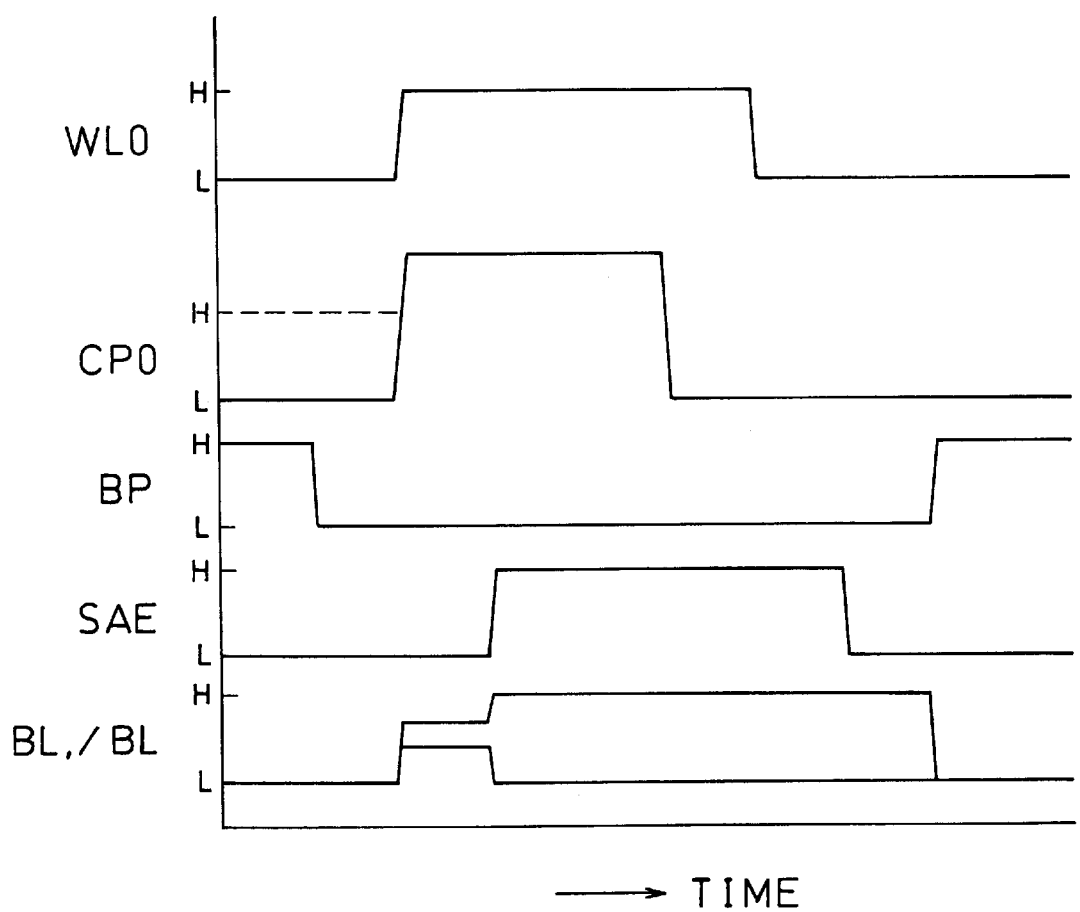
FIG. 23 is a timing chart showing the operation of the ferroelectric memory according to the eighth embodiment of the present invention.
Figure 24:
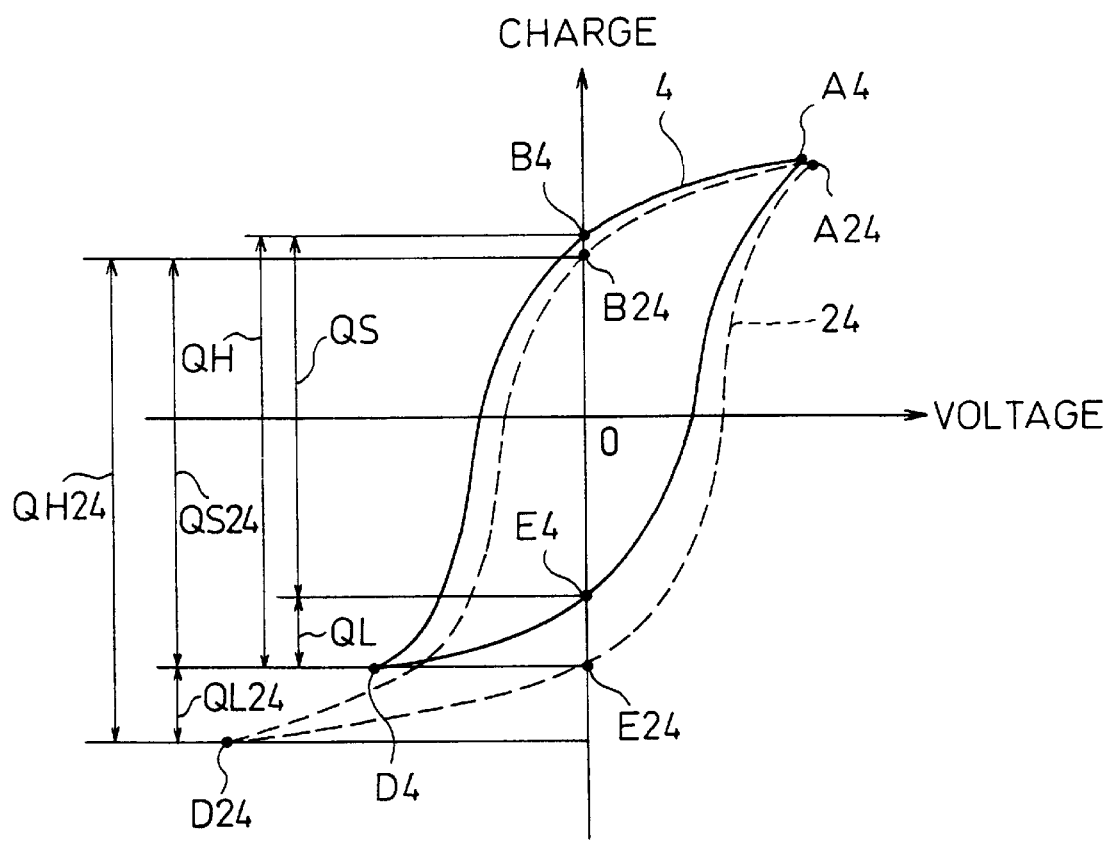
FIG. 24 is a view showing the hysteresis properties of a complementary pair of memory cell capacitors in the ferroelectric memory according to the eighth embodiment of the present invention.

In an eighth embodiment, an increased amount of charge can be read in reading data from the main memory cell, similarly to the seventh embodiment. In the eighth embodiment, a memory cell per bit consists of two ferroelectric capacitors and two transistors. The two ferroelectric capacitors store a complementary pair of data, respectively. FIG. 22 is a circuit diagram showing the overall structure of the present embodiment, in which the cell plate generator is the same as that of FIG. 17 used in the sixth embodiment. FIG. 23 is a timing chart showing the operation of the present embodiment. In FIG. 24, the curve 4 represents the hysteresis property for reading/writing data from and in the memory cell of the first embodiment and the curve 24 represents the hysteresis property for reading/writing data from and in the memory cell of the present embodiment.

In the drawings are shown: the word lines WL0 to WL255; the bit lines BL and /BL; cell plate electrodes CP0 to CP255; the bit-line precharge control signal BP; the sense amplifier control signal SAE; the ground voltage VSS; the sense amplifier SA; memory cell capacitors C0 to C255 and C0B to C255B; n-channel MOS transistors Qn0 to Qn255, Qn0B to Qn255B, and QnBP0 to QnBP2; the amount of charge QL for reading "L" data from main memory cell in the first embodiment; the amount of charge QH for reading "H" data from main memory cell in the first embodiment; the difference QS between the amount of charge QL for reading "L" data from main memory cell and the amount of charge QH for reading "H" data from main memory cell in the first embodiment; the amount of charge QL24 for reading "L" data from memory cell in the present embodiment; the amount of charge QH24 for reading "H" data from memory cell in the present embodiment; and the difference QS24 between the amount of charge QL24 for reading "L" data from memory cell and the amount of charge QH21 for reading "H" data from memory cell in the present embodiment.

A description will be given first to the circuit diagram of FIG. 22. In the drawing, the bit lines BL and /BL are connected to the sense amplifier SA, which is controlled by the sense amplifier control signal SAE. The first electrode of the memory cell capacitor C0 is connected to the bit line BL via the memory cell transistor Qn0 having the gate connected to the word line WL0, while the second electrode thereof is connected to the cell plate electrode CP0. The first electrode of the memory cell capacitor C0B forming a pair with the memory cell capacitor C0 is connected the bit line /BL via the memory cell transistor Qn0B having the gate electrode connected to the word line WL0, while the second electrode thereof is connected to the cell plate electrode CP0. The other memory capacitors C1 to C255 and C1B to C255B are interconnected in the same manner as the memory cell capacitors C0 and C0B are interconnected. The bit line BL is connected to the bit line /BL via the n-channel MOS transistor QnBP2. The bit line BL is connected to the ground voltage VSS via the n-channel MOS transistor QnBP0, while the bit line /BL is connected to the ground voltage VSS via the n-channel MOS transistor QnBP1. The gate electrodes of the n-channel MOS transistors QnBP0 to QnBP2 are connected to the bit-line precharge control signal BP. The logic voltage "H" of the cell-plate-signal generator is set higher in potential level than the power-source voltage VDD, similarly to the cell-plate-signal generator of FIG. 17 used in the sixth embodiment.

A description will be given to the operation of the circuit in the ferroelectric memory with reference to the timing chart of FIG. 23 and to the hysteresis property of the ferroelectric capacitor of the memory cell of FIG. 24. In FIG. 24 showing the hysteresis property of the ferroelectric capacitor, the abscissa represents the electric field applied to the memory-cell capacitor and the ordinate represents the charge resulting from the electric field. As for the timing chart of FIG. 23, it is substantially the same as that of FIG. 20 used in the seventh embodiment. In FIG. 24, the curve 24 represents the hysteresis property of the ferroelectric capacitor of the memory cell. In the ferroelectric capacitor, a polarization remains even at zero electric field as indicated by the point B24 or E24. Each of the memory cells consists of two ferroelectric capacitors for storing a complementary pair of data, respectively. The points B24 and E24 indicate residual polarizations which represent the complementary pair of data stored.

To read data from the memory cell, the bit-line precharge control signal BP is initially set at a logic voltage "H," thereby setting the bit lines BL and /BL to "L." The word lines WL0 to WL255 and the cell plate electrode CP are set at the ground voltage VSS, which is a logic voltage "L." Next, the bit-line precharge control signal BP is set at a logic voltage "L," thereby bringing the bit lines BL and /BL into a floating state. After that, the word line WL0 and the cell plate electrode CP are set at a logic voltage "H," so that the data in the memory cell capacitor C0 is read onto the bit line BL and that the data in the memory cell capacitor C0B is read onto the bit line /BL. Here, the logic voltage "H" of the cell plate electrode CP is higher than the power-source voltage VDD. In this case, if the data is "H," the state of the memory cell capacitor C0 makes a transition from the point B24 to the point D24 in FIG. 24, so that the charge QH24 is read onto the bit line BL. If the data is "L," the state of the memory cell capacitor C0 makes a transition from the point E24 to the point D24 in FIG. 24, so that the charge QL24 is read onto the bit line BL. Conversely, the state of the memory cell capacitor C0B makes a transition from the point E24 to the point D24 in FIG. 24 when the data is "H," while it makes a transition from the point B24 to the point D24 in FIG. 24 when the data is "L." Subsequently, the sense amplifier control signal SAE is set at a logic voltage "H" so as to operate the sense amplifier SA. In this case, if the data is "H," the state of the memory cell capacitor C0 makes a transition from the point D24 to the point E24 in FIG. 24, while the memory cell capacitor C0B remains in the state at the point D24 in FIG. 24. If the data is "L," the memory cell capacitor C0 remains in the state at the point D24 in FIG. 24, while the state of the memory cell capacitor C0B makes a transition from the point D24 to the point B24 in FIG. 24. Then, the cell plate electrode CP is set at a logic voltage "L," thereby restoring data to the memory cell capacitors C0 and C0B. In this case, if the data is "H," the memory cell capacitor C0 makes a transition from the state at the point E24 to the state at the point A24 in FIG. 24, while the state of the memory cell capacitor C0B makes a transition from the point D24 to the point E24 in FIG. 24. If the data is "L," the memory cell capacitor C0 makes a transition from the state at the point D24 to the state at the point E24 in FIG. 24, while the state of the memory cell capacitor C0B makes a transition from the point E24 to the point A24 in FIG. 24. Next, the word line WL0 is set at a logic voltage "L," so that the memory cell capacitors C0 and C0B carry no voltage. After that, the sense amplifier control signal SAE is set at a logic voltage "L," thereby halting the operation of the sense amplifier SA. Then, the bit-line precharge control signal BP is set at a logic voltage "H," thereby setting the bit lines BL and /BL at a logic voltage "L," which is the initial state.

Similarly to the seventh embodiment, the eighth embodiment is characterized in that, in the operation of the memory capacitor, the voltage of the cell plate electrode CP is set higher than the power-source voltage VDD in reading data, thereby increasing the voltage placed between the electrodes of the memory cell capacitor, the amount of read charge, and the difference between the amount of charge for reading "H" data and that for reading "L" data, which enables stable operation with low voltage. Specifically, the difference between the amount of charge for reading "H" data and that for reading "L" data is represented by QS in FIG. 24 of the first embodiment, while it is represented by QS24 in the present embodiment, so that an increase of about 20% has been achieved.

(Ninth Embodiment)

Figure 25:
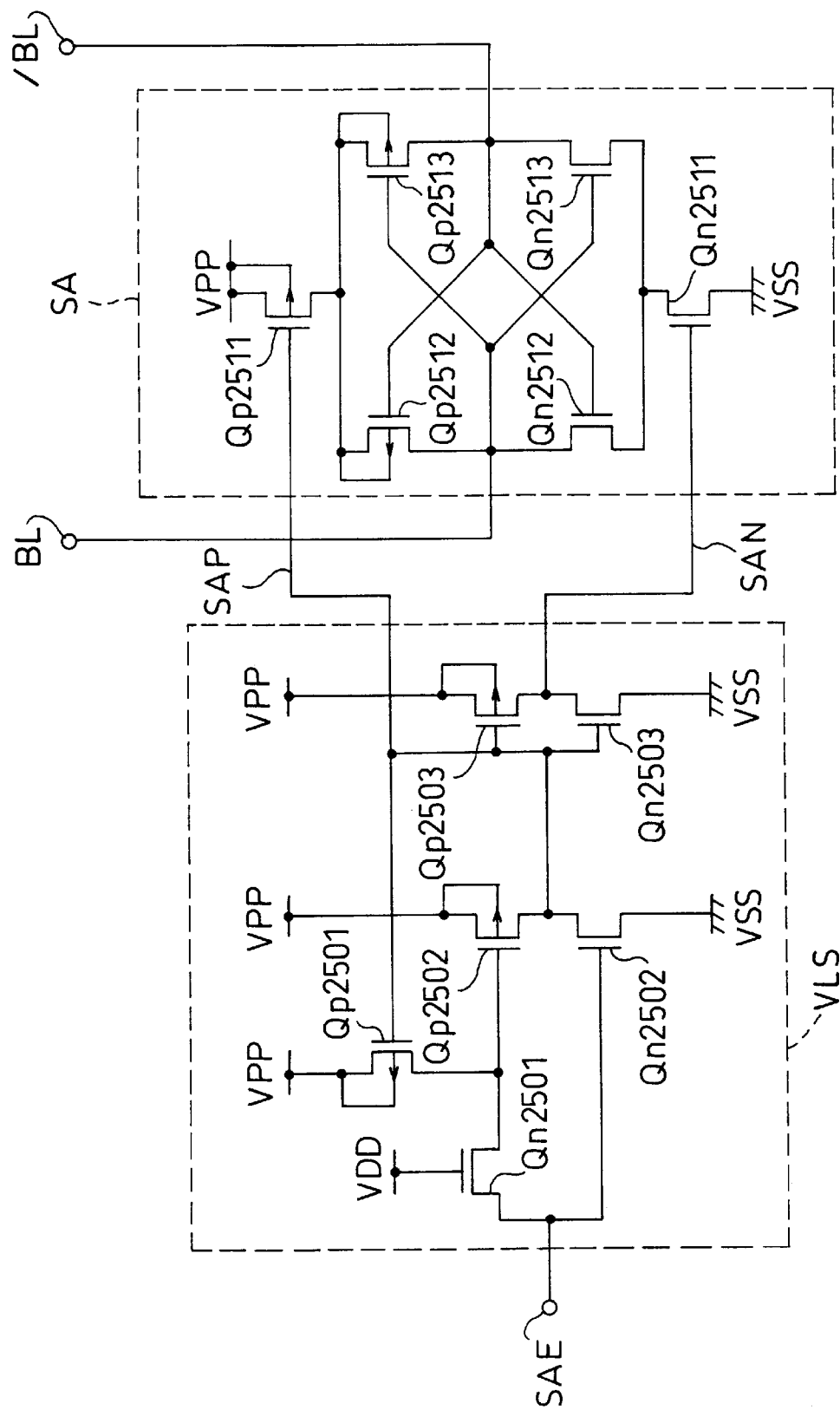
FIG. 25 is a circuit diagram showing the structures of a sense amplifier and of its driving circuit in a ferroelectric memory according to a ninth embodiment of the present invention.
Figure 26:
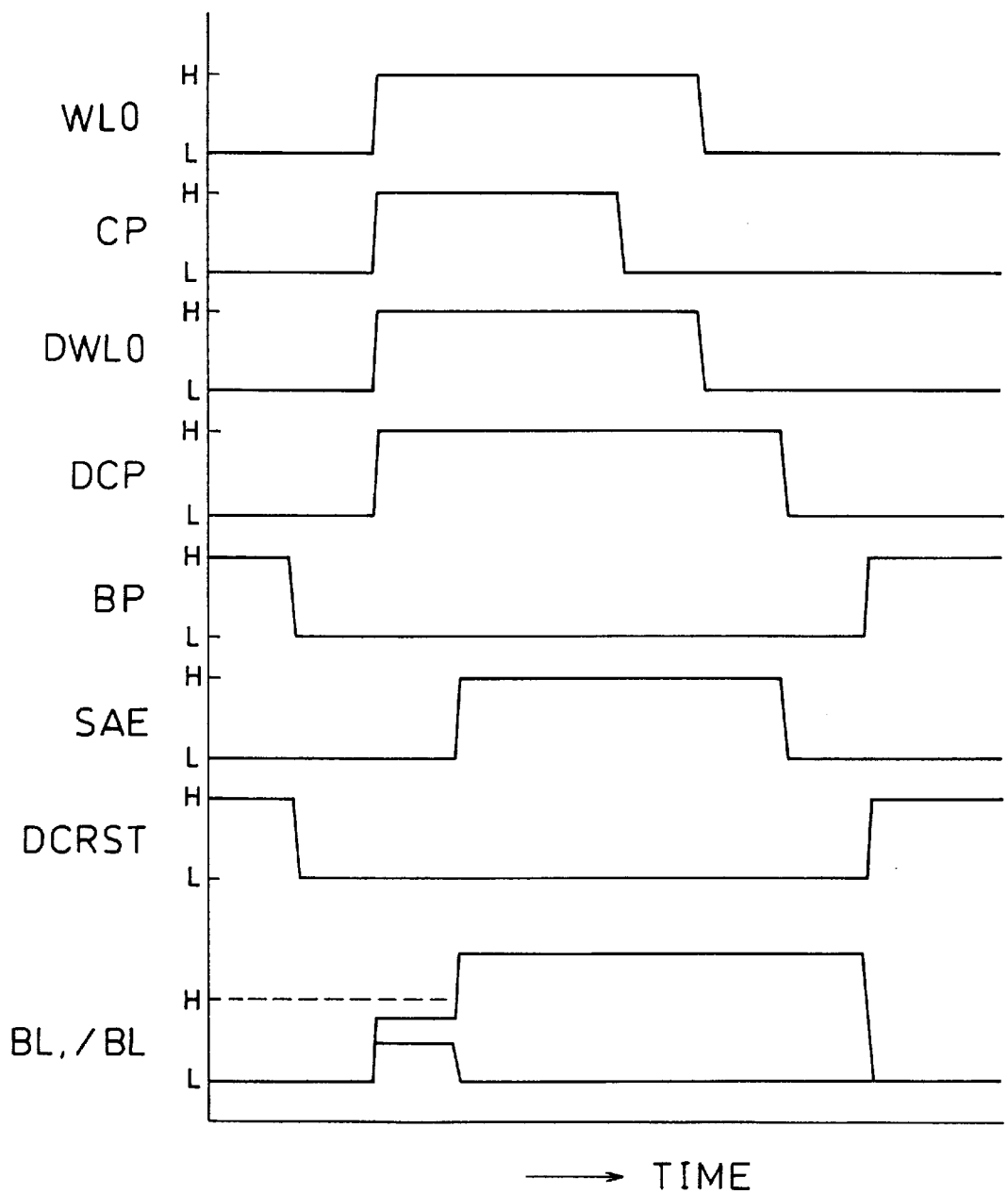
FIG. 26 is a timing chart showing the operation of the ferroelectric memory according to the ninth embodiment of the present invention.
Figure 27:
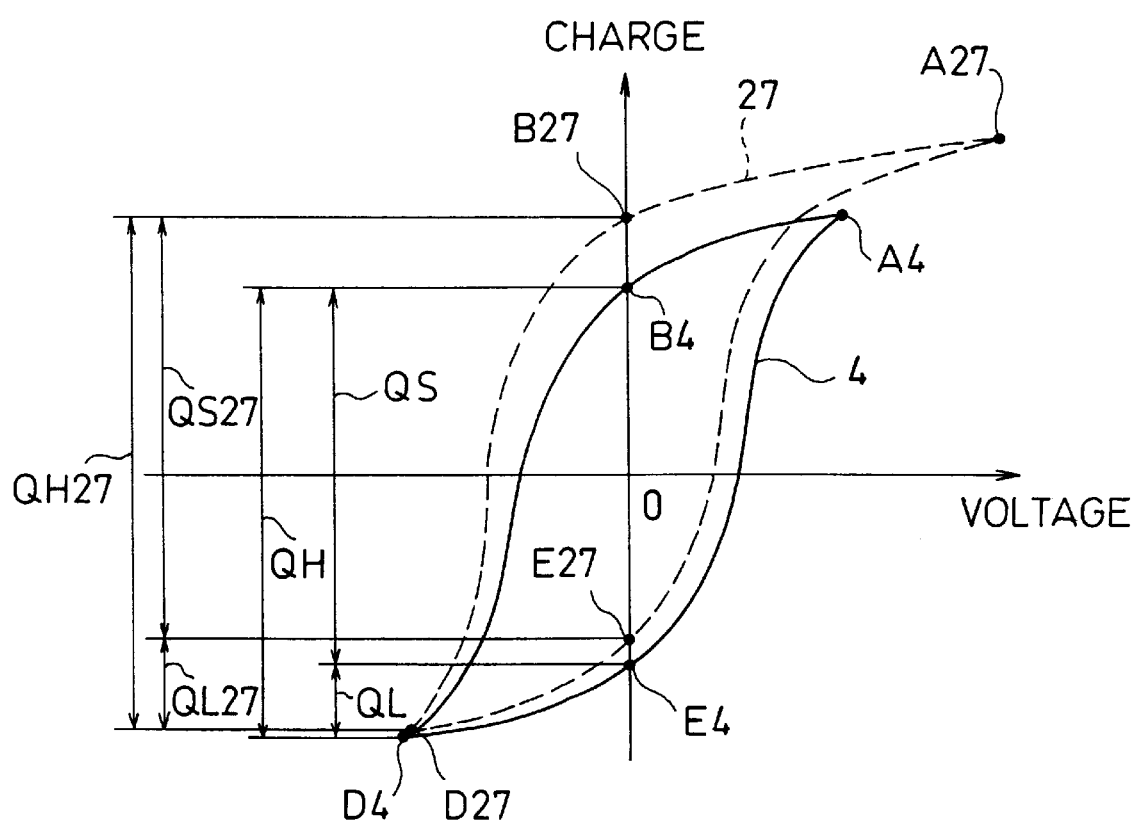
FIG. 27 is a view showing the hysteresis property of a main memory cell capacitor in the ferroelectric memory according to the ninth embodiment of the present invention.

In a ninth embodiment, an increased amount of charge can be read in reading data from the main memory cell, similarly to the seventh embodiment. In the ninth embodiment, the voltage of the bit line which is set at a logic voltage "H" in restoring data is set higher in level than the power-source voltage VDD, so that the voltage replaced between the electrodes of the main memory cell capacitor is increased, thereby increasing the amount of charge retained. The circuit diagram showing the overall structure of the present embodiment is the same as that of FIG. 1 used in the first embodiment. In order to increase the amount of charge retained in restoring data, the sense amplifier SA is supplied with a power-source voltage from a power source VPP, which is higher in level than the power-source voltage VDD. FIG. 25 is a circuit diagram wherein the sense amplifier SA is supplied with a higher-level power-source voltage from the power source VPP. FIG. 26 is a timing chart showing the operation of the present embodiment. In FIG. 27, the curve 4 represents the hysteresis property of the ferroelectric capacitor of the main memory cell in the first embodiment and the curve 27 represents the hysteresis property of the ferroelectric capacitor of the main memory cell in the present embodiment.

In the drawings are shown: the word lines WL0 to WL255; the dummy word lines DWL0 and DWL1; the bit lines BL and /BL; the cell plate electrode CP; the dummy cell plate electrode DCP; the bit-line precharge control signal BP; the control signal DCRST for initializing data in dummy memory cell; the sense amplifier control signal SAE; the control signal S1; node names N1401 to N1403, SAP, and SAN; the power-source voltage VDD; the ground voltage VSS; the sense amplifier SA; the main memory cell capacitors C0 to C255; the dummy memory cell capacitors DC0 and DC1; the capacitor C1401; n-channel MOS transistors Qn0 to Qn2513, QnD0, QnD1, QnBP0, QnBP1, QnR0, and QnR1; p-channel transistors Qp2501 to Qp2513; a voltage level shifter VLS; a power source VPP; the amount of charge QL for reading "L" data from main memory cell in the first embodiment; the amount of charge QH for reading "H" data from main memory cell in the first embodiment; the difference QS between the amount of charge QL for reading "L" data from main memory cell and the amount of charge QH for reading "H" data from main memory cell in the first embodiment; the amount of charge QL27 for reading "L" data from main memory cell in the present embodiment; the amount of charge QH27 for reading "H" data from main memory cell in the present embodiment; and the difference QS27 between the amount of charge QL27 for reading "L" data from main memory cell and the amount of charge QH27 for reading "H" data from main memory cell in the present embodiment.

The circuit diagram showing the overall structure of the present embodiment is the same as that of FIG. 1 used in the first embodiment. A brief description will be given first to the circuit diagram wherein the sense amplifier SA is supplied with a higher-level power-source voltage from the power source VPP. The circuit consists of: the voltage level shifter VLS for receiving the sense amplifier control signal SAE, the input voltage of which is equal in level to the power-source voltage VDD and outputting the signals SAP and SAN, the output voltage of each of which is equal in level to the power-source voltage VCC; and the sense amplifier SA which is controlled by the signals SAP and SAN and uses the power source VPP. The logic voltages of the signals SAN and SAE have the same phase, while the logic voltages of the signals SAP and SAE have the opposite phases, so that the sense amplifier SA operates when the signal SAE is at a logic voltage "H."

Next, a description will be given to the operation of the ferroelectric memory with reference to the timing chart of FIG. 26 and to the hysteresis property of the ferroelectric capacitor of the main memory cell of FIG. 27. In FIG. 27 showing the hysteresis property of the ferroelectric capacitor, the abscissa represents the electric field applied to the memory cell capacitor and the ordinate represents the charge resulting from the electric field. The timing for operation of FIG. 26 is substantially the same as that of FIG. 2 used in the first embodiment. However, the present embodiment is characterized in that the logic voltage "H" of the bit lines BL and /BL is higher in level than the power-source voltage VDD. In FIG. 27, the curve 27 represents the hysteresis property of the ferroelectric capacitor of the main memory cell. In the ferroelectric capacitor, a polarization remains even at zero electric field as indicated by the point B27 or E27. To read data from the main memory cell, the control signal DCRST for initializing data in dummy memory cell is initially set at a logic voltage "H," so as to provide an initial state wherein no voltage is applied to the dummy memory cell. The bit-line precharge control signal BP is set at a logic voltage "H," thereby setting the bit lines BL and /BL at a logic voltage "L." The word lines WL0 to WL255, dummy word lines DWL0 and DWL1, cell plate electrode CP, and dummy cell plate electrode DCP are set at the ground voltage VSS, which is a logic voltage "L." Then, the control signal DCRST for initializing data in dummy memory cell is set at a logic voltage "L," thereby bringing the first electrode of the dummy memory cell into a floating state, and the bit-line precharge control signal BP is set at a logic voltage "L," thereby bringing the bit lines BL and /BL into a floating state. After that, the word line WL0, dummy word line DWL0, cell plate electrode CP, and dummy cell plate electrode DCP are set at a logic voltage "H," so that the data in the main memory cell is read onto the bit line BL and that the data in the dummy memory cell is read onto the bit line /BL. In this case, if the data is "H," the state of the main memory cell makes a transition from the point B27 to the point D27 in FIG. 27, so that the charge QH is read onto the bit line BL. If the data is "L," the state of the main memory cell makes a transition from the point E27 to the point D27 in FIG. 27, so that the charge QL is read onto the bit line BL. The dummy memory cell is designed so that a charge (QH27+QL27)/2 is read therefrom, similarly to the first embodiment. Subsequently, the sense amplifier control signal SAE is set at a logic voltage "H" so as to operate the sense amplifier SA. Here, since a voltage with which the sense amplifier SA is supplied from the power source VPP is higher in level than the power-source voltage VDD, the voltage of the bit line which is set at a logic voltage "H" when the sense amplifier SA operates becomes equal to VPP in level. In this case, if the data is "H," the state of the main memory cell makes a transition from the point D27 to the point E27 in FIG. 27, while the dummy memory cell remains in the state at the point D27 in FIG. 27. If the data is "L," the main memory cell remains in the state at the point D27 in FIG. 27, while the state of the dummy memory cell makes a transition from the point D27 to the point B27 in FIG. 27. Then, the cell plate electrode CP is set at a logic voltage "L," so as to restore data to the main memory cell. In this case, if the data is "H," the state of the main memory cell makes a transition from the point E27 to the point A27 in FIG. 27. If the data is "L," the state of the main memory cell makes a transition from the point D27 to the point E27 in FIG. 27. After that, the word line WL0 and dummy word line DWL0 are set at a logic voltage "L," so that the main memory cell capacitor and the dummy memory cell capacitor carry no voltage. Subsequently, the dummy cell plate electrode DCP is set at a logic voltage "L," while the sense amplifier control signal SAE is set at a logic voltage "L," thereby halting the operation of the sense amplifier SA. Thereafter, the control signal DCRST for initializing data in dummy memory cell is set at a logic voltage "H," thereby bringing the dummy memory cell into the initial state. On the other hand, bit-line precharge control signal BP is set at a logic voltage "H," thereby setting the bit lines BL and /BL at a logic voltage "L," which is the initial state.

The ninth embodiment is characterized in that, in the operation of the main memory cell capacitor, the voltage of the bit line which is set at a logic voltage "H" in restoring data is set higher in level than the power-source voltage VDD, thereby increasing the voltage placed between the electrodes of the main memory cell capacitor, the amount of read charge, and the difference between the amount of charge for reading "H" data and that for reading "L" data, which enables stable operation with lower voltage. Specifically, the difference between the amount of charge for reading "H" data and that for reading "L" data is represented by QS in FIG. 27 of the first embodiment, while it is represented by QS27 in the present embodiment, so that an increase of about 20% has been achieved.

(Tenth Embodiment)

Figure 28:
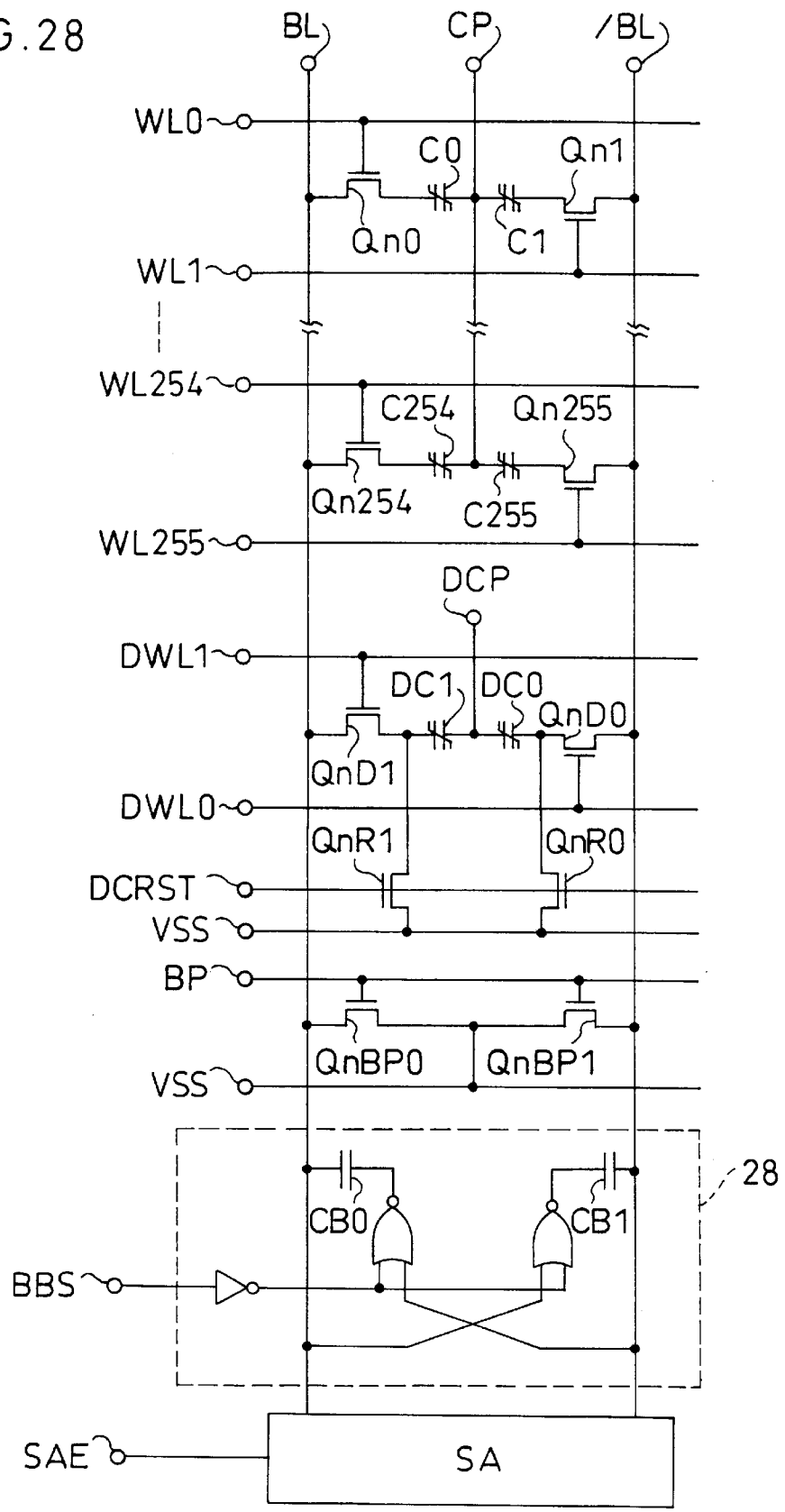
FIG. 28 is a circuit diagram showing the structure of a ferroelectric memory according to a tenth embodiment of the present invention.
Figure 29:
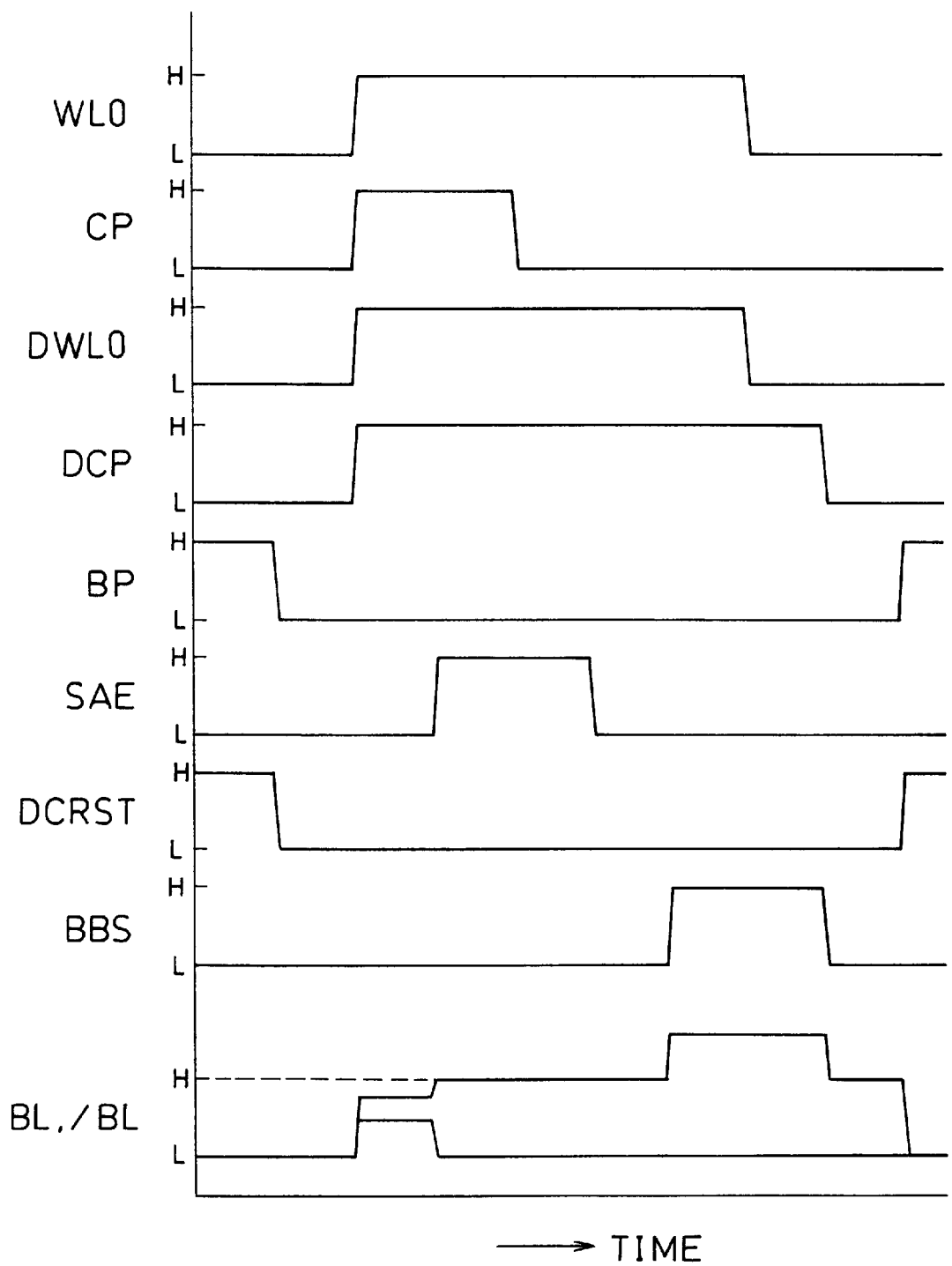
FIG. 29 is a timing chart showing the operation of the ferroelectric memory according to the tenth embodiment of the present invention.

In a tenth embodiment, an increased amount of charge can be read in reading data from the main memory cell, similarly to the ninth embodiment. In the tenth embodiment, the voltage of the bit line which is set at a logic voltage "H" in restoring data is set higher in level than the power-source voltage VDD, so that the voltage replaced between the electrodes of the main memory cell capacitor is increased, thereby increasing the amount of charge retained. FIG. 28 is the circuit diagram showing the overall structure of the present embodiment. In order to increase the amount of charge retained in restoring data, the voltage of the bit line which is set at a logic voltage "H" after the sense amplifier was operated is set higher in level than the power-source voltage VDD. Although the sense amplifier SA in the circuit diagram of FIG. 28 is identical with the sense amplifier SA shown in FIG. 25 of the ninth embodiment, it does not necessarily use the power source VPP. FIG. 29 is a timing chart showing the operation of the present embodiment. The hysteresis property of the ferroelectric capacitor is the same as that of FIG. 27 used in the ninth embodiment. In FIG. 27, the curve 4 represents the hysteresis property of the ferroelectric capacitor of the main memory cell in the first embodiment and the curve 27 represents the hysteresis property of the ferroelectric capacitor of the main memory cell in the present embodiment.

A description will be given only to additional reference numerals which newly appear in the present embodiment. There are shown: a bit-line-voltage increasing circuit 28; a signal BBS for controlling increase in bit-line voltage; and capacitors CB0 to CB1 for increasing bit-line voltage.

A description will be given to the operation of the ferroelectric memory with reference to the timing chart of FIG. 29 and to the hysteresis property of the ferroelectric capacitor of the main memory cell shown in FIG. 27. In FIG. 27 showing the hysteresis property of the ferroelectric capacitor of the main memory cell, the abscissa represents the electric field applied to the memory cell capacitor and the ordinate represents the charge resulting from the electric field. The timing for operation of FIG. 29 is substantially the same as that of FIG. 2 used in the first embodiment. However, the present embodiment is characterized in that, when the signal BBS for controlling increase in bit-line voltage is set at a logic voltage "H," the voltage of either of the bit lines BL and /BL that has been set at a logic voltage "H" is increased till it becomes higher in level than the power-source voltage VDD. In FIG. 27, the curve 27 shows the hysteresis property of the ferroelectric capacitor of the main memory cell. In the ferroelectric capacitor, a polarization remains even at zero electric field as indicated by the point B27 or E27. To read data from the main memory cell, the control signal DCRST for initializing data in dummy memory cell is initially set to a logic voltage "H," so as to provide an initial state wherein no voltage is applied to the dummy memory cell. The bit-line precharge control signal BP is set at a logic voltage "H," thereby setting the bit lines BL and /BL at a logic voltage "L." The signal BBS for controlling increase in bit-line voltage is at a logic voltage "L." The word lines WL0 to WL255, dummy word lines DWL0 and DWL1, cell plate electrode CP, and dummy cell plate electrode DCP are set at the ground voltage VSS, which is a logic voltage "L." After that, the control signal DCRST for initializing data in dummy memory cell is set at a logic voltage "L," thereby bringing the first electrode of the dummy memory cell into a floating state, and the bit-line precharge control signal BP is set at a logic voltage "L," thereby bringing the bit lines BL and /BL into a floating state. Subsequently, the word line WL0, dummy word line DWL0, cell plate electrode CP, and dummy cell plate electrode DCP are set at a logic voltage "H," so that the data in the main memory cell is read onto the bit line BL and that the data in the dummy memory cell is read onto the bit line /BL. In this case, if the data is "H," the state of the main memory cell makes a transition from the point B27 to the point D27 in FIG. 27, so that the charge QH is read onto the bit line BL. If the data is "L," the state of the main memory cell makes a transition from the point E27 to the point D27 in FIG. 27, so that the charge QL is read onto the bit line BL. The dummy memory cell is designed so that the charge (QH27+QL27)/2 is read therefrom, similarly to the first embodiment. Thereafter, the sense amplifier control signal SAE is set at a logic voltage "H" so as to operate the sense amplifier SA, thereby setting the bit lines BL and /BL at a logic voltage "L" and at a logic voltage "H," respectively. Subsequently, the cell plate electrode CP is set to a logic voltage "L," thereby restoring data to the main memory cell. Then, the sense amplifier control signal SAE is set at a logic voltage "L," thereby halting the operation of the sense amplifier SA and bringing the bit lines BL and /BL into a floating state. Next, the signal BBS for controlling increase in bit-line voltage is set at a logic voltage "H," so as to increase the voltage of the bit line that has been set at a logic voltage "H." In this case, if the data is "H," the state of the main memory cell makes a transition from the point E27 to the point A27 in FIG. 27. If the data is "L," the state of the main memory cell makes a transition from the point D27 to the point E27 in FIG. 27. After that, the word line WL0 and the dummy word line DWL0 are set at a logic voltage "L," so that the main memory cell capacitor and the dummy memory cell capacitor carry no voltage. Subsequently, the dummy cell plate electrode DCP and the signal BBS for controlling increase in bit-line voltage are also set at a logic voltage "L." Then, the control signal DCRST for initializing data in dummy memory cell is set at a logic voltage "H," thereby bringing the dummy memory cell into the initial state. On the other hand, the bit-line precharge control signal BP is set at a logic voltage "H," thereby setting the bit lines BL and /BL at a logic voltage "L", which is the initial state.

The tenth embodiment is characterized in that, in the operation of the main memory cell capacitor, the voltage of the bit line which is set at a logic voltage "H" in restoring data is set higher in level than the power-source voltage VDD, thereby increasing the voltage placed between the electrodes of the main memory cell capacitor, the amount of read charge, and the difference between the amount of charge for reading "H" data and that for reading "L" data, which enables stable operation with low voltage. Specifically, the difference between the amount of charge for reading "H" data and that for reading "L" data is represented by QS in FIG. 27 of the first embodiment, while it is represented by QS27 in the present embodiment, so that an increase of about 20% has been achieved. The tenth embodiment is simpler in circuit structure than the ninth embodiment, since it does not particularly require the provision of the power source VPP.

(Eleventh Embodiment)

Figure 30:
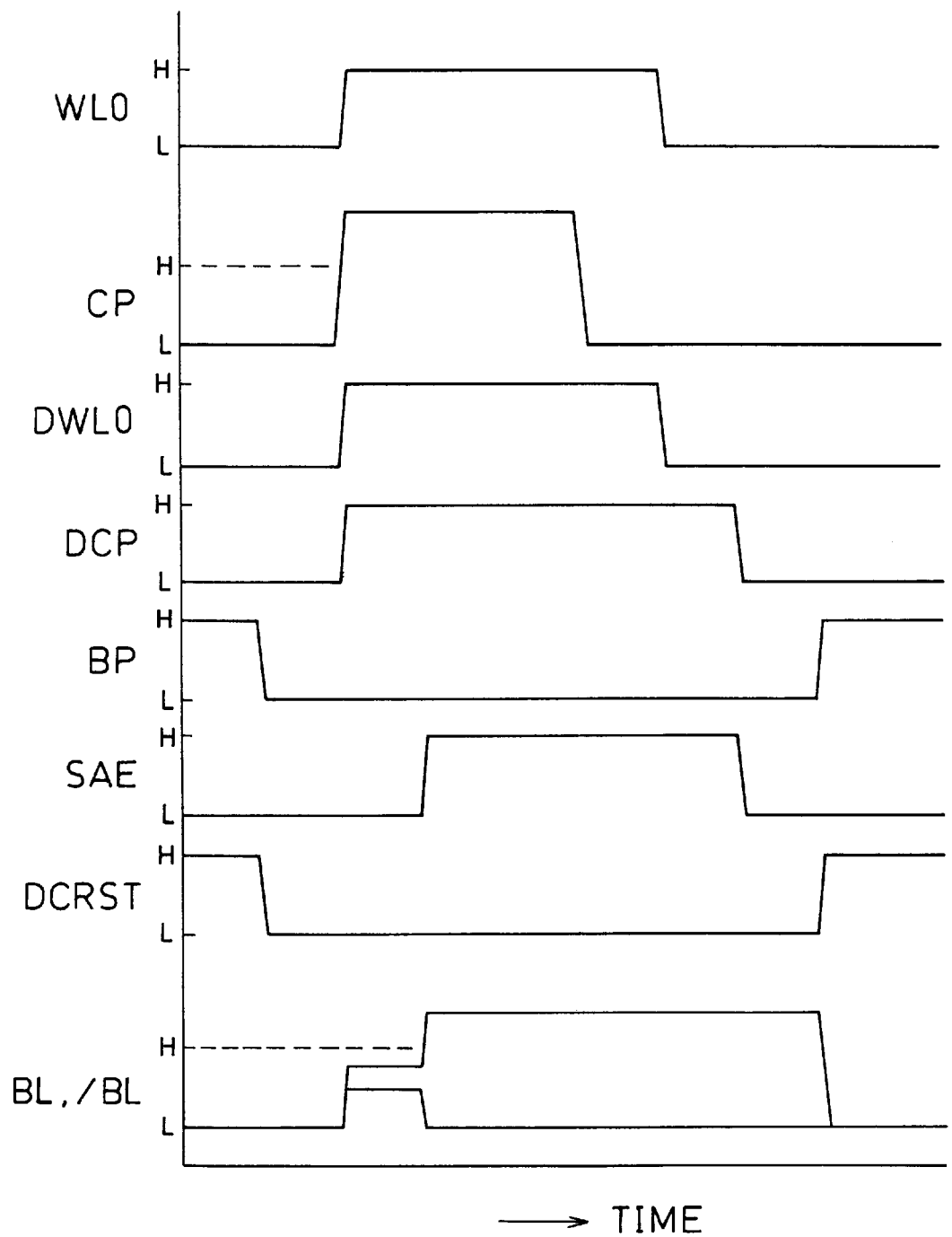
FIG. 30 is a timing chart showing the operation of a ferroelectric memory according to an eleventh embodiment of the present invention.
Figure 31:
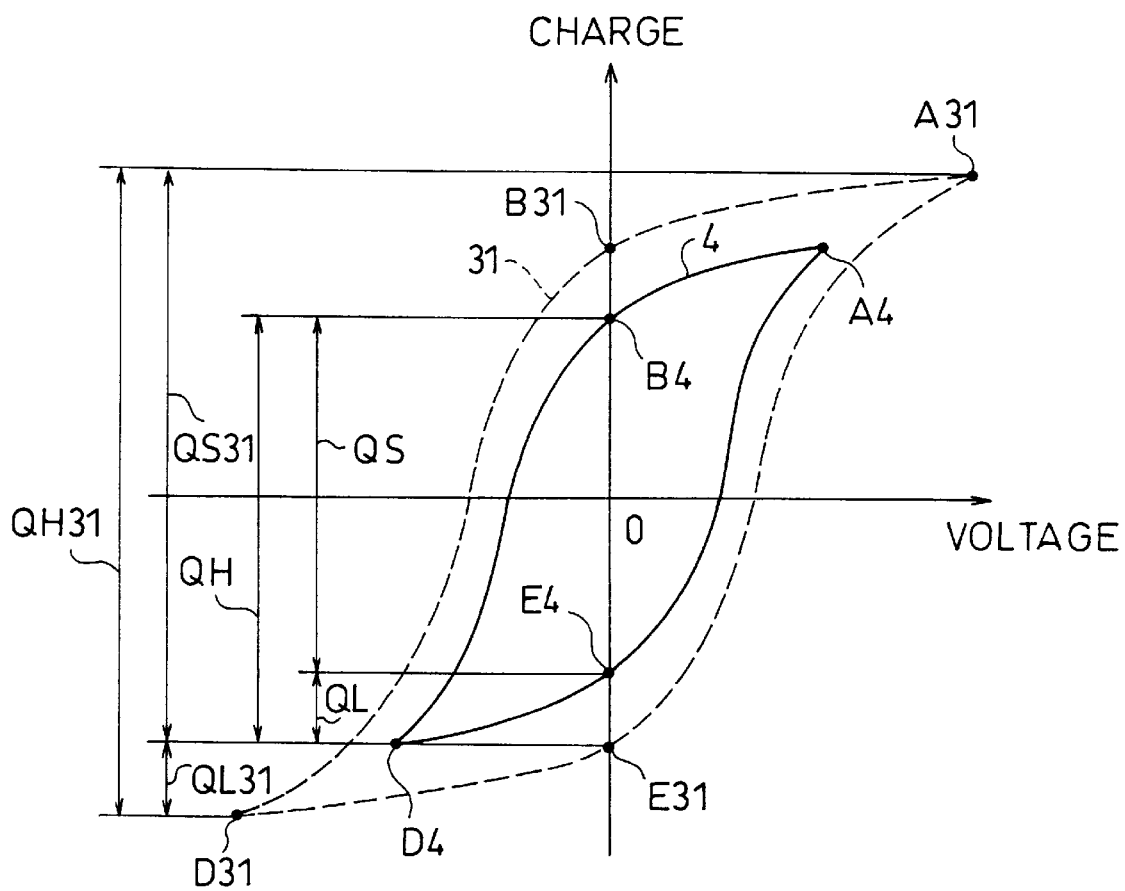
FIG. 31 is a view showing the hysteresis property of a main memory cell capacitor in the ferroelectric memory according to the eleventh embodiment of the present invention.

An eleventh embodiment is a combination of the seventh and ninth embodiments. In order to read an increased amount of charge in reading data from the main memory cell, the voltage of the cell plate electrode CP is set higher than the power-source voltage VDD in reading data, thereby increasing the voltage placed between the electrodes of the main memory cell capacitor and the amount of read charge, while the voltage of the bit line which is set at a logic voltage "H" in restoring data is set higher than the power-source voltage VDD, thereby increasing the voltage placed between the electrodes of the main memory cell capacitor and the amount of charge retained. The circuit diagram showing the overall structure of the present embodiment is the same as that of FIG. 1 used in the first embodiment. FIG. 17 shows the circuit for setting the voltage of the cell plate electrode CP higher than the power-source voltage VDD. FIG. 25 shows the sense amplifier circuit for setting the voltage of the bit line, which is set at a logic voltage "H" in restoring data, higher in level than the power-source voltage VDD. FIG. 30 is a timing chart showing the operation of the present embodiment. FIG. 31 shows the hysteresis property of the ferroelectric capacitor, in which the curve 4 presents the hysteresis property of the ferroelectric capacitor of the main memory cell in the first embodiment and the 31 shows the hysteresis property of the ferroelectric capacitor of the main memory cell in the present embodiment.

A description will be given to the operation of the circuit in the ferroelectric memory with reference to the timing chart of FIG. 30 and to the hysteresis property of the ferroelectric capacitor of the ferroelectric capacitor of the main memory cell shown in FIG. 31. To read data from the main memory cell, the control signal DCRST for initializing data in dummy memory cell is initially set at a logic voltage "H," so as to provide an initial state wherein no voltage is applied to the dummy memory cell. The bit-line precharge control signal BP is set at a logic voltage "H," thereby setting the bit lines BL and /BL at a logic voltage "L." The word lines WL0 to WL255, dummy word lines DWL0 and DWL1, cell plate electrode CP, dummy cell plate electrode DCP are set at the ground voltage VSS, which is a logic voltage "L." Next, the control signal DCRST for initializing data in dummy memory cell is set at a logic voltage "L," thereby bringing the first electrode of the dummy memory cell into a floating state, and the bit-line precharge control signal BP is set at a logic voltage "L," thereby bringing the bit lines BL and /BL into a floating state. Then, the word line WL0, dummy word line DWL0, cell plate electrode CP, and dummy cell plate electrode DCP are set at a logic voltage "H," so that the data in the main memory cell is read onto the bit line BL and that the data in the dummy memory cell is read onto the bit line /BL. Here, the logic voltage "H" of the cell plate electrode CP is higher than the power-source voltage VDD. In this case, if the data is "H," the state of the main memory cell makes a transition from the point B31 to the point D31 in FIG. 31, so that the charge QH is read onto the bit line BL. If the data is "L," the state of the main memory cell makes a transition from the point E31 to the point D31, so that the charge QL is read onto the bit line BL. The dummy memory cell is designed so that a charge (QH31+QL31)/2 is read therefrom, similarly to the first embodiment. After that, the sense amplifier control signal SAE is set at a logic voltage "H" so as to operate the sense amplifier SA. Here, a power-supply voltage with which the sense amplifier SA is supplied is higher in level than the power-supply voltage VDD. In this case, if the data is "H," the state of the main memory cell makes a transition from the point D31 to the point E31 in FIG. 31, while the dummy memory cell remains in the state at the point D31 in FIG. 31. If the data is "L," the main memory cell remains in the state at the point D31 in FIG. 31, while the state of the dummy memory cell makes a transition from the point D31 to the point B31 in FIG. 31. Subsequently, the cell plate electrode CP. is set at a logic voltage "L," so as to restore data to the main memory cell. In this case, if the data is "H," the state of the main memory cell makes a transition from the point E31 to the point A31 in FIG. 31. If the data is "L," the state of the main memory cell makes a transition from the point D31 to the point E31 in FIG. 31. Thereafter, the word line WL0 and the dummy word line DWL0 are set at a logic voltage "L," so that the main memory cell capacitor and dummy memory cell capacitor carry no voltage. Then, the dummy cell plate electrode DCP and the sense amplifier control signal SAE are also set at a logic voltage "L," thereby halting the operation of the sense amplifier SA. Next, the control signal DCRST for initializing data in dummy memory cell is set at a logic voltage "H," so as to bring the dummy memory cell into the initial state. On the other hand, the bit-line precharge control signal BP is set at a logic voltage "H," thereby setting the bit lines BL and /BL at a logic voltage "L," which is the initial state.

The eleventh embodiment is characterized in that, in the operation of the main memory cell capacitor, an increased amount of charge is read in reading data, while an increased amount of charge is retained in restoring data, thereby increasing the difference between the amount of charge for reading data "H" data and that for reading "L" data, which enables stable operation with lower voltage. Specifically, the difference between the amount of charge for reading "H" data and that for reading "L" data is represented by QS in FIG. 31 of the first embodiment, while it is represented by QS31 in the present embodiment, so that an increase of about 60% has been achieved. The eleventh embodiment provides a greater effect by combining the seventh embodiment with the ninth embodiment.

(Twelfth Embodiment)

In a twelfth embodiment, the word line of the main memory cell is set at a logic voltage "H" and then brought into a floating state so that, when the cell plate electrode CP is set at a logic voltage "H" or when the sense amplifier SA is operated to set a bit line having "H" data at a logic voltage "H", the voltage of the word line is increased by the voltage of the above cell plate electrode and by the capacitances of the above bit line and word line.

Figure 32:
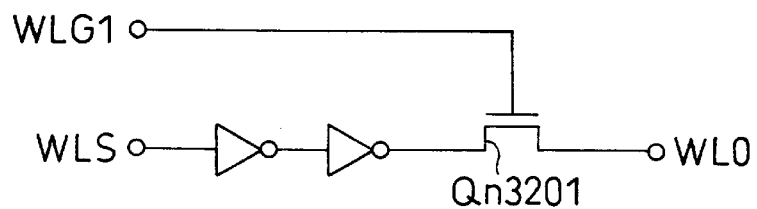
FIG. 32 is a diagram showing the structure of a word-line driving circuit in a ferroelectric memory according to a twelfth embodiment of the present invention.
Figure 33:
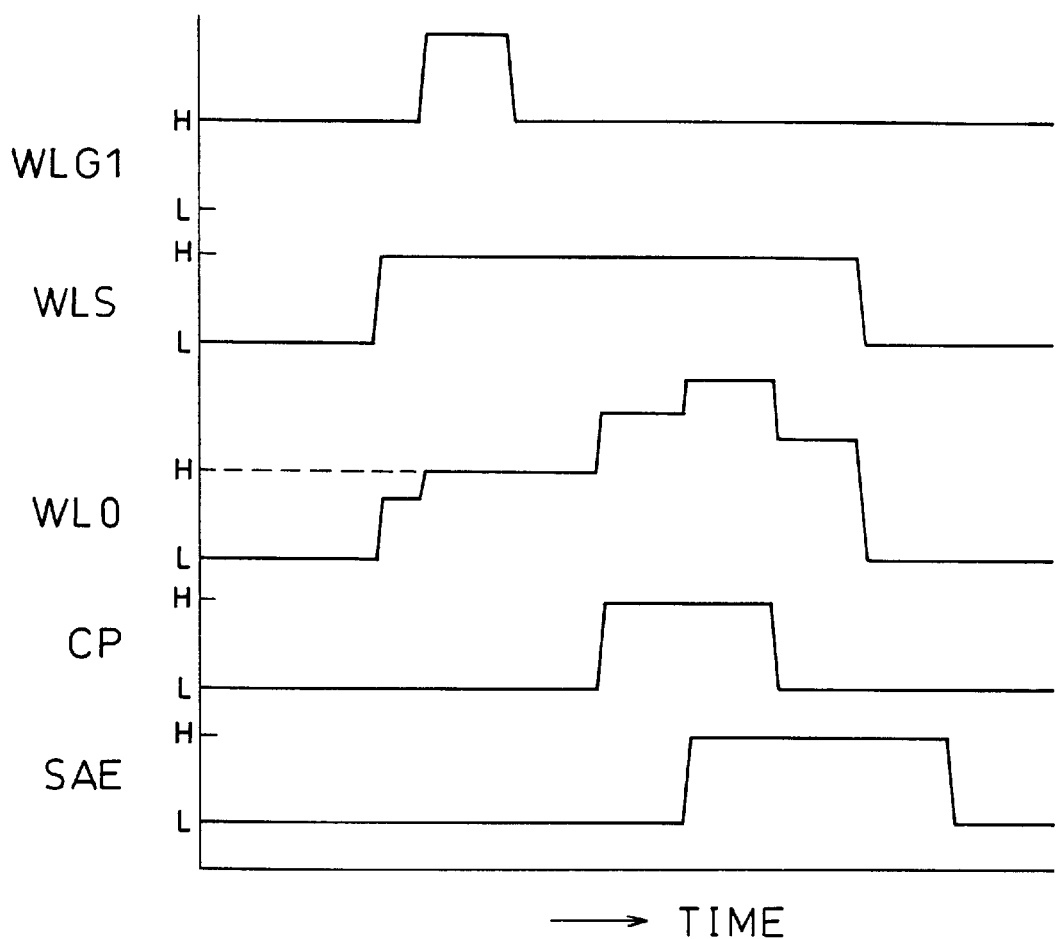
FIG. 33 is a timing chart showing the operation of the ferroelectric memory according to the twelfth embodiment of the present invention.

The circuit diagram showing the overall structure of the present embodiment is the same as that of FIG. 1 used in the first embodiment. FIG. 32 shows a word-line driving circuit of the twelfth embodiment. FIG. 33 is a timing chart showing the operation of the present embodiment. In the drawings are shown: the word line WL0; the cell plate electrode CP; the sense amplifier control signal SAE; control signals WLG1 and WLS; and an n-channel MOS transistor Qn3201. In the word-line driving circuit, the transistor Qn3201 has the drain connected to the word line, has the source connected to a signal having the same phase as the control signal WLS, and has the gate electrode connected to the control signal WLG1.

A brief description will be given to the operation of the word-line driving circuit of the twelfth embodiment. In an initial state, the control signal WLS and sense amplifier control signal SAE are at a logic voltage "L," the control signal WLG1 is at a logic voltage "H," and the word line WL0 and cell plate electrode CP are at a logic voltage "L." Then, the control signal WLS is set at a logic voltage "H." After that, the control signal WLG1 is set at a higher-level logic voltage "H" and then restored to the original logic voltage "H," which is the same in level as the logic voltage "H" of the control signal WLS. Meanwhile, the word line WL0 is at a logic voltage "H," which is the same in level as the logic voltage "H" of the control signal WLS and the transistor Qn 3201 is in a floating state since it has been turned off. Next, the cell plate electrode CP is set at a logic voltage "H," with the result that the logic voltage "H" of the word line WL0 is further increased in level by the capacitive coupling via the capacitor, since the main memory cell capacitor composed of a ferroelectric film is connected between the cell plate electrode CP and the word line WL0 via the memory cell transistor. Subsequently, the sense amplifier control signal SAE is set at a logic voltage "H" so as to operate the sense amplifier SA. In this case, if the bit line is at a logic voltage "H," the logic voltage "H" of the word line WL0 is further increased in level. Thereafter, the cell plate electrode CP is set at a logic voltage "L" so as to restore data to the main memory cell capacitor. In this case, although the logic voltage "H" of the word line WL0 is reduced in level due to the same capacitive coupling, the resulting logic voltage "H" is higher in level than the original logic voltage "H." Since the logic voltage "H" of the word line WL0 thus obtained is sufficiently high in level, a voltage reduction (Vt reduction) due to the threshold voltage of the memory cell transistor does not occur. As a result, a sufficiently high voltage is placed between the electrodes of the main memory cell capacitor, so that restoration of data to the main memory cell capacitor can be performed satisfactorily. After that, the control signal WLS is set at a logic voltage "L," thereby setting the word line WL0 at a logic voltage "L" and setting the sense amplifier control signal SAE at a logic voltage "L," resulting in the initial state.

(Thirteenth Embodiment)

In a thirteenth embodiment, the word line of the main memory cell is set at a logic voltage "H" and then brought into a floating state so that, when the cell plate electrode CP is set at a logic voltage "H" or when the sense amplifier SA is operated to set the bit line having "H" data at a logic voltage "H", the voltage of the word line is increased by the voltage of the above cell plate electrode and by the capacitances of the above bit line and word line, similarly to the twelfth embodiment. The thirteenth embodiment is different from the twelfth embodiment in that the initial logic voltage "H" of the word line has preliminarily been set sufficiently high in level.

Figure 34:
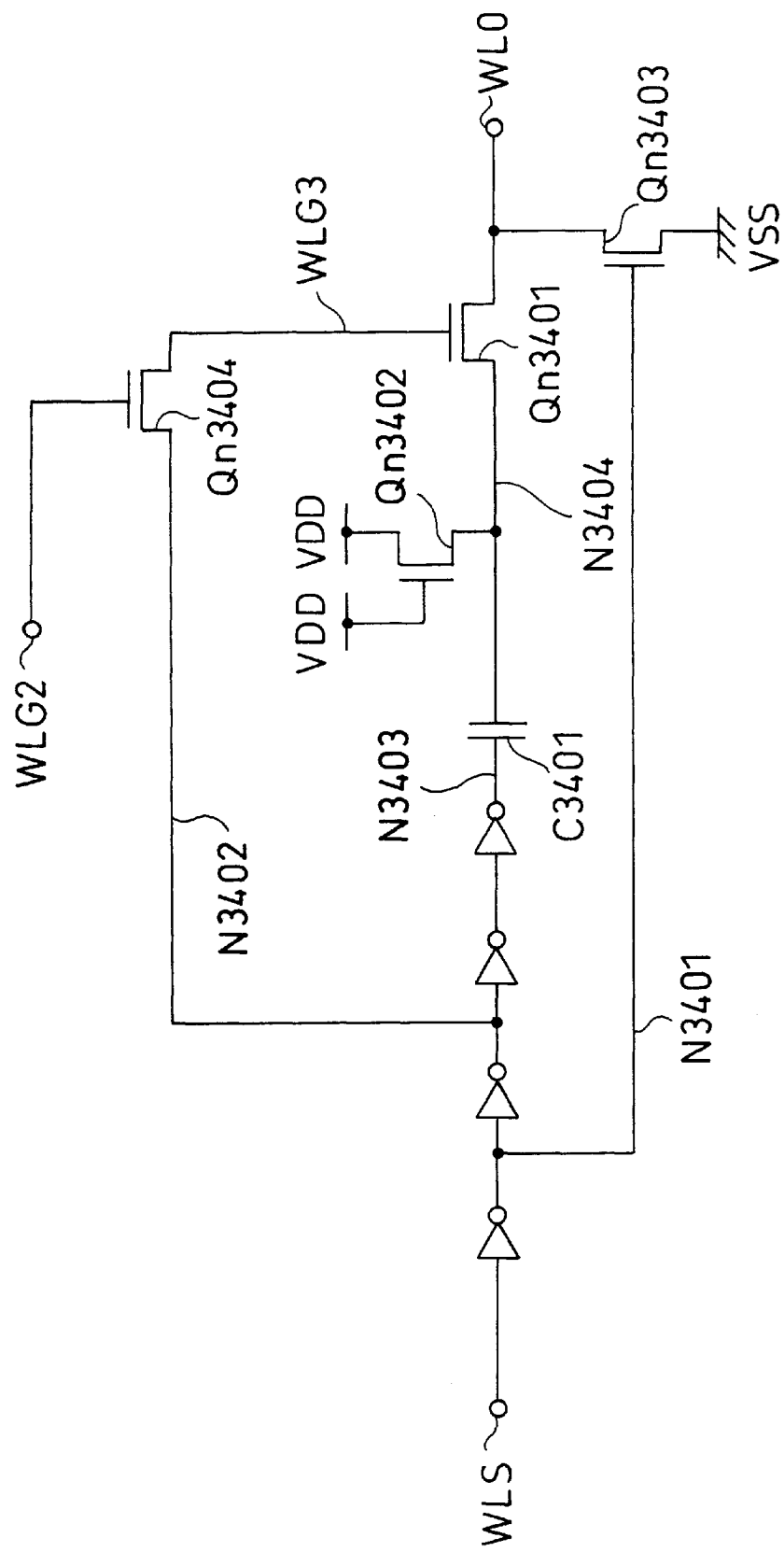
FIG. 34 is a diagram showing the structure of a word-line driving circuit in a ferroelectric memory according to a thirteenth embodiment of the present invention.
Figure 35:
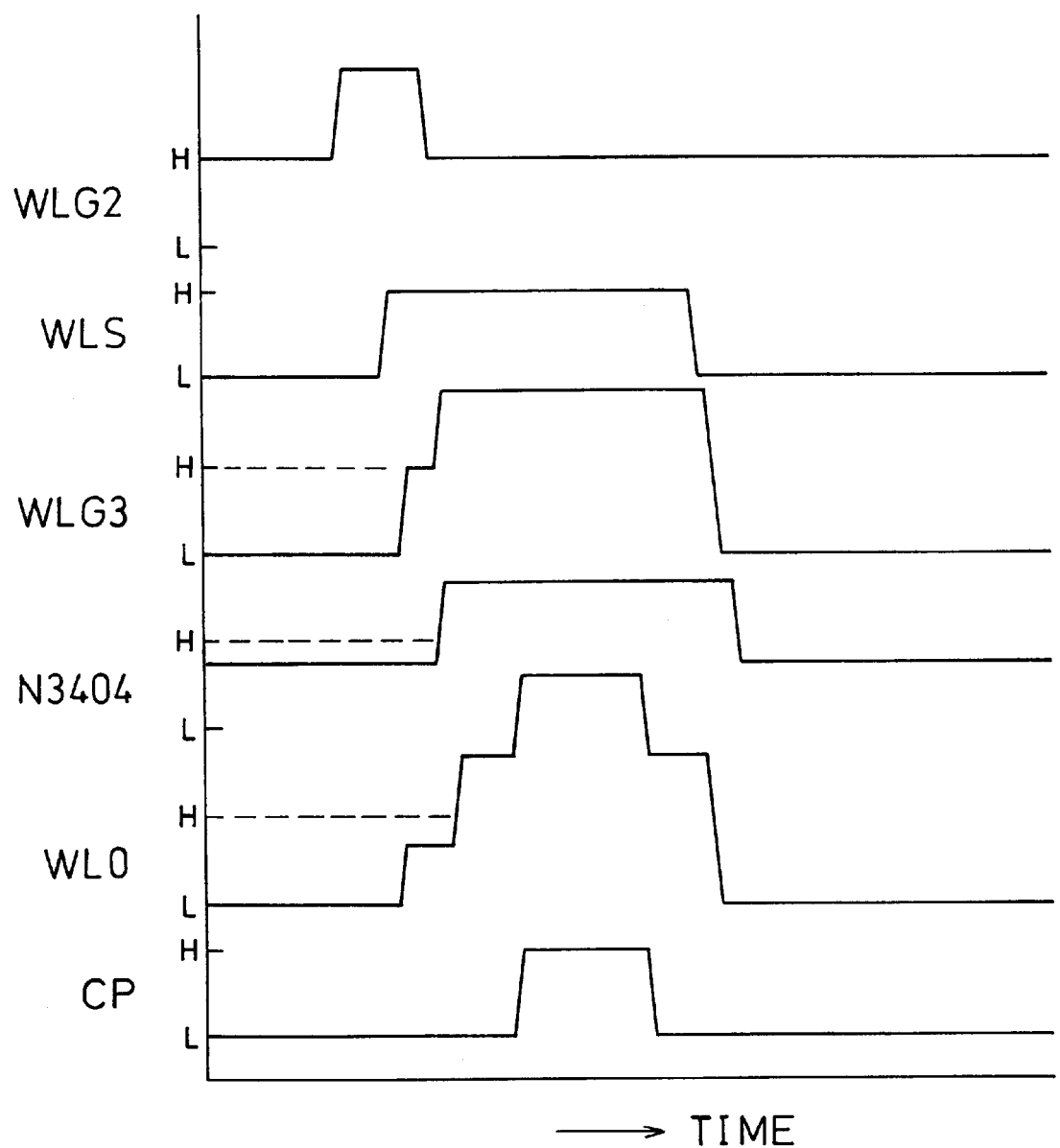
FIG. 35 is a timing chart showing the operation of the ferroelectric memory according to the thirteenth embodiment of the present invention.

The circuit diagram showing the overall structure of the present embodiment is the same as that of FIG. 1 used in the first embodiment. FIG. 34 shows a word-line driving circuit of the thirteenth embodiment. FIG. 35 is a timing chart showing the operation of the present embodiment. In the drawings are shown: the word line WL0; the cell plate electrode CP; the sense amplifier control signal SAE; control signals WLG2, WLG3, and WLS; and n-channel MOS transistors Qn3401 to Qn3404; a capacitor C3401; and node names N3401 to N3404. In the word-line driving circuit, a signal obtained by logically inverting the control signal WLS is designated as the node N3401, a signal obtained by logically inverting the node N3401 is designated as the node N3402, and the output from a two-stage inverter, which has the same phase as the node N3402, is designated as the node 3403. Between the nodes N3403 and N3404 is connected the capacitor C3401. Between the node N3404 and the word line WL0 is connected the transistor Qn3401. The gate electrode of the transistor Qn3401 corresponds to the control signal WLG3. Between the node N3402 and the control signal WLG3 is connected the transistor Qn3404. The gate electrode of the transistor Qn3404 corresponds to the control signal WLG2. Between the word line WL0 and the ground voltage VSS is connected the transistor Qn3403. The gate electrode of the transistor Qn3403 corresponds to the node N3401. Between the node N3404 and the power-source voltage VDD is connected the transistor Qn3402. The gate electrode of the transistor Qn3402 corresponds to the power-source voltage VDD.

A brief description will be given to the operation of the word-line driving circuit of the thirteenth embodiment. The operation of the thirteenth embodiment is substantially the same as that of the twelfth embodiment, except that the control signal WL2 of the thirteenth embodiment is operated with the timing of the control signal WLG1 of the twelfth embodiment. In an initial state, the control signals WLS and the sense amplifier control signal SAE are at a logic voltage "L," the control signal WLG2 is at a logic voltage "H," and the word line WL0 and the cell plate electrode CP are at a logic voltage "L." Then, the control signal WLS is set at a logic voltage "H." After that, the control signal WLG2 is set at a higher-level logic voltage "H" and then restored to the original logic voltage "H," which is the same in level as the logic voltage "H" of the control signal WLS. Meanwhile, the node N3404 and the word line WL0 are at a voltage "VDD-Vtn," which is lower than the power-source voltage VDD by the threshold voltage Vtn of the n-channel MOS transistor. Subsequently, the node N3403 makes a transition from a logic voltage "L" to a logic voltage "H," lagging behind the transition made by the control signal WLS. Then, the node N3404 makes a transition from the voltage (VDD-Vtn) to a voltage (2×VDD-Vtn). Meanwhile, the word line WL0 is in a floating state, since the transistor Qn3401 has been turned off. Next, the cell plate electrode CP is set at a logic voltage "H," with the result that the logic voltage "H" of the word line WL0 is further increased in level by the capacitive coupling via the capacitor, since the main memory cell capacitor composed by a ferroelectric film is connected between the cell plate electrode CP and the word line WL0 via the memory cell transistor. Subsequently, the cell plate electrode CP is set at a logic voltage "L," so as to restore data to the main memory cell capacitor. In this case, although the logic voltage "H" of the word line WL0 is reduced in level due to the same capacitive coupling, the resulting logic voltage "H" is higher in level than the original logic voltage "H." Since the logic voltage "H" of the word line WL0 thus obtained is sufficiently high in level, a voltage reduction (Vt reduction) due to the threshold voltage of the memory cell transistor does not occur. As a result, a sufficiently high voltage is placed between the electrodes of the main memory cell capacitor, so that restoration of data to the main memory cell capacitor can be performed satisfactorily. After that, the control signal WLS is set at a logic voltage "L," thereby setting the word line WL0 at a logic voltage "L," resulting in the initial state.

It will be appreciated from the relationship between the above seventh and eighth embodiment that the ferroelectric memories of 1T1C configuration according to the above ninth to thirteenth embodiments can easily be modified into the ferroelectric memories of 2T2C configuration.

(Fourteenth Embodiment)

In a fourteenth embodiment, if the bit line electrically connected to the selected main memory cell capacitor is at a logic voltage "L" in restoring data to the main memory cell, the word line is brought into an unselected state at a logic voltage "L." After that, the cell plate electrode is set at a logic voltage "L," thereby increasing the amount of charge for restoring "L" data, so that an increased amount of charge can be read in reading data.

Figure 36:
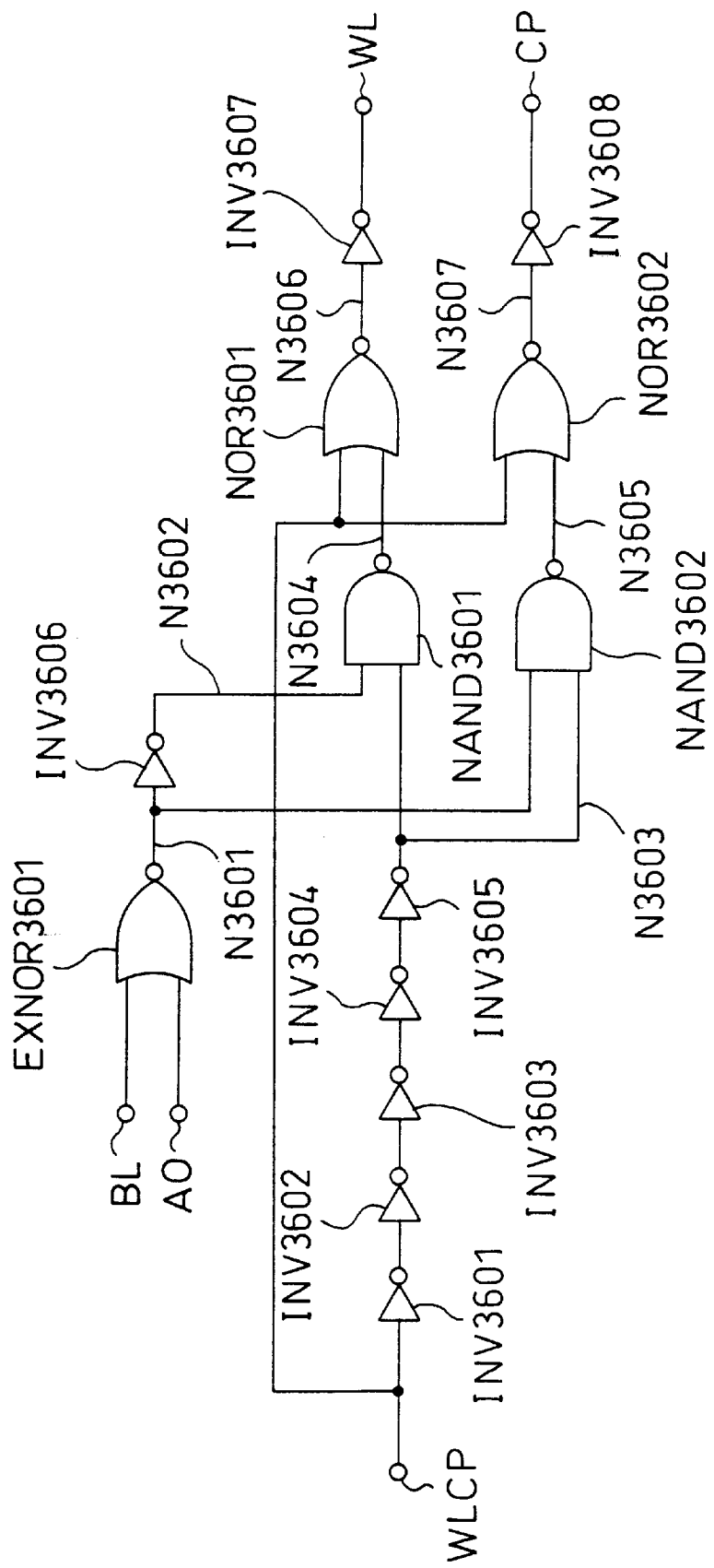
FIG. 36 is a diagram showing the structure of a control circuit for generating a word-line driving signal and a signal for controlling a cell plate electrode in a ferroelectric memory according to a fourteenth embodiment of the present invention.
Figure 37:
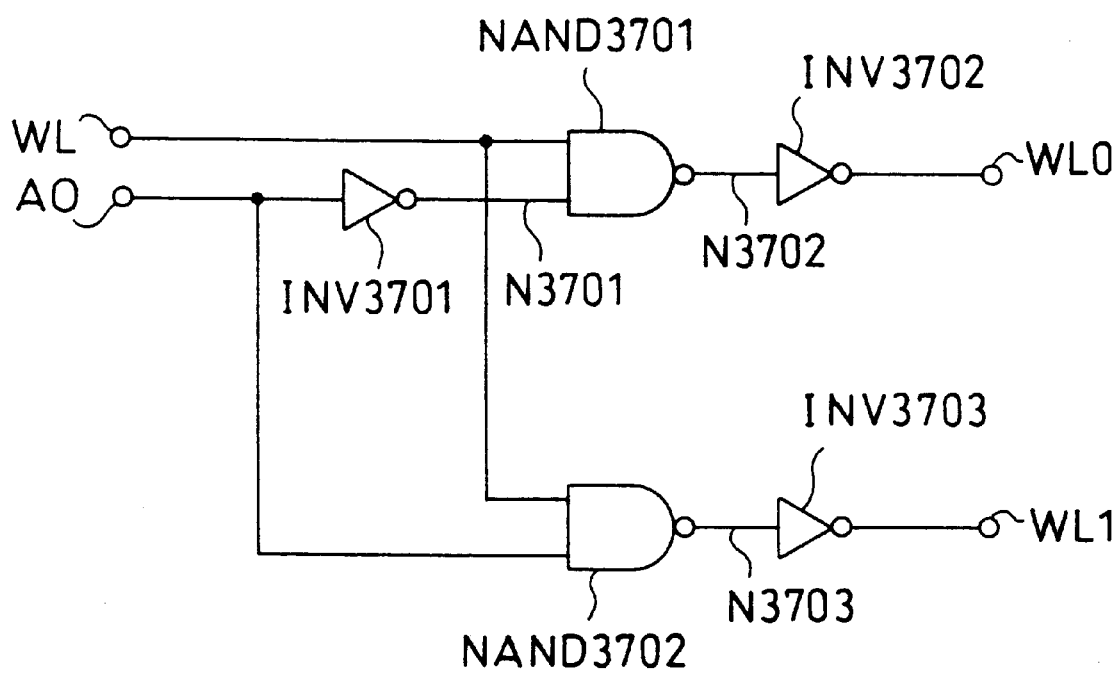
FIG. 37 is a diagram showing the structure of a word-line driving circuit in the ferroelectric memory according to the fourteenth embodiment of the present invention.
Figure 38:
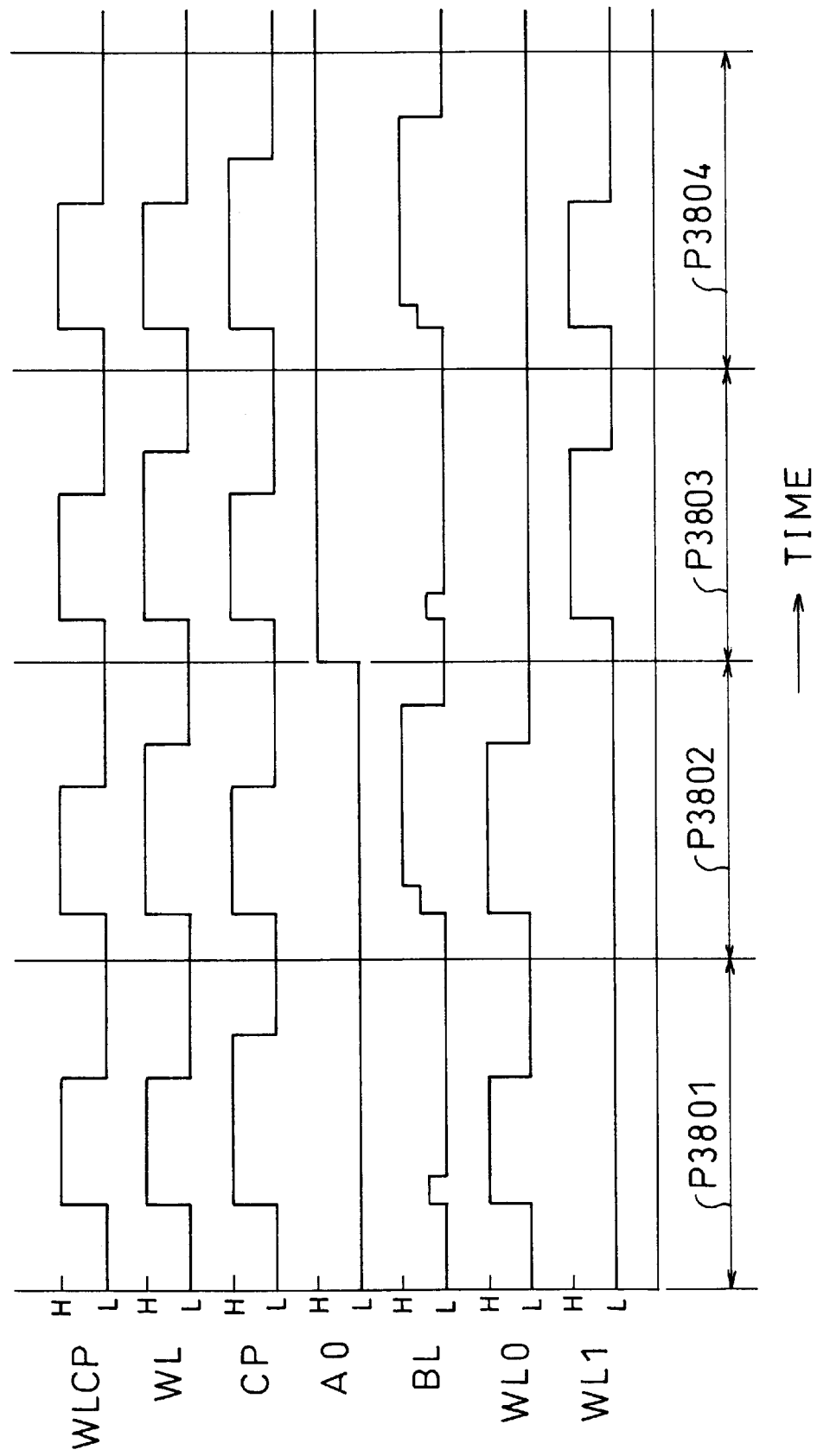
FIG. 38 is a timing chart showing the operation of the ferroelectric memory according to the fourteenth embodiment of the present invention.
Figure 39:
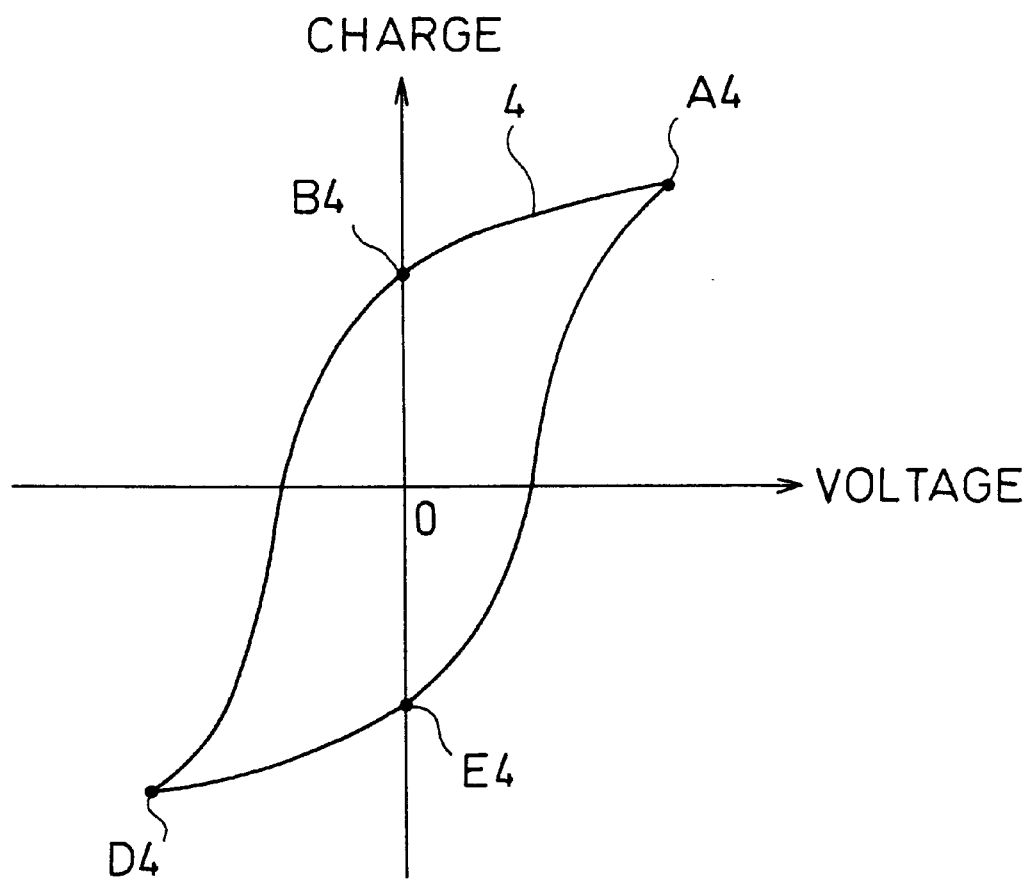
FIG. 39 is a view showing the hysteresis property of a main memory cell capacitor in the ferroelectric memory according to the fourteenth embodiment of the present invention.

The circuit diagram showing the overall structure of the present embodiment is the same as that of FIG. 1 used in the first embodiment. FIG. 36 shows a control circuit for generating a word-line driving signal WL and the cell plate electrode signal CP. FIG. 37 shows a control circuit for generating signals to the word line WL0 and WL1 from the word-line driving signal WL and address signal A0. FIG. 38 is a timing chart showing the operation of these circuits. FIG. 39 shows the hysteresis property of the ferroelectric capacitor of the main memory cell.

The description of the circuit diagram showing the overall structure of the present embodiment will be omitted here, since it is the same as that of FIG. 1 described in the first embodiment. Instead, a description will be given to the control circuit of FIGS. 36 and 37. In the drawings are shown: a control signal WLCP; the word-line driving signal WL; the cell plate electrode and a signal thereto CP; the word lines WL0 and WL1; the address signal A0; the bit line and a signal thereto BL; inverters INV3601 to INV3703; NAND circuits NAND3601 to NAND3702; NOR circuits NOR3601 to NOR3602; an EXNOR circuit EXNOR3601; and node names N3601 to N3703. In the circuit structure, the EXNOR circuit EXNOR3601 receives the bit-line signal BL and the address signal A0 and outputs the node N3601. The inverter INV3606 receives the node N3601 and outputs the node N3602. The five-stage inverters INV3601 to INV3605 receive the control signal WLCP and output the node N3603. The NAND circuit NAND3601 receives the nodes N3602 and N3603 and outputs the node N3604. The NAND circuit NAND3602 receives the nodes N3601 and N3603 and outputs the node N3605. The NOR circuit NOR3601 receives the control signal WLCP and the node N3604 and outputs the node N3606. The NOR circuit NOR3602 receives the control signal WLCP and the node N3605 and outputs the node N3607. The inverter INV3607 receives the node N3606 and outputs the word-line driving signal WL. The inverter INV3608 receives the node N3607 and outputs the cell plate electrode signal CP. The inverter INV3701 receives the address signal A0 and outputs the node N3701. The NAND circuit NAND3701 receives the word-line driving signal WL and the node N3701 and outputs the node N3702. The NAND circuit NAND3702 receives the word-line driving signal WL and the address signal A0 and outputs the node N3703. The inverter INV3702 receives the node N3702 and outputs the word line WL0. The inverter INV3703 receives the node N3703 and outputs the word line WL1. In the circuit, if the address signal A0 is at a logic voltage "L," the word line WL0 is selected. If the address line A0 is at a logic voltage "H," the word line WL1 is selected. If the bit line electrically connected to the selected main memory cell capacitor is at a logic voltage "L" in restoring data, the word line is brought into an unselected state at a logic voltage "L" and then the cell plate electrode is set at a logic voltage "L." FIG. 38 is a timing chart showing the operation of the present embodiment, to which a brief description will be given with reference to the hysteresis property of the ferroelectric capacitor of the main memory cell shown in FIG. 39. In FIG. 38, P3801 to P3804 designate periods. During the period P3801, the address signal A0 is at a logic voltage "L" and the data on the bit line BL is "L." After the word line WL0 was set at a logic voltage "L," the cell plate signal CP is set at a logic voltage "L." Meanwhile, the main memory cell in which data has been restored is in the state at the point D4 in FIG. 39. During the period P3802, the address signal A0 is at a logic voltage "L" and the data on the bit line BL is "H." After the cell plate signal CP was set at a logic voltage "L," the word line WL0 is set at a logic voltage "L." Meanwhile, the main memory cell to which the data has been restored is in the state at the point A4 in FIG. 39. During the period P3803, the address signal A0 is at a logic voltage "H" and the data on the bit line /BL is "H," while the data on the bit line BL is "L." After the cell plate signal CP was set at a logic voltage "L," the word line WL1 is set at a logic voltage "L." Meanwhile, the main memory cell to which the data has been restored is in the state at the point A4 in FIG. 39. During the period P3804, the address signal A0 is at a logic voltage "H" and the data on the bit line /BL is "L," while the data on the bit line BL is "H." After the word line WL1 was set at a logic voltage "L," the cell plate signal CP is set at a logic voltage "L." Meanwhile, the main memory cell to which the data has been restored is in the state at the point D4 in FIG. 39.

Thus, in the fourteenth embodiment, the amount of charge for restoring data is increased with the timing for the operation of the word line and cell plate electrode, so that an increased amount of charge can be read in reading data, thereby enabling stable operation with low voltage.

(Fifteenth Embodiment)

In a fifteenth embodiment, if the bit line electrically connected to the selected dummy memory cell capacitor in the dummy memory cell is at a logic voltage "L" in restoring data, the dummy memory cell is restored to the initial state by bringing the dummy cell plate electrode into an unselected state at a logic voltage "L" and then setting the dummy word line at a logic voltage "L."

Figure 40:
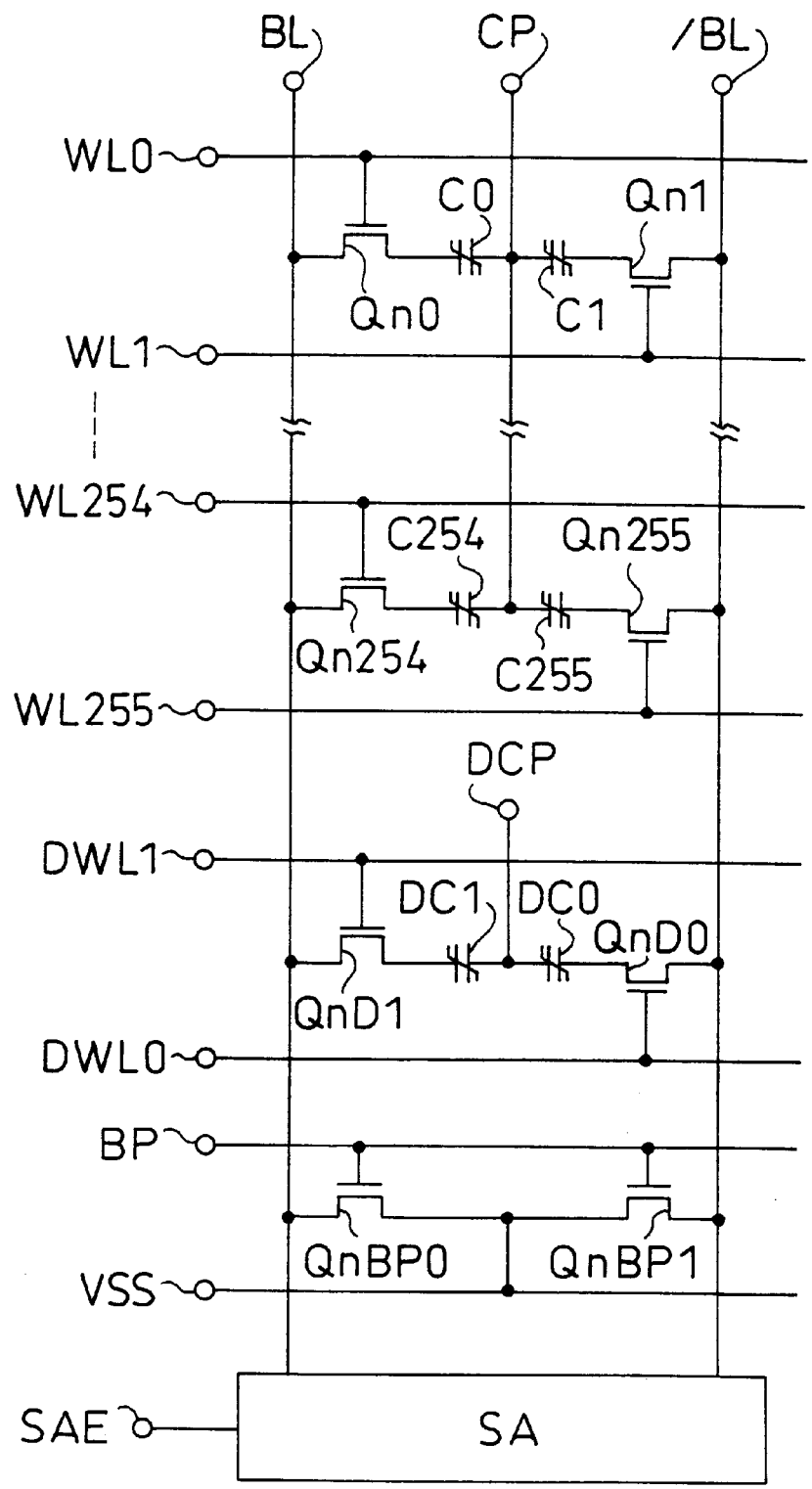
FIG. 40 is a circuit diagram showing the structure of a ferroelectric memory according to a fifteenth embodiment of the present invention.
Figure 41:
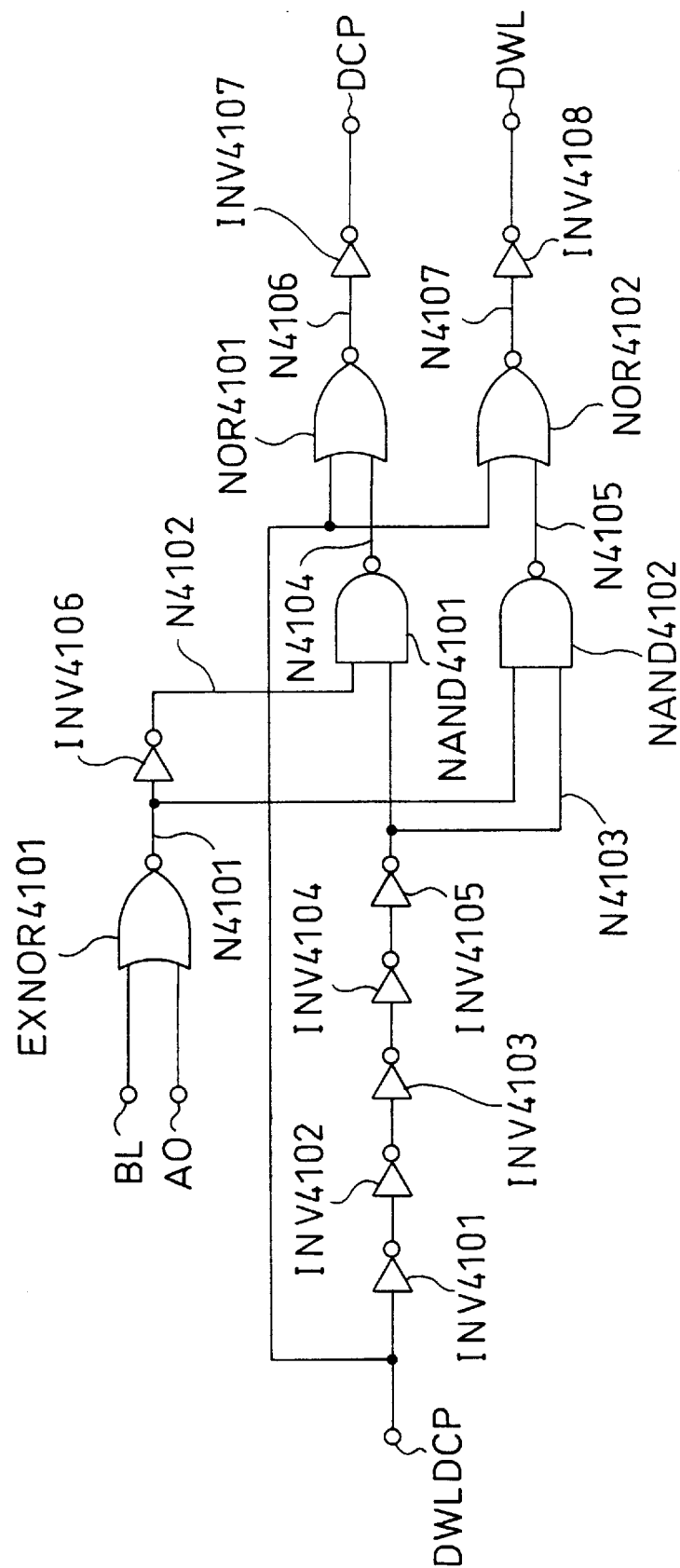
FIG. 41 is a diagram showing the structure of a control circuit for generating a dummy-word-line driving circuit and a signal for controlling a dummy cell plate electrode in the ferroelectric memory according to the fifteenth embodiment of the present invention.
Figure 42:
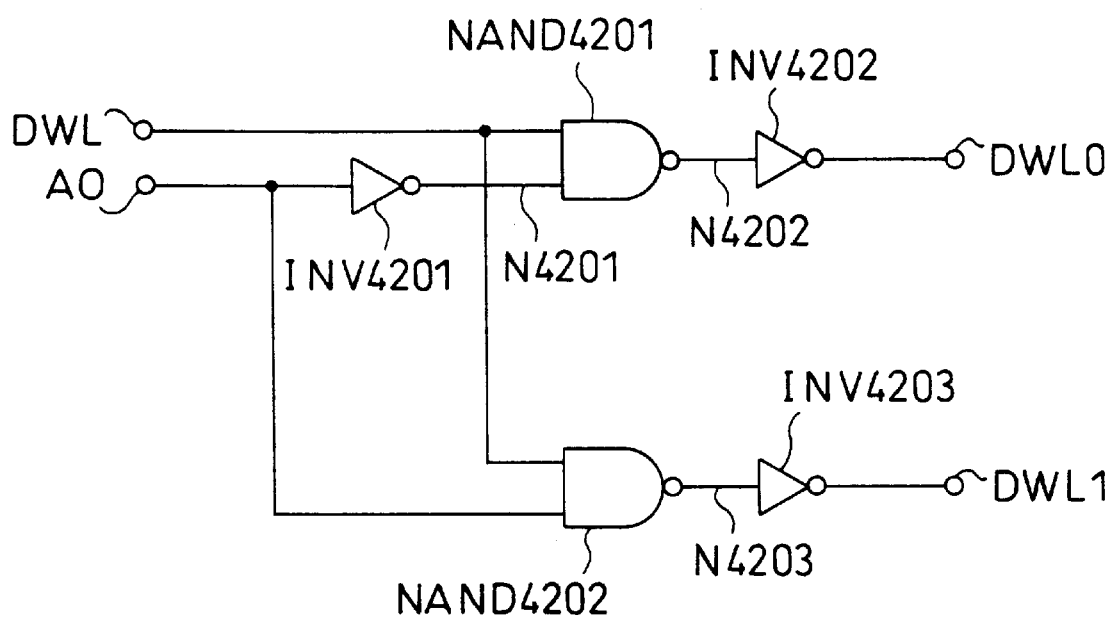
FIG. 42 is a circuit diagram showing the structure of the dummy-word-line driving circuit in the ferroelectric memory according to the fifteenth embodiment of the present invention.
Figure 43:
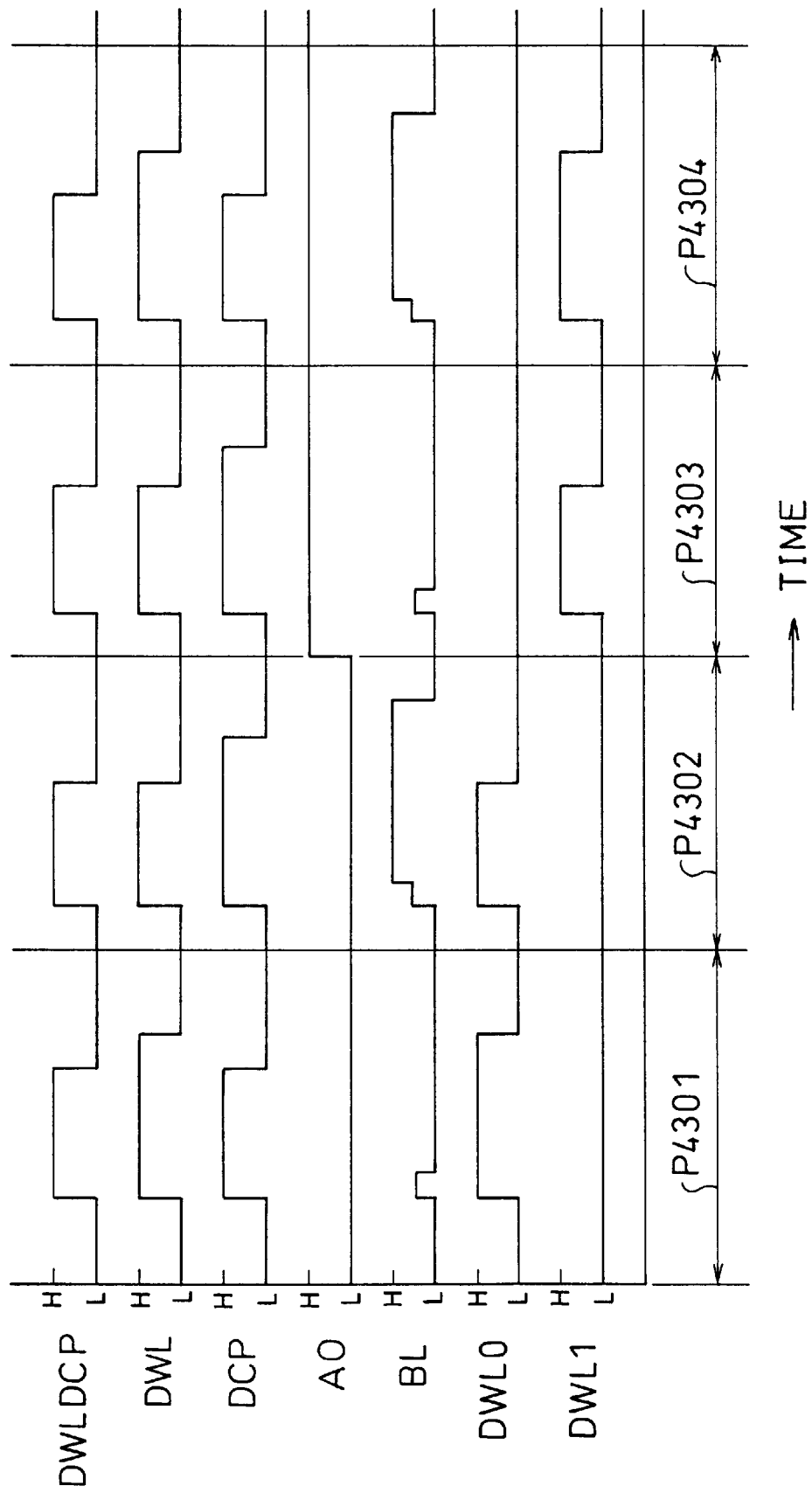
FIG. 43 is a timing chart showing the operation of the ferroelectric memory according to the fifteenth embodiment of the present invention.
Figure 44:
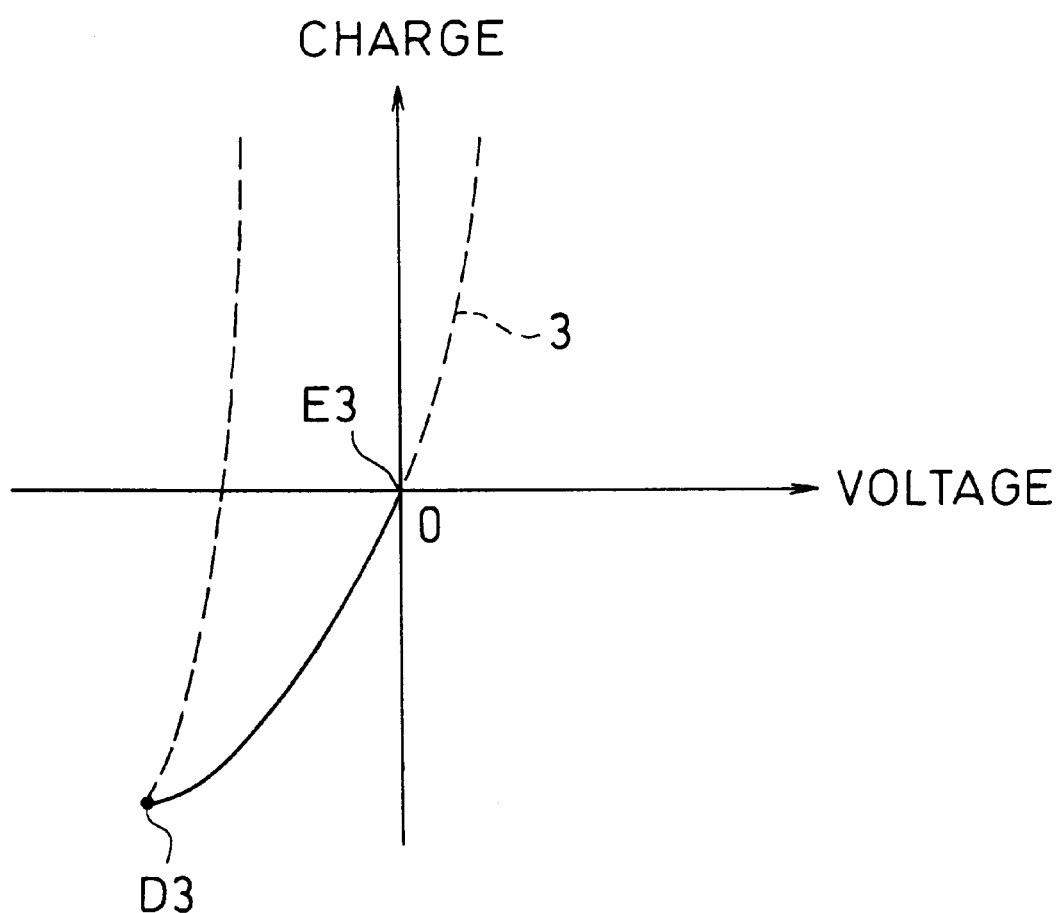
FIG. 44 is a view showing the hysteresis property of a dummy memory cell capacitor in the ferroelectric memory according to the fifteenth embodiment of the present invention.

FIG. 40 is a circuit diagram showing the overall structure of the present embodiment, which was obtained by omitting the initializing circuit from the dummy memory cell in FIG. 1 used in the first embodiment. FIG. 41 shows a control circuit for generating a dummy-word-line driving signal DWL and the dummy cell plate electrode signal DCP. FIG. 42 shows a control circuit for generating signals to the dummy word lines DWL0 and DWL1 from the dummy-word-line driving signal DWL and address signal A0. FIG. 43 is a timing chart showing the operation of these circuits. FIG. 44 shows the hysteresis property of the ferroelectric capacitor of the dummy memory cell.

The description of the circuit diagram of FIG. 40 will be omitted here, since it is substantially the same as that of FIG. 1 described in the first embodiment.

A description will be given to the control circuit of FIGS. 41 and 42. The circuit diagram of FIG. 41 is the same as that of FIG. 36. The circuit diagram of FIG. 42 is the same as that of FIG. 37. In the drawings are shown: a control signal DWLDCP; the dummy-word-line driving signal DWL; the dummy cell plate electrode and a signal thereto DCP; the word lines DWL0 and DWL1; the address signal A0; the bit line and a signal thereto BL; inverters INV4101 to INV4203; NAND circuits NAND4101 to NAND4202; NOR circuits NOR4101 to NOR4102; an EXNOR circuit EXNOR4101; and node names N4101 to N4203. In the circuit structure, the EXNOR circuit EXNOR4101 receives the bit line signal BL and the address signal A0 and outputs the node N4101. The inverter INV4106 receives the node N4101 and outputs the node N4102. The five-stage inverters INV4101 to INV4105 receive the control signal DWLDCP and outputs the node N4103. The NAND circuit 4101 receives the nodes N4102 and N4103 and outputs the node N4104. The NAND circuit 4102 receives the nodes N4101 and N4103 and outputs the node N4105. The NOR circuit 4101 receives the control signal DWLDCP and the node N4104 and outputs the node N4106. The NOR circuit NOR4102 receives the control signal DWLDCP and the node N4105 and outputs the node N4107. The inverter INV4107 receives the node N4106 and outputs the dummy-word-line driving signal DWL. The inverter INV4108 receives the node N4107 and outputs the dummy cell plate electrode signal DCP. The inverter INV4201 receives the address signal A0 and outputs the node N4201. The NAND circuit NAND4201 receives the dummy-word-line driving signal DWL and the node N4201 and outputs the node N4202. The NAND circuit NAND4202 receives the dummy-word-line driving signal DWL and the address signal A0 and outputs the node N4203. The inverter INV4202 receives the node N4202 and outputs the dummy word line DWL0. The inverter INV4203 receives the node N4203 and outputs the dummy word line DWL1. In the circuit, if the address signal A0 is at a logic voltage "L," the dummy word line DWL0 is selected. If the address signal A0 is at a logic voltage "H," the dummy word line DWL1 is selected. If the bit line electrically connected to the selected dummy memory cell capacitor is at a logic voltage "H" in restoring data, the dummy word line is brought into an unselected state at a logic voltage "L" and then the dummy cell plate electrode is set at a logic voltage "L." FIG. 43 is a timing chart showing the operation of the present embodiment, to which a brief description will be given with reference to the hysteresis property of the ferroelectric capacitor of the main memory cell shown in FIG. 44. In FIG. 43, P4301 to P4304 designate periods. During the period P4301, the address signal A0 is at a logic voltage "L" and the data on the bit line BL is "L." After the dummy cell plate signal DCP was set at a logic voltage "L," the dummy word line DWL0 is set at a logic voltage "L." During the period P4302, the address signal A0 is at a logic voltage "L" and the data on the bit line BL is "H." After the dummy word line DWL0 was set at a logic voltage "L," the dummy cell plate signal DEP is set at a logic voltage "L." During the period P4303, the address signal A0 is at a logic voltage "H" and the data on the bit line /BL is "H," while the data on the bit line BL is "L." After the dummy word line DWL1 was set at a logic voltage "L," the dummy cell plate signal DCP is set at a logic voltage "L." During the period P4304, the address signal A0 is at a logic voltage "H" and the data on the bit line /BL is "L," while the data on the bit line BL is "H." After the dummy cell plate signal DCP was set at a logic voltage "L," the dummy word line DWL1 is set at a logic voltage "L." During each of the periods P4301 to P4304, the dummy memory cell is in the state at the point 0 in FIG. 44.

Thus, in the fifteenth embodiment, the dummy memory cell can be restored to the initial state with the timing for the operation of the dummy word line and dummy cell plate electrode, resulting in a simpler circuit structure.

(Sixteenth Embodiment)

A description will be given to a ferroelectric memory according to a sixteenth embodiment of the present invention.

Figure 45:
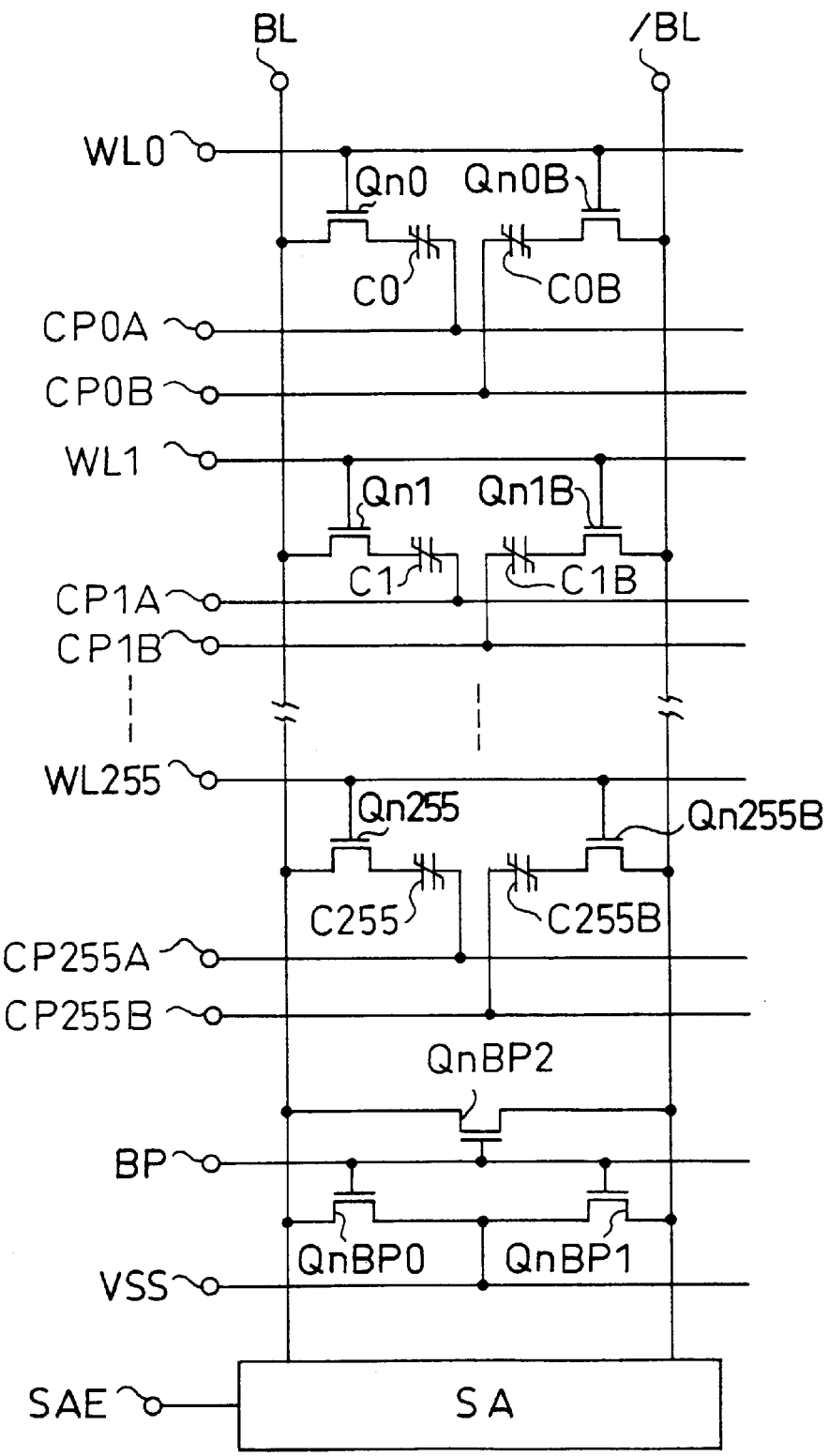
FIG. 45 is a circuit diagram showing the structure of a ferroelectric memory according to a sixteenth embodiment of the present invention.
Figure 46:
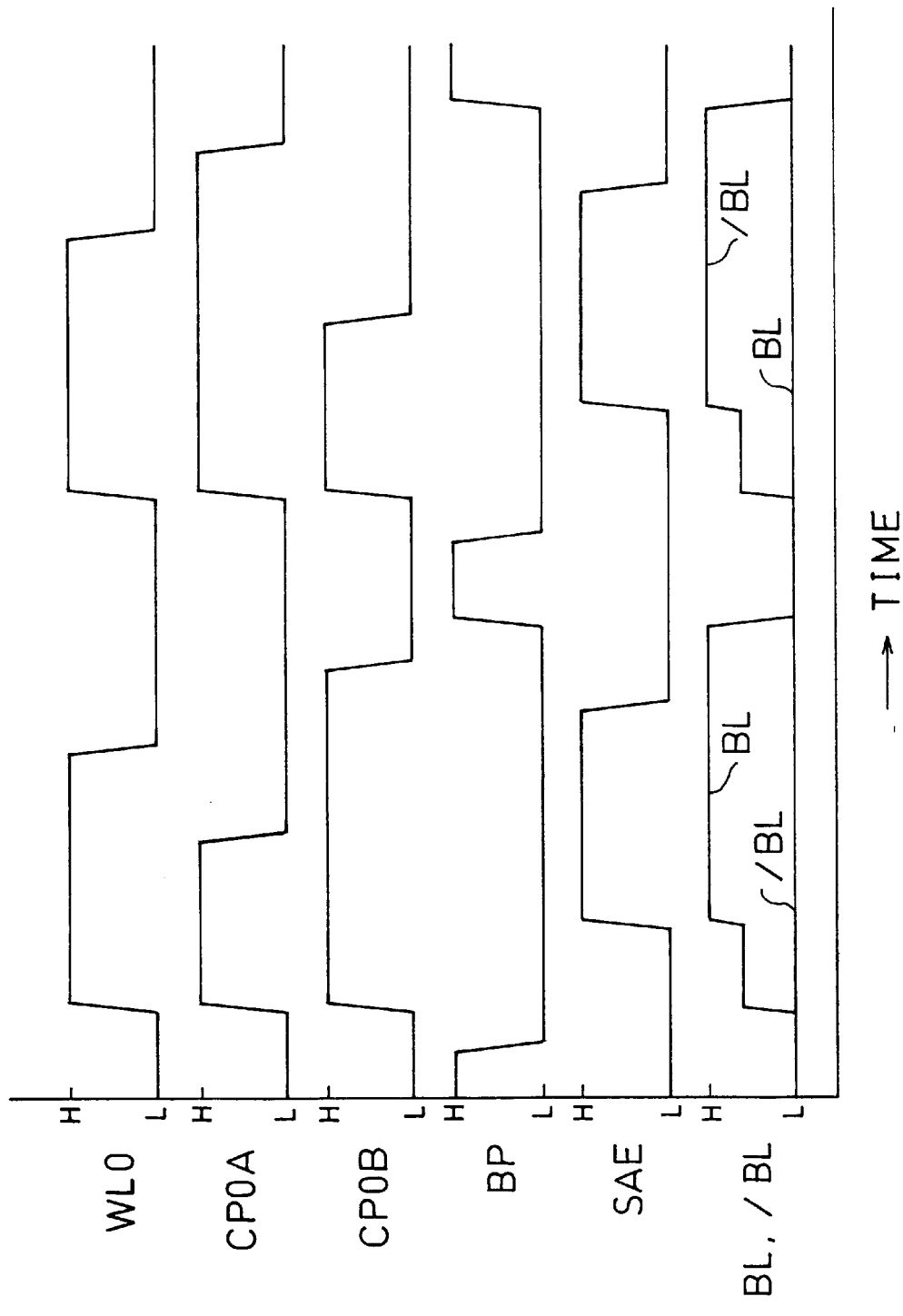
FIG. 46 is a timing chart showing the operation of the ferroelectric memory according to the sixteenth embodiment of the present invention.
Figure 47:
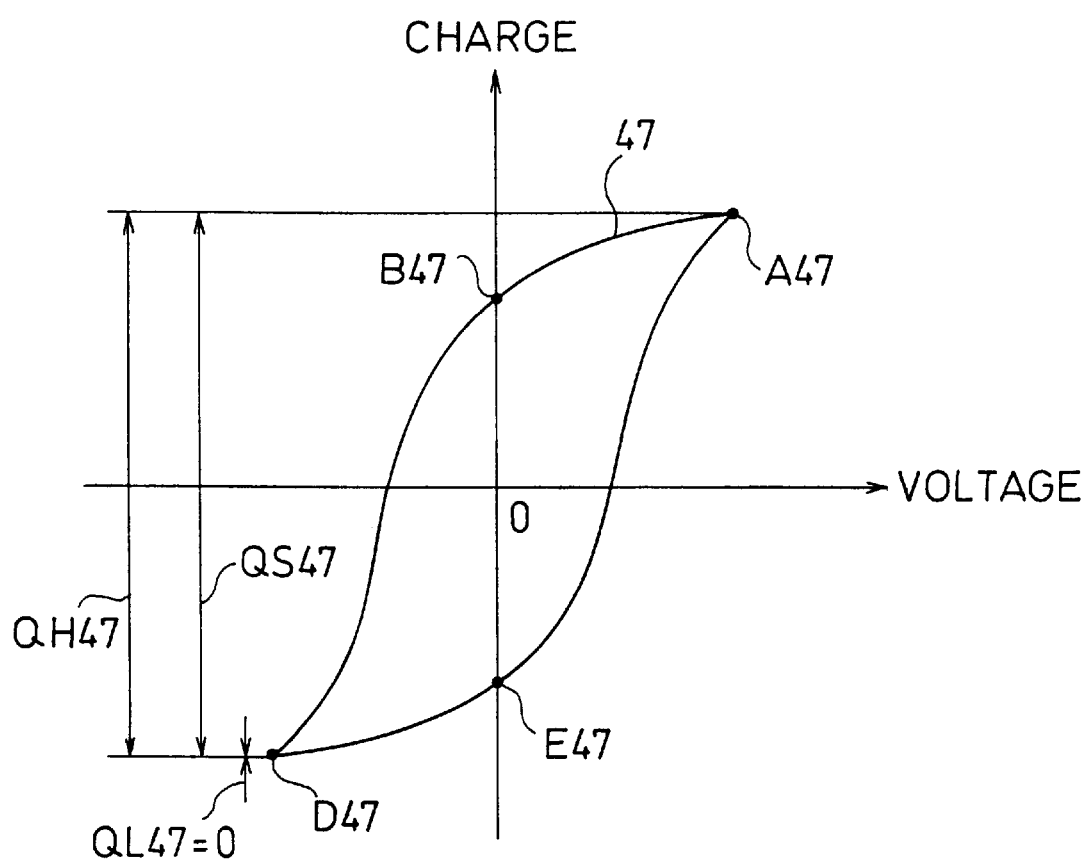
FIG. 47 is a view showing the hysteresis properties of a complementary pair of memory cell capacitors of the ferroelectric memory according to the sixteenth embodiment of the present invention.

In the sixteenth embodiment, an increased amount of charge is read in reading data from a memory cell, similarly to the fourteenth and fifteenth embodiments. In the sixteenth embodiment, a memory cell per bit consists of two ferroelectric capacitors and two transistors. The two ferroelectric capacitors store a complementary pair of data, respectively. In restoring data to the memory cell, selected two memory cell capacitors are electrically connected to the respective bit lines. In one memory cell capacitor connected to the bit line at the logic voltage "L," the word line is brought into an unselected state at a logic voltage "L" and then the cell plate electrode is set at a logic voltage "L," thereby increasing the amount of charge for restoring "L" data. In the other memory cell capacitor connected to the bit line at a logic voltage "H," the cell plate electrode is set at a logic voltage "L" and then the word line is brought into an unselected state at a logic voltage "L," thereby increasing the amount of charge for restoring "H" data. Accordingly, a large amount of charge can be read in reading data from the memory cell. FIG. 45 is a circuit diagram showing the overall structure of the present embodiment. FIG. 46 is a timing chart showing the operation of the present embodiment. The curve 47 in FIG. 47 represents the hysteresis property for reading/ writing data from and in the memory cell of the present embodiment. In the circuit structure, the two ferroelectric capacitors storing the complementary pair of data are provided with the respective cell plate electrodes, in contrast to the eighth embodiment shown in FIG. 22.

In the drawings are shown: the word lines WL0 to WL255; the bit lines BL and /BL; cell plate electrodes CP0A to CP255A and CP0B to CP255B; the bit-line precharge control signal BP; the sense amplifier control signal SAE; the ground voltage VSS; the sense amplifier SA; the memory cell capacitors C0 to C255 and C0B to C255B; the n-channel MOS transistors Qn0 to Qn255, Qn0B to Qn255B, and QnBP0 to QnBP2; the amount of charge QL47 for reading "L" data in the present embodiment; the amount of charge QH47 for reading "H" data in the present embodiment; and the difference QS47 between the amount of charge QL47 for reading "L" data and the amount of charge QH47 for reading "H" data in the present embodiment. Here, QL47 is substantially equal to zero and QH47 varies in the range between the point A47 and the point D47, so that QS47 represents the amount of charge substantially equal to QH47.

A description will be given first to the circuit diagram of FIG. 45. The bit lines BL and /BL are connected to the sense amplifier SA, which is controlled by the sense amplifier control signal SAE. The first electrode of the memory cell capacitor C0 is connected to the bit line BL via the memory cell transistor Qn0 having the gate electrode connected to the word line WL0, while the second electrode thereof is connected to the cell plate electrode CP0A. The first electrode of the memory cell capacitor C0B forming a pair with the memory cell capacitor C0 is connected the bit line /BL via the memory cell transistor Qn0B having the gate electrode connected to the word line WL0, while the second electrode thereof is connected to the other cell plate electrode CP0B. The other memory capacitors C1 to C255 and C1B to C255B are interconnected in the same manner as the memory cell capacitors C0 and C0B. The bit line BL is connected to the bit line /BL via the n-channel MOS transistor QnBP2. The bit line BL is connected to the ground voltage VSS via the n-channel MOS transistor QnBP0, while the bit line /BL is connected to the ground voltage VSS via the n-channel MOS transistor QnBP1. The gate electrodes of the n-channel MOS transistors QnBP0 to QnBP2 are connected to the bit-line precharge control signal BP.

A description will be given to the operation of the circuit in the ferroelectric memory with reference to the timing chart of FIG. 46 and to the hysteresis property of the ferroelectric capacitor of the memory cell of FIG. 47. In FIG. 47 showing the hysteresis property of the ferroelectric capacitor, the abscissa represents the electric field applied to the memory-cell capacitor and the ordinate represents the charge resulting from the electric field. In FIG. 47, the curve 47 represents the hysteresis property of the ferroelectric capacitor of the memory cell. In the ferroelectric capacitor, a polarization remains even at zero electric field as indicated by the point B47 or E47. Here, an electric field is applied to the ferroelectric capacitors in restoring data. The memory cell consists of the two ferroelectric capacitors for storing the complementary pair of data, which are in the states indicated by the points A47 and D47.

To read data from the memory cell, the bit-line precharge control signal BP is initially set at a logic voltage "H," thereby setting the bit lines BL and /BL at a logic voltage "L." On the other hand, the word lines WL0 to WL255 and the cell plate electrodes CP0A and CP0B are set at the ground voltage VSS, which is a logic voltage "L." Next, the bit-line precharge control signal BP is set at a logic voltage "L," thereby bringing the bit lines BL and /BL into a floating state. Thereafter, the word line WL0 and the cell plate electrodes CP0A and CP0B are set at a logic voltage "H," so as to read data in the memory cell capacitors C0 and C0B onto the bit lines BL and /BL. If the data is "H," the state of the memory cell capacitor C0 makes a transition from the point A47 to the point D47 in FIG. 47, so that the charge QH47 is read onto the bit line BL. If the data is "L," the memory cell capacitor C0 remains in the state at the point D47 in FIG. 47, so that the charge QL47 (=0) is read onto the bit line BL. Conversely, the state of the memory cell capacitor C0B makes a transition from the point A47 to the point D47 in FIG. 47 when the data is "L," while it remains in the state at the point D47 in FIG. 47 when the data is "H." Subsequently, the sense amplifier control signal SAE is set at a logic voltage "H" so as to operate the sense amplifier SA. In this case, if the data is "H," the state of the memory cell capacitor C0 makes a transition from the point D47 to the point E47 in FIG. 47, while the memory cell capacitor C0B remains in the state at the point D47 in FIG. 47. Next, the cell plate electrode CP0A, word line WL0, and cell plate electrode CP0B are sequentially set at a logic voltage "L" in this order, thereby restoring data to the memory cell capacitors C0 and C0B. In this case, if the data is "H," the state of the memory cell capacitor C0 makes a transition from the point E47 to the point A47 in FIG. 47, while the memory cell capacitor C0B remains in the state at the point D47 in FIG. 47. After that, the sense amplifier control signal SAE is set at a logic voltage "L," thereby halting the operation of the sense amplifier SA. Then, the bit line precharge control signal BP is set at a logic voltage "H," thereby bringing the bit lines BL and /BL into an initial state. If the data is "L," on the other hand, it is read with the same timing, though the cell plate electrode CP0B, word line WL0, and cell plate electrode CP0A are sequentially set at a logic voltage "L" in this order in restoring data.

Thus, the sixteenth embodiment is characterized in that the cell plate electrode of the memory cell capacitor having "H" data, the word line, and then the cell plate electrode of the memory cell capacitor having "L" data are sequentially set at a logic voltage "L" in this order, thereby placing an electric field between the electrodes of the memory cell capacitors during restoring data. Accordingly, the difference between the amount of charge for reading "H" data and that for reading "L" data is increased, which enables stable operation with low voltage.

(Seventeenth Embodiment)

Figure 48:
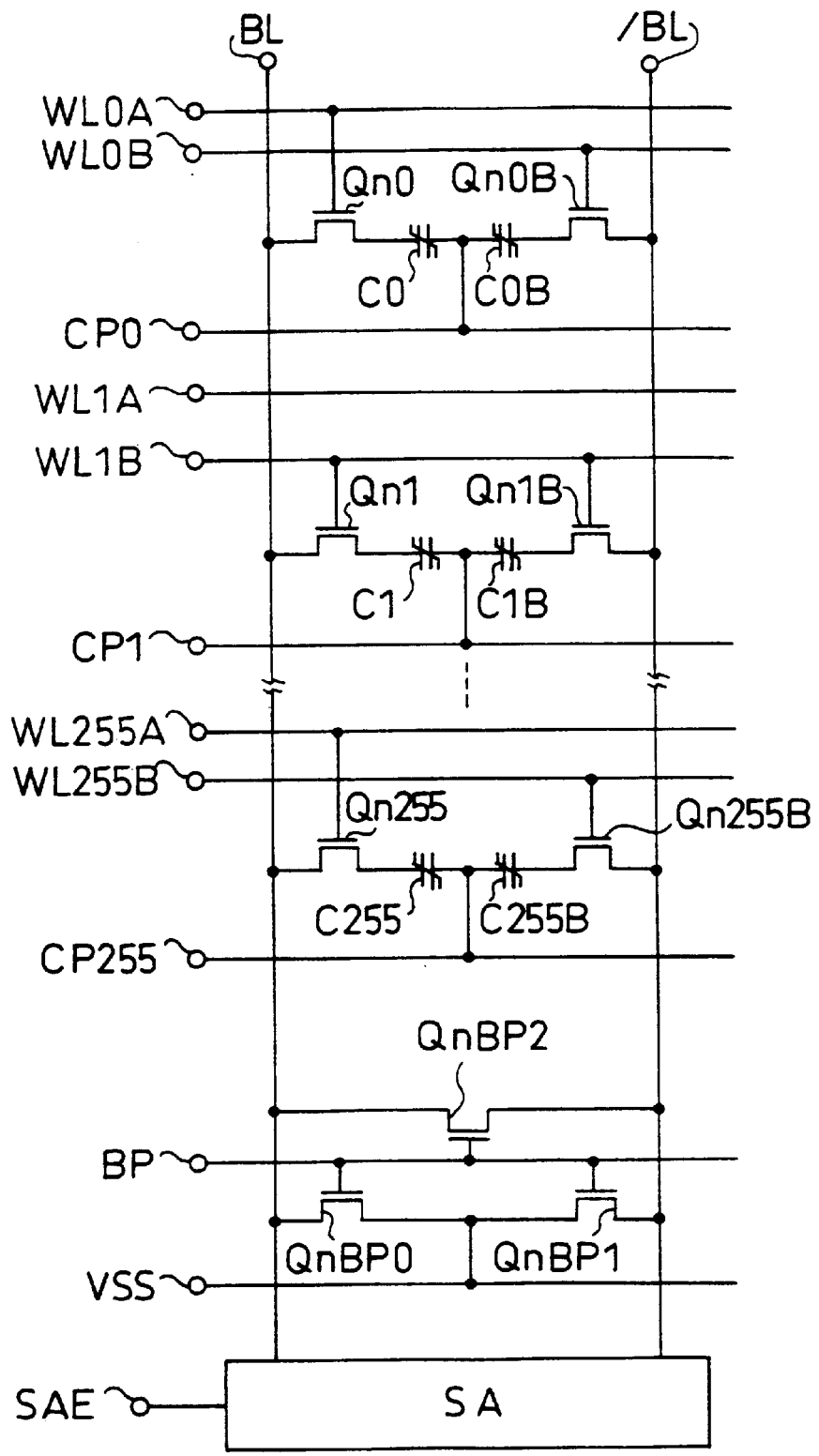
FIG. 48 is a circuit diagram showing the structure of a ferroelectric memory according to a seventeenth embodiment of the present invention.
Figure 49:
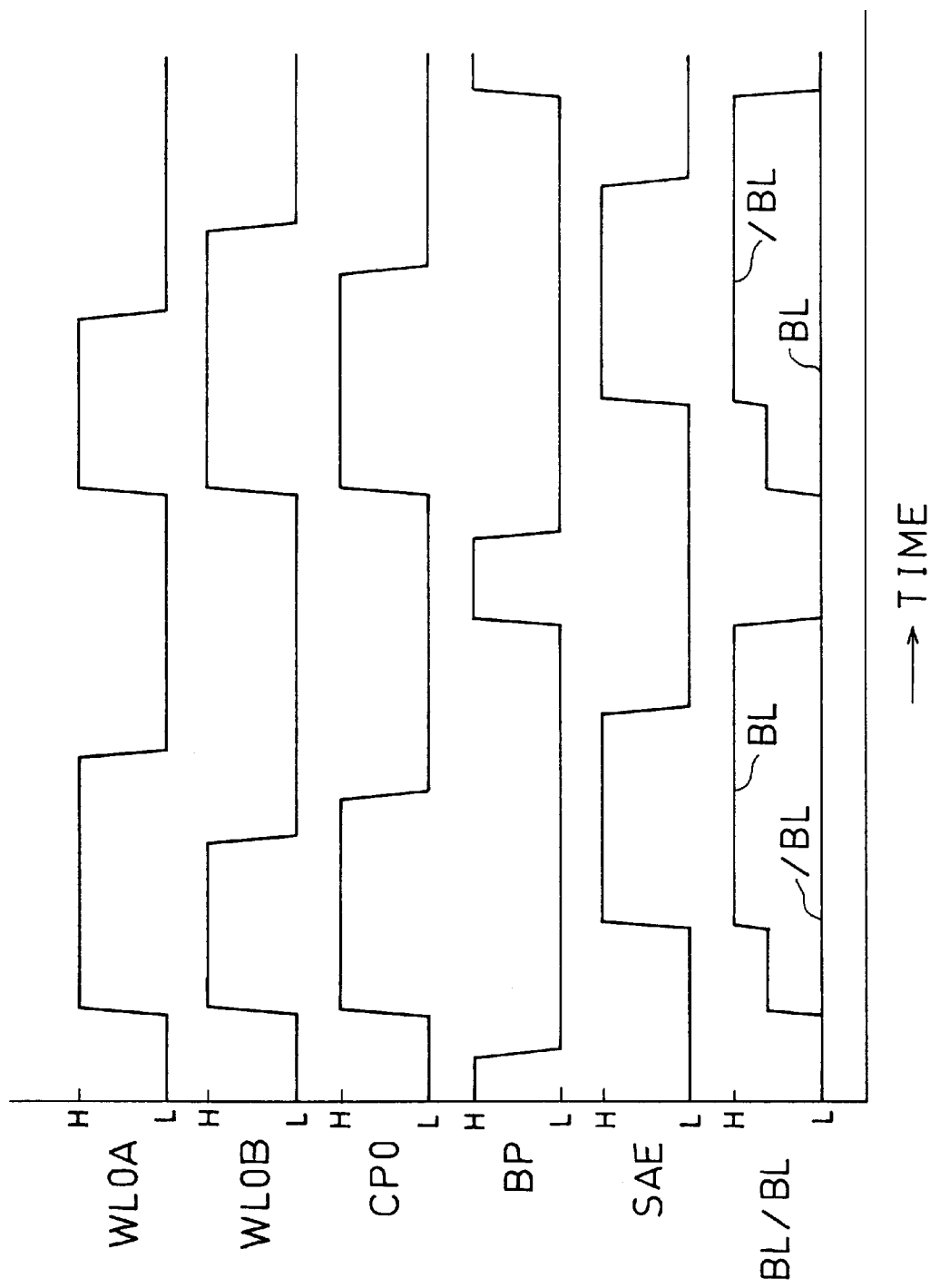
FIG. 49 is a timing chart showing the operation of the ferroelectric memory according to the seventeenth embodiment of the present invention.

In the seventeenth embodiment, an increased amount of charge is also read in reading data from a memory cell, similarly to the sixteenth embodiment. In the seventeenth embodiment, a memory cell per bit consists of two ferroelectric capacitors and two transistors. The two ferroelectric capacitors store a complementary pair of data, respectively. In restoring data to the memory cell, selected two memory cell capacitors are electrically connected to the respective bit lines. In one memory cell capacitor connected to the bit line at the logic voltage "L," the word line is brought into an unselected state at a logic voltage "L" and then the cell plate electrode is set at a logic voltage "L," thereby increasing the amount of charge for restoring "L" data. In the other memory cell capacitor connected to the bit line at a logic voltage "H," the cell plate electrode is set at a logic voltage "L" and then the word line is brought into an unselected state at a logic voltage "L," thereby increasing the amount of charge for restoring "H" data. Accordingly, a large amount of charge can be read in reading data from the memory cell. FIG. 48 is a circuit diagram showing the overall structure of the present embodiment. FIG. 49 is a timing chart showing the operation of the present embodiment. In the circuit structure, the two ferroelectric capacitors storing the complementary pair of data are provided with the respective word lines serving as the gate electrode of their selecting transistors (memory cell transistors), in contrast to the eighth embodiment shown in FIG. 22.

In the drawings are shown: the word lines WL0A to WL255A and WL0B to WL255B; the bit lines BL and /BL; cell plate electrodes CP0 to CP255; the bit-line precharge control signal BP; the sense amplifier control signal SAE; the ground voltage VSS; the sense amplifier SA; the memory cell capacitors C0 to C255 and C0B to C255B and; and the n-channel MOS transistors Qn0 to Qn255, Qn0B to Qn255B, and QnBP0 to QnBP2.

A description will be given first to the circuit diagram of FIG. 48. The bit lines BL and /BL are connected to the sense amplifier SA, which is controlled by the sense amplifier control signal SAE. The first electrode of the memory cell capacitor C0 is connected to the bit line BL via the memory cell transistor Qn0 having the gate electrode connected to the word line WL0A, while the second electrode thereof is connected to the cell plate electrode CP0. The first electrode of the memory cell capacitor C0B forming a pair with the memory cell capacitor C0 is connected to the bit line /BL via the memory cell transistor Qn0B having the gate electrode connected to the other word line WL0B, while the second electrode thereof is connected to the cell plate electrode CP0. The other memory capacitors C1 to C255 and C1B to C255B are interconnected in the same manner as the memory cell capacitors C0 and C0B. The bit line BL is connected to the bit line /BL via the n-channel MOS transistor QnBP2. The bit line BL is connected to the ground voltage VSS via the n-channel MOS transistor QnBP0, while the bit line /BL is connected to the ground voltage VSS via the n-channel MOS transistor QnBP1. The gate electrodes of the n-channel MOS transistors QnBP0 to QnBP2 are connected to the bit-line precharge control signal BP.

A description will be given to the operation of the circuit in the ferroelectric memory with reference to the timing chart of FIG. 49. In restoring data, an electric field is also applied to the two ferroelectric capacitors for storing the complementary pair of data, similarly to the sixteenth embodiment. To apply the electric field to the ferroelectric capacitors in restoring data, the seventeenth embodiment uses separate word lines serving as the respective gate electrodes of the two ferroelectric capacitors for storing the complementary pair of data, while using the cell plate electrode in common.

To read data from the memory cell, the bit-line precharge control signal BP is initially set at a logic voltage "H," thereby setting the bit lines BL and /BL at a logic voltage "L." On the other hand, the word lines WL0A to WL255A and WL0B to WL255B and the cell plate electrode CP0 are set at the ground voltage VSS, which is a logic voltage "L." Next, the bit-line precharge control signal BP is set at a logic voltage "L," thereby bringing the bit lines BL and /BL into a floating state. Thereafter, the word lines WL0A and WL0B and the cell plate electrodes CP0 is set at a logic voltage "H," so as to read data in the memory cell capacitors C0 and C0B onto the bit lines BL and /BL. Subsequently, the sense amplifier control signal SAE is set at a logic voltage "H" so as to operate the sense amplifier SA. Next, the word line WL0B, cell plate electrode CP0, and word line WL0A are sequentially set at a logic voltage "L" in this order, thereby restoring data to the memory cell capacitors C0 and C0B. After that, the sense amplifier control signal SAE is set at a logic voltage "L," thereby halting the operation of the sense amplifier SA. Then, the bit line precharge control signal BP is set at a logic voltage "H," thereby bringing the bit lines BL and /BL into an initial state. If the data is in the opposite logic voltage state, on the other hand, it is read with the same timing, though the word line WL0A, cell plate electrode CP0, and word line WL0B are sequentially set at a logic voltage "L" in this order in restoring data.

Thus, the seventeenth embodiment is characterized in that the cell plate electrode of the memory cell capacitor having "L" data, the cell plate electrode, and then the word line serving as the gate electrode of the memory cell capacitor having "H" data are sequentially set at a logic voltage "L" in this order, thereby placing an electric field between the electrodes of the memory cell capacitors. Accordingly, the difference between the amount of charge for reading "H" data and that for reading "L" data is increased, which enables stable operation with low voltage.

We claim:

1. A method for operating a ferroelectric memory comprising: a pair of bit lines of first and second bit lines; a first ferroelectric capacitor forming a main memory cell; and a second ferroelectric capacitor forming a dummy memory cell, said method comprising:

a first step of reading data from the main memory cell onto the first bit line by applying a first voltage between two electrodes of the first ferroelectric capacitor;

a second step of reading data from the dummy memory cell onto the second bit line by applying a second voltage between two electrodes of the second ferroelectric capacitor;

a third step of writing data into the main memory cell by applying a third voltage between the two electrodes of the first ferroelectric capacitor; and a fourth step of writing data into the dummy memory cell by applying a fourth voltage between the two electrodes of the second ferroelectric capacitor;

wherein two voltages of one of combinations of the first and second voltages, the third and fourth voltages and the first and third voltages, are differentiated from each other for operating the ferroelectric memory.

2. The method for operating a ferroelectric memory according to claim 1, wherein the second voltage applied to the second ferroelectric capacitor is lower than the first voltage applied to the first ferroelectric capacitor for reading data.

3. The method for operating a ferroelectric memory according to claim 2, wherein the first voltage is identical with a power-source voltage, and the second voltage is lower than the power-source voltage by a threshold voltage of a transistor.

4. The method for operating a ferroelectric memory according to claim 1, wherein the fourth voltage applied to the second ferroelectric capacitor is lower than the third voltage applied to the first ferroelectric capacitor for writing data.

5. The method for operating a ferroelectric memory according to claim 4, wherein the third voltage is identical with a power-source voltage, and the fourth voltage is lower than the power-source voltage by a threshold voltage of a transistor.

6. The method for operating a ferroelectric memory according to claim 1, wherein the second voltage applied to the second ferroelectric capacitor is higher than the first voltage applied to the first ferroelectric capacitor for reading data.

7. The method for operating a ferroelectric memory according to claim 6, wherein the first voltage is identical with a power-source voltage, and the second voltage is twice as high as the power-source voltage.

8. The method for operating a ferroelectric memory according to claim 1, wherein the first voltage applied to the first ferroelectric capacitor in order to read data from the first ferroelectric capacitor is higher than the third voltage applied to the first ferroelectric capacitor in order to write data into the first ferroelectric capacitor, for reading data from and writing data into the main memory cell.

9. The method for operating a ferroelectric memory according to claim 8, wherein the third voltage is identical with a power-source voltage, and the first voltage is twice as high as the power-source voltage.

10. The method for operating a ferroelectric memory according to claim 1, wherein the third voltage applied to the first ferroelectric capacitor in order to write data into the first ferroelectric capacitor is higher than the first voltage applied to the first ferroelectric capacitor in order to read data from the first ferroelectric capacitor, for reading data from and writing data into the main memory cell.

11. The method for operating a ferroelectric memory according to claim 10, wherein the first voltage is identical with a power-source voltage, and the third voltage is higher than the power-source voltage.

12. The method for operating a ferroelectric memory according to claim 1, wherein each of the first voltage applied to the first ferroelectric capacitor in order to read data from the first ferroelectric capacitor and the third voltage applied to the first ferroelectric capacitor in order to write data into the first ferroelectric capacitor is higher than a power-source voltage, for reading data from and writing data into the main memory cell.

13. The method for operating a ferroelectric memory according to claim 1, further comprising:

a step of reading data from the main memory cell onto the first bit line by applying the first voltage to the first ferroelectric capacitor, the read data being indicated by a voltage lower than a power-source voltage;

a step of increasing the voltage of the first bit line to the third voltage which is higher than the power-source voltage; and a step of writing data into the main memory cell by applying the third voltage between the two electrodes of the first ferroelectric capacitor.

14. A method for operating a ferroelectric memory comprising a bit line, a ferroelectric capacitor and a sense amplifier, said method comprising:

a step of reading data from the ferroelectric capacitor onto the bit line by applying a first voltage to the ferroelectric capacitor, the read data being a logic voltage "H";

a step of generating a second voltage by increasing the logic voltage "H" on the bit line; and a step of writing data into the ferroelectric capacitor by applying the second voltage to the ferroelectric capacitor, the written data being another logic voltage "H";

wherein the second voltage is higher than the first voltage.

15. The method for operating a ferroelectric memory according to claim 14, wherein the second voltage is higher than a power-source voltage.

* * * * *